(12) United States Patent
Hashimoto

(10) Patent No.: US 9,297,642 B2
(45) Date of Patent: Mar. 29, 2016

(54) ALIGNMENT DEVICE FOR EXPOSURE DEVICE, AND ALIGNMENT MARK

(75) Inventor: Kazushige Hashimoto, Yokohama (JP)

(73) Assignee: V TECHNOLOGY CO., LTD., Yokohama-shi, Kanagawa (JP)

( * ) Notice: Subject to any disclaimer, the term of this patent is extended or adjusted under 35 U.S.C. 154(b) by 0 days.

(21) Appl. No.: 14/237,987

(22) PCT Filed: Aug. 7, 2012

(86) PCT No.: PCT/JP2012/070048
§ 371 (c)(1),
(2), (4) Date: Feb. 10, 2014

(87) PCT Pub. No.: WO2013/021985
PCT Pub. Date: Feb. 14, 2013

(65) Prior Publication Data
US 2014/0168648 A1 Jun. 19, 2014

(30) Foreign Application Priority Data

Aug. 10, 2011 (JP) .................. 2011-175410
Sep. 9, 2011 (JP) .................. 2011-197402
Nov. 2, 2011 (JP) .................. 2011-241634
Nov. 2, 2011 (JP) .................. 2011-241674

(51) Int. Cl.
G01B 11/00 (2006.01)
G01B 11/02 (2006.01)
G03F 9/00 (2006.01)

(52) U.S. Cl.
CPC ............... *G01B 11/028* (2013.01); *G03F 9/00* (2013.01); *G03F 9/7069* (2013.01); *G03F 9/7088* (2013.01)

(58) Field of Classification Search
CPC .......... G03F 7/20; G03F 9/00; G03F 9/7088; G03F 9/7069; G03F 1/00; H01L 21/027; H01L 21/68; G01B 11/02; G01B 11/028; G02B 3/00

USPC .................................... 356/399–401
See application file for complete search history.

(56) References Cited

U.S. PATENT DOCUMENTS 5,850,276 A * 12/1998 Ochi et al. .................. 349/158
6,016,185 A * 1/2000 Cullman et al. ............ 355/52

(Continued)

FOREIGN PATENT DOCUMENTS

| JP | 9-244254 (A) | 9/1997 |
| JP | 2004-103644 (A) | 4/2004 |
| JP | 2007-102094 (A) | 4/2007 |

OTHER PUBLICATIONS

International Search Report (ISR) (PCT Form PCT/ISA/210) dated Nov. 13, 2012, in PCT/JP2012/070046.

*Primary Examiner* — Roy M Punnoose
*Assistant Examiner* — Isiaka Akanbi
(74) *Attorney, Agent, or Firm* — McGinn IP Law Group PLLC

(57) ABSTRACT

This alignment device is furnished with an alignment light source for emitting alignment light, and is housed with a camera for example. The alignment light source emits alignment light, doing so, for example, coaxially with respect to the optical axis of light detected by the camera. The alignment light illuminates a substrate and mask, and reflected light is detected by the camera. A microlens array for exposure use is present between a mask alignment mark and a substrate alignment mark, whereby an erect unmagnified image reflected from the substrate alignment mark is formed on the mask. A control device then uses the mask alignment mark and the substrate alignment mark detected by the camera to perform alignment of the substrate and the mask. Alignment of the substrate and the mask can be performed with high accuracy thereby.

16 Claims, 32 Drawing Sheets

(56) References Cited

U.S. PATENT DOCUMENTS

| | | | |
|---|---|---|---|
| 2011/0194095 A1* | 8/2011 | Mizumura | 355/74 |
| 2011/0244379 A1* | 10/2011 | Kajiyama et al. | 430/5 |
| 2012/0218537 A1* | 8/2012 | Mizumura | 355/53 |
| 2012/0236283 A1* | 9/2012 | Mizumura et al. | 355/67 |

* cited by examiner (a)

(b)

(c)

(d)

(a)

(b)

(a)

(b)

(a)

(b)

(a)

(b)

(a)   (b)

(a) (b)

(a) (b)

(a) (b)

(a)

(b)

(c)

(d)

(a)

(b)

(a)

(b)

(a)

(b)

(a)

(b)

(c)

(a)

(b)

(a)

(b)

(a)

(b)

(a)

(b)

(a)

(b)

ALIGNMENT DEVICE FOR EXPOSURE DEVICE, AND ALIGNMENT MARK

TECHNICAL FIELD

The present invention relates to an alignment device for an exposure device, and to an alignment mark, for aligning a substrate and a mask in an exposure device that uses a microlens array.

BACKGROUND ART

In a conventional exposure device, a mask pattern is exposed onto a substrate by emitting exposure light from a light source, and illuminating the substrate with the exposure light through a mask in which a pattern of predetermined shape has been formed. Therefore, alignment of the relative positions of the mask and the substrate is crucial for the purposes of exposing the pattern onto a predetermined position on the substrate with high accuracy. For example, Patent Document 1 discloses an exposure device of proximity exposure design, in which a wafer targeted for exposure use is positioned in proximity to the mask. Both the mask and the wafer are furnished with marks, and relative position alignment of the mask and the wafer is accomplished through these marks.

More recently, meanwhile, with the advent of microlens arrays, exposure devices that project a mask pattern onto a substrate have come into use. FIG. 44 is a schematic view showing an exposure device that uses a microlens array. Above a substrate 1 targeted for exposure, a mask 2 in which has been formed a pattern for exposure onto the substrate 1 is arranged at an appropriate gap relative to the substrate 1. Next, a microlens array 3 of microlenses 4 arrayed two-dimensionally is arranged between the substrate 1 and the mask 2, and the mask 2 is irradiated with exposure light from above the mask 2, the exposure light transmitted through the mask 2 being projected onto the substrate 1 by the microlens array 3, whereupon the pattern formed in the mask 2 is transferred as an erect unmagnified image by the microlens array 3 onto a resist or the like on the substrate surface.

In this case, normally, the mask 2 and the substrate 1 are stationary, while the microlens array 3, the exposure light source, and the optical system are moved in unison in a direction perpendicular to the plane of the page, to thereby scan the exposure light over the substrate 1. In this case, it is necessary to respectively furnish the top surface and the bottom surface of the substrate 1 with alignment marks 1a and 2a, and to align the relative positions of the substrate 1 and the mask 2 using these alignment marks 1a and 2a as guides.

PRIOR ART LITERATURE

Patent Document

Patent Document 1: Japanese Laid-open Patent Application 2004-103644

DISCLOSURE OF THE INVENTION

Problems the Invention is Intended to Solve

However, in cases of position alignment of the substrate 1 and the mask 2 using the alignment marks 1a and 2a, when attempting to align the positions of the substrate 1 and the mask 2 at high accuracy on the order of ±1 μm, it is necessary to simultaneously observe both of the alignment marks 1a and 2a with the same camera. That is, when the alignment marks 1a and 2a are observed with different cameras, proper relative positioning of both alignment marks 1a and 2a cannot be ensured.

In cases of proximity exposure as in Patent Document 1, the mask and the substrate are in proximity of about 200 μm, and because this gap falls within the focal depth of the camera, the alignment mark on the mask and the alignment mark on the substrate can be observed simultaneously by the camera. However, in the exposure device using the microlens array 3, it is necessary to interpose the microlens array 3 between the substrate 1 and the mask 2, and therefore the distance between the substrate 1 and the mask 2, that is, the gap G between the alignment marks 1a and 2a, lies between about 5 to 15 mm. Such a gap of 5 to 15 mm cannot be observed simultaneously by ordinary camera lens systems.

As shown in FIGS. 44 and 45, it would be conceivable to furnish an optical path difference between the reflected light from the alignment mark 1a of the substrate 1 and the reflected light from the alignment mark 2a of the mask 2, and to correct focus difference between the alignment mark 1a of the substrate 1 and the alignment mark 2a of the mask 2.

As shown in FIG. 44, the gap G between the substrate 1 and the mask 2 is from 5 to 15 mm. In this case, taking the field of view and alignment accuracy into account, it is necessary for the lens magnification to be about 4×. Therefore, seen from the camera side, the alignment pattern gap G (=5-15 mm) is equivalent to 5-15 mm×42=80-24 mm. It is necessary for this focus difference of 80-24 mm to be corrected.

Accordingly, in FIG. 45, the light from a light source 20, having been converged by a lens 21, is reflected by a reflecting mirror 22 and impinges on a beam splitter 17 via a lens 23. The light from the beam splitter 17 then impinges on the mask 2 through lenses 18 and 19, and is reflected by the alignment mark 2a of the mask 2, while also impinging on the substrate 1 and being reflected by the alignment mark 1a of the substrate. The light reflected by the alignment marks 1a, 2a travels towards the beam splitter 17, and after being transmitted through the beam splitter 17, impinges on a beam splitter 14 via lenses 16, 15. In the beam splitter 14, the reflected light from the alignment marks 1a, 2a is separated into light traveling towards a beam splitter 11 and light traveling towards a mirror 13, with the light traveling towards the mirror 13 being directed towards the beam splitter by a mirror 12. In the beam splitter 11, the light from the beam splitter 14 is transmitted in unmodified fashion, whereas the light from the mirror 12 is reflected towards a camera 10. In this way, the light traveling through the mirrors 13, 12 from the beam splitter 14, and the light arriving directly from the beam splitter 14, are detected by the camera 10. The total length of the optical path from the beam splitter 14 to the mirror 12, the optical path from the mirror 13 to the mirror 12, and optical path from the mirror 12 to the beam splitter 11 at this time is set so as to be longer, by the equivalent of the 80-240 mm focus difference, than the optical path of light directly impinging on the beam splitter 11 from the beam splitter 14. Consequently, light reflected light from the alignment mark 2a of the mask 2 and advancing along the optical path through the mirrors 12, 13, and light reflected light from the alignment mark 1a of the substrate 1 and that advancing along the optical path to directly impinge on the beam splitter 11 from the beam splitter 14, are each imaged by the charge-coupled device (CCD) of the camera 10, so that the alignment marks 1a, 2a can be observed simultaneously by the camera 10.

In so doing, the focus difference (equivalent to 80-240 mm of the patterns of the alignment marks 1a, 2a of the substrate 1 and the mask 2 can be corrected over separate optical paths.

However, when focus difference is corrected over separate optical paths in this manner, in cases of discrepancy arising between the optical axes on the optical paths, the problem of discrepancy of relative positioning of the two patterns of the alignment marks 1a, 2a arises. Therefore, alignment accuracy is lower with this method. When alignment accuracy is lower, the exposure pattern accuracy is lower as well, which is a fatal problem in the case of exposure of high-definition LCD panels produced nowadays.

With the foregoing in view, it is an object of the present invention to provide an alignment device for an exposure device, and an alignment mark, whereby alignment of a substrate and mask can be performed with high accuracy.

Means for Solving the Problems

The alignment device for an exposure device according to the present invention, wherein said exposure device has a light source for emitting exposure light; a mask where said exposure light are input from said light source and a pattern to be exposed on a substrate is formed; and a first microlens array furnished between said substrate and said mask where said exposure light transmitted through the mask are input to form an erect unmagnified image of said pattern onto said substrate, wherein said alignment device aligns a relative position of said mask and said substrate in said exposure device.

Said alignment device comprises:

an alignment light source for illuminating a substrate alignment mark furnished to the substrate and a mask alignment mark furnished to the mask, using alignment light from above the mask;

a second microlens array arranged between the substrate alignment mark and the mask alignment mark, so that reflected light reflected from the substrate alignment mark is formed on the mask as an erect unmagnified image;

a camera for detecting, from the mask side, reflected light from the substrate alignment mark and reflected light from the mask alignment mark; and a control device for adjusting the position of the mask and/or the substrate so as to bring about registration of the substrate alignment mark and the mask alignment mark detected by the camera.

Another alignment device for an exposure device according to the present invention, wherein said exposure device has a light source for emitting exposure light; a mask where said exposure light are input from said light source and a pattern to be exposed on a substrate is formed; and a first microlens array furnished between said substrate and said mask where said exposure light transmitted through the mask are input to form an erect unmagnified image of said pattern onto said substrate, wherein said alignment device aligns a relative position of said mask and said substrate in said exposure device.

Said alignment device comprises:

an alignment light source for illuminating a substrate alignment mark furnished to the substrate and a mask alignment mark furnished to the mask, using alignment light from below the substrate; a second microlens array arranged between the substrate alignment mark and the mask alignment mark, so that reflected light reflected from the mask alignment mark is formed on the substrate as an erect unmagnified image; a camera for detecting, from the substrate side, reflected light from the substrate alignment mark and reflected light from the mask alignment mark; and a control device for adjusting the position of the mask and/or the substrate so as to bring about registration of the substrate alignment mark and the mask alignment mark detected by the camera.

In these alignment devices for an exposure device according to the present invention, the first microlens array and the second microlens array may be constituted, for example, by a single shared microlens array, and illuminated by the alignment light while the shared microlens array is moved between the substrate alignment mark and the mask alignment mark. Alternatively, the first microlens array and the second microlens array may be constituted by a single shared microlens array encompassing the exposure position illuminated by exposure light, and the alignment position illuminated by alignment light. Alternatively, the first microlens array and the second microlens array may be constituted by separate elements.

In these alignment devices for an exposure device according to the present invention, for example, either the substrate alignment mark or the mask alignment mark may have a frame shape, and the other has a rectangular shape for positioning at the center of the frame during alignment.

The alignment light source may, for example, emit alignment light coaxially with respect to the optical axis of light detected by the camera. Moreover, the alignment light source and the camera may be separate elements, and the optical axis of light from the alignment light source and the optical axis of reflected light detected by the camera are not coaxial.

An alignment mark according to the present invention is for use in relative position alignment of a mask and a substrate, using a microlens array having a plurality of unit microlens arrays stacked in alternating fashion and constituted by a plurality of microlenses arranged two-dimensionally; polygon field stops arranged at a reverse imaging position between the unit microlens arrays and having polygonal apertures; and aperture stops arranged in at least some of a maximum outspread portion of exposure light between the unit microlens arrays and having apertures of circular shape for determining the numerical aperture of each of the microlenses, the microlens array being arranged between a substrate to be exposed, and a mask being furnished with a pattern for exposure onto the substrate.

Said alignment mark being formed in either the substrate or the mask, comprises:

a plurality of linear mark segments that extend in directions respectively inclined with respect to all sides of the apertures of said polygon field stops, said linear mark segments consisting of a plurality of first group mark segments extending radially from an alignment center; and a plurality of second group mark segments extending over sides of a polygon shape centered on said alignment center, the positions of said polygon field stops and said mark segments being selected such that some of said mark segments are present inside some of the polygon field stops.

In this alignment mark, in preferred practice, the second group mark segments are arranged contiguously on sides of a plurality of polygons of different size having the alignment center as the common center. Alternatively, in preferred practice, the second group mark segments are arranged discontinuously on sides of a plurality of polygons of different size having the alignment center as a common center, and include corner portions of the polygons. In preferred practice, of the second group mark segments, those positioned on different polygons differ in thickness.

Another alignment mark according to the present invention is an alignment mark formed on a substrate or mask for use in an exposure device for position adjustment of the substrate or the mask, and comprising a pattern of line-symmetric polygonal shapes.

Said alignment mark comprises:

polygonal portions arranged so as to not extend parallel to any marginal edge constituting an aperture of any individual polygon field stop of a plurality of lenses arranged in matrix form between the substrate and the mask; and radial line portions comprising at least six radial lines crossing through the polygonal portions from the center of the polygonal portions, the polygonal portions and the radial line portions overall being larger in size than any of the lenses, but smaller than the overall size of four adjacent lenses.

Another alignment device for an exposure device for transferring an exposure pattern formed in a mask onto a substrate, according to the present invention comprises:

an alignment light source for emitting alignment light concomitantly with or independently of emission of exposure light;

a microlens array arranged between the substrate and the mask, so that reflected alignment light reflected from a substrate alignment mark furnished to the substrate is formed on the mask as an erect unmagnified image;

a camera for detecting, from the mask side, reflected light reflected from a mask alignment mark, and an erect unmagnified image of the substrate alignment mark formed on the mask, while the substrate alignment mark and the mask alignment mark furnished to the mask are simultaneously illuminated with alignment light from the mask side; and a control device for adjusting the position of the mask and/or the substrate so as to bring about registration of the substrate alignment mark and the mask alignment mark detected by the camera;

the microlens array having a plurality of unit microlens arrays stacked in alternating fashion and constituted by a plurality of microlenses arranged two-dimensionally;

polygon field stops arranged at a reverse imaging position between the unit microlens arrays and having polygonal apertures; and aperture stops arranged in at least some of a maximum outspread portion of the exposure light between the unit microlens arrays, and having apertures of circular shape for determining the numerical aperture of each of the microlenses; and the substrate alignment mark having a plurality of linear mark segments extending in directions respectively inclined with respect to all sides of the apertures of the polygon field stops, the mark segments comprising a plurality of first group mark segments extending radially from an alignment center, and a plurality of second group mark segments extending on sides of a polygon shape centered on the alignment center, the positions of the polygon field stops and the mark segments being selected such that a plurality of the mark segments are present inside some of the polygon field stops.

Another alignment device for an exposure device for transferring an exposure pattern formed in a mask onto a substrate, according to the present invention comprises:

an alignment light source for emitting alignment light concomitantly with or independently of emission of exposure light;

a microlens array arranged between the substrate and the mask, so that reflected alignment light reflected from a mask alignment mark furnished to the mask is formed on the substrate as an erect unmagnified image;

a camera for detecting, from the substrate side, reflected light reflected from a substrate alignment mark, and an erect unmagnified image of the mask alignment mark formed on the substrate, when the mask alignment mark and the substrate alignment mark furnished to the substrate are simultaneously illuminated with alignment light from the substrate side; and a control device for adjusting the position of the mask and/or the substrate so as to bring about registration of the substrate alignment mark and the mask alignment mark detected by the camera;

the mask alignment mark having a plurality of linear mark segments extending in directions respectively inclined with respect to all sides of the apertures of the polygon field stops, the mark segments comprising a plurality of first group mark segments extending radially from an alignment center, and a plurality of second group mark segments extending over sides of a polygon shape centered on the alignment center, the positions of the polygon field stops and the mark segments being selected such that a plurality of the mark segments are present inside some of the polygon field stops.

In this alignment device for an exposure device, in preferred practice, the second group mark segments are arranged contiguously on sides of a plurality of polygons of different size having the alignment center as the common center. Alternatively, in preferred practice, the second group mark segments are arranged in discontinuous fashion on sides of a plurality of polygons of different size having the alignment center as the common center, in such a way as to include corner portions of the polygons. In preferred practice, the second group mark segments positioned on different polygons differ in thickness.

Another alignment mark according to the present invention is for use during relative position alignment of a mask and a substrate, using a microlens array having a plurality of unit microlens arrays stacked in alternating fashion and constituted by a plurality of microlenses arranged two-dimensionally; polygon field stops arranged at a reverse imaging position between the unit microlens arrays and having polygonal apertures; aperture stops arranged in at least some of a maximum outspread portion of the exposure light between the unit microlens arrays, and having apertures of circular shape for determining the numerical aperture of each of the microlenses; and a light-blocking film for blocking light from sections other than the microlenses on the top surface of the microlens array, the microlens array being arranged between the substrate to be exposed, and the mask furnished with a pattern for exposure onto the substrate.

Said alignment mark is formed in either the substrate or the mask, and all sides constituting a mark are inclined with respect to a first direction in which the microlenses are arrayed on a straight line.

In this alignment mark, in preferred practice, the microlens array is arranged with the microlenses thereof lined up in a single row in a direction perpendicular to the scanning direction of the exposure device, the first direction being a direction perpendicular to the scanning direction, and all sides constituting a mark being inclined with respect to a direction perpendicular to the scanning direction. In preferred practice, all sides constituting the mark form 45° angles with respect to a direction perpendicular to the scanning direction.

Another alignment device for an exposure device for transferring an exposure pattern formed in a mask onto a substrate, according to the present invention comprises:

an alignment light source for emitting alignment light concomitantly with or independently of emission of exposure light;

a microlens array arranged between the substrate and the mask, whereby reflected alignment light reflected from a substrate alignment mark furnished to the substrate is formed on the mask as an erect unmagnified image;

a camera for detecting, from the mask side, reflected light reflected from a mask alignment mark, and an erect unmagnified image of the substrate alignment mark formed on the mask, while the substrate alignment mark and the mask alignment mark furnished to the mask are simultaneously illuminated with alignment light from the mask side; and a control device for adjusting the position of the mask and/or the substrate so as to bring about registration of the substrate alignment mark and the mask alignment mark detected by the camera;

the microlens array having a plurality of unit microlens arrays stacked in alternating fashion and constituted by a plurality of microlenses arranged two-dimensionally;

polygon field stops arranged at a reverse imaging position between the unit microlens arrays and having polygonal apertures;

aperture stops arranged in at least some of a maximum outspread portion of the exposure light between the unit microlens arrays, and having apertures of circular shape for determining the numerical aperture of each of the microlenses; and a light-blocking film for blocking light from sections other than the microlenses on the top surface of the microlens array, and in the mask alignment mark or the substrate alignment mark, all sides constituting the mark being inclined with respect to a first direction in which the microlenses are arrayed on a straight line.

Another alignment device for an exposure device for transferring an exposure pattern formed in a mask onto a substrate, according to the present invention comprises:

an alignment light source for emitting alignment light concomitantly with or independently of emission of exposure light;

a microlens array arranged between the substrate and the mask, so that reflected alignment light reflected from a mask alignment mark furnished to the mask is formed on the substrate as an erect unmagnified image;

a camera for detecting, from the substrate side, reflected light reflected from a substrate alignment mark, and an erect unmagnified image of the mask alignment mark formed on the substrate, while the mask alignment mark and the substrate alignment mark furnished to the substrate are simultaneously illuminated with alignment light from the substrate side; and a control device for adjusting the position of the mask and/or the substrate so as to bring about registration of the substrate alignment mark and the mask alignment mark detected by the camera;

the microlens array having a plurality of unit microlens arrays stacked in alternating fashion and constituted by a plurality of microlenses arranged two-dimensionally;

polygon field stops arranged at a reverse imaging position between the unit microlens arrays and having polygonal apertures;

aperture stops arranged in at least some of a maximum outspread portion of the exposure light between the unit microlens arrays and having apertures of circular shape for determining the numerical aperture of each of the microlenses; and a light-blocking film for blocking light from sections other than the microlenses on the top surface of the microlens array, and in the mask alignment mark or the substrate alignment mark, all sides constituting the mark being inclined with respect to a first direction in which the microlenses are arrayed on a straight line.

In this alignment device for an exposure device, in preferred practice, the microlens array is arranged with the microlenses thereof lined up in a single row in a direction perpendicular to the scanning direction of the exposure device, the first direction being a direction perpendicular to the scanning direction, and all sides constituting a mark being inclined with respect to a direction perpendicular to the scanning direction. In preferred practice, all segments constituting the mark form 45° angles with respect to a direction perpendicular to the scanning direction.

Another alignment device for an exposure device according to the present invention, said alignment device being furnished to a scan exposure device that uses a microlens array to transfer a pattern of a mask to a substrate through scan exposure, and adapted for relative position alignment of the mask and the substrate, comprises:

an alignment light source for illuminating by alignment light a substrate alignment mark furnished to the substrate and a mask alignment mark furnished to the mask;

a microlens array interposed between the substrate and the mask, whereby the substrate alignment mark or the mask alignment mark is formed as an erect unmagnified image respectively on the substrate or on the mask;

a camera for capturing images of the substrate alignment mark and the mask alignment mark, one being captured as a reflected light image and the other as an erect unmagnified image; and a control device for adjusting the position of the mask and/or the substrate, on the basis of the substrate alignment mark and the mask alignment mark captured by the camera;

the microlens array having:

a plurality of unit microlens arrays stacked in alternating fashion and constituted by a plurality of microlenses arranged two-dimensionally;

polygon field stops arranged at a reverse imaging position between the unit microlens arrays and having polygonal apertures; and aperture stops for restricting the numerical aperture between the unit microlens arrays, the plurality of microlenses being arrayed into microlens rows in a direction perpendicular to the scan exposure direction, the microlens rows being arranged in a plurality of rows in the scan exposure direction, and any two microlens rows situated adjacently in the scan exposure direction being arranged to have mutual bias in a direction perpendicular to the scan exposure direction, and the control device moving the microlens array in the scan exposure direction in relative fashion with respect to the substrate and the mask while capturing images multiple times of the substrate alignment mark and the mask alignment mark with the camera, doing so at spacing that is not an integer multiple of the array pitch of the microlens rows, superimposing the multiple captured images, and using the superimposed substrate alignment mark images and the mask alignment mark images for alignment.

Another alignment device for an exposure device according to the present invention, said alignment device being furnished to a scan exposure device that uses a microlens array for transferring a pattern of a mask to a substrate through scan exposure, and being adapted for relative position alignment of the mask and the substrate, comprises:

an alignment light source for illuminating by alignment light a substrate alignment mark furnished to the substrate and a mask alignment mark furnished to the mask;

a microlens array interposed between the substrate and the mask, so that the substrate alignment mark or the mask alignment mark is formed as an erect unmagnified image respectively on the substrate or on the mask;

a camera for capturing images of the substrate alignment mark and the mask alignment mark, one being captured as a reflected light image and the other as an erect unmagnified image; and a control device for adjusting the position of the mask and/or the substrate, on the basis of the substrate alignment mark and the mask alignment mark captured by the camera;

the microlens array having:

a plurality of unit microlens arrays stacked in alternating fashion and constituted by a plurality of microlenses arranged two-dimensionally;

polygon field stops arranged at a reverse imaging position between the unit microlens arrays and having polygonal apertures; and aperture stops for restricting the numerical aperture between the unit microlens arrays, the plurality of microlenses being arrayed into microlens rows in a direction perpendicular to the scan exposure direction, the microlens rows being arranged in a plurality of rows in the scan exposure direction, with any two microlens rows situated adjacently in the scan exposure direction being arranged to have mutual bias in a direction perpendicular to the scan exposure direction, and the control device moving the microlens array in the scan exposure direction in relative fashion with respect to the substrate and the mask while continuously capturing, as a moving image, images of the substrate alignment mark and images of the mask alignment mark with the camera, and using the continuously captured images of the substrate alignment mark and the images of the mask alignment mark for alignment.

In this alignment device for an exposure device, in preferred practice, either the substrate alignment mark or the mask alignment mark describes a frame shape, and the other is describes a rectangular shape positioned at the center of the frame during alignment. Moreover, in preferred practice, the alignment light source emits alignment light coaxially with respect to the optical axis of light detected by the camera. The microlens array may be shared as the microlens array for the exposure light.

Effects of the Invention

In another alignment device according to the present invention, when the mask and the substrate are illuminated with alignment light from above the mask by the alignment light source, this alignment light is transmitted through the mask, illuminates the substrate, and is reflected by the substrate alignment mark on the substrate. Thereafter, the reflected light is imaged as an erect unmagnified image of the substrate alignment mark onto the mask by a second microlens array. Therefore, the substrate alignment mark and the mask alignment mark can be detected on the mask by the camera, and the focus difference on the camera side, caused by the gap G between the substrate and the mask, is zero. Therefore, even in a case in which the optical axis of the alignment light is inclined, the relative positions of both of the alignment marks detected by the camera are unchanged, and alignment of the substrate and the mask can be performed with high accuracy. For example, situations in which, in the camera, the substrate and the mask are mistakenly observed to be out of alignment despite being in alignment, or in which in the camera, the substrate and the mask are mistakenly observed to be in alignment despite being out of alignment, can be prevented. In the present invention, the control device adjusts the position of the mask and/or the substrate so as to bring about registration of the substrate alignment mark and the mask alignment mark detected by the camera, whereby alignment of the substrate and the mask can be performed with high accuracy.

In another alignment device according to the present invention, when the substrate and the mask are illuminated with alignment light from below the substrate by the alignment light source, in cases in which the substrate comprises a light-transmissive material, for example, a polyimide (PI) and tin-doped indium oxide (ITO) or the like, the alignment light is transmitted through the substrate, illuminates the mask, and is reflected by the mask alignment mark on the mask. Thereafter, the reflected light is imaged as an erect unmagnified image of the mask alignment mark onto the substrate by a second microlens array. Therefore, the substrate alignment mark and the mask alignment mark can be detected on the substrate by the camera, and the focus difference on the camera side, caused by the gap G between the substrate and the mask, is zero. Consequently, even in a case in which the optical axis of the alignment light is inclined, the relative positions of both of the alignment marks detected by the camera are unchanged, and alignment of the substrate and the mask can be performed with high accuracy.

BEST MODE FOR CARRYING OUT THE INVENTION

Figure 1:
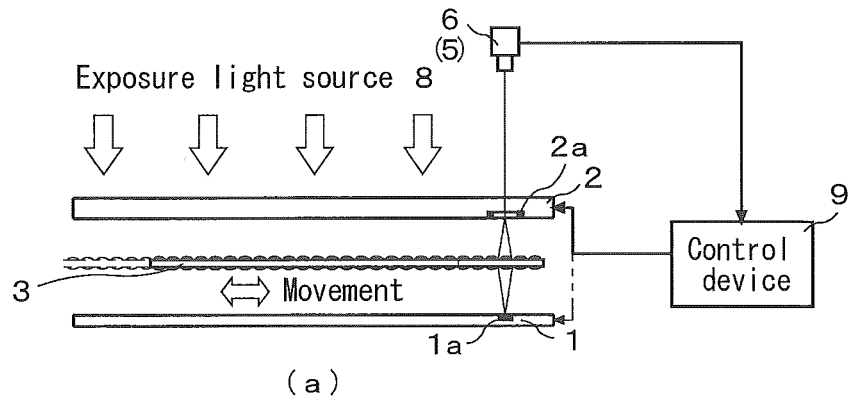
FIG. 1 (a) is a view showing an alignment device for an exposure device according to a first embodiment of the present invention, and (b) is a view showing relative positional relationships between detected alignment marks.

Embodiments of the present invention will be described in detail below, with reference to the accompanying drawings. FIG. 1 (a) is a view showing an alignment device for an exposure device according to a first embodiment of the present invention, and FIG. 1 (b) is a view showing relative positional relationships between detected alignment marks. As shown in FIG. 1, in the present embodiment, as in a conventional exposure device using a microlens array, an exposure device furnished with the alignment device is furnished with a microlens array 3 situated between a substrate (1) and a mask (2). Exposure light emitted by an exposure light source (8) is transmitted through a pattern formed in the mask 2, and is imaged by the microlens array 3 onto the substrate, in the form of an erect unmagnified image of the pattern. In this exposure device, the alignment device is used for relative position alignment of the substrate 1 and the mask 2.

The alignment device according to the present embodiment is furnished with an alignment light source 5 above the mask 2, for illuminating, with light for alignment use from above the mask 2, a substrate alignment mark 1a furnished to the substrate 1 and a mask alignment mark 2a furnished to the mask 2. As shown in FIG. 1, the microlens array 3 for exposure use is used by being moved between the substrate alignment mark 1a and the mask alignment mark 2a during relative position alignment of the substrate 1 and the mask 2, the single microlens array 3 being moved in selective fashion during exposure and during alignment. The design is such that, during alignment, an erect unmagnified image reflected from the substrate alignment mark 1a is formed on the mask 2 by the microlens array 3. A camera 6 is furnished above the mask 2, and reflected light reflected from the mask alignment mark 2a, as well as the erect unmagnified image of the substrate alignment mark 1a formed on the mask 2, are detected by the camera 6.

As shown in FIG. 1 (a), in the present embodiment, the camera 6 is, for example, a coaxial episcopic microscope of unifocal type housing an alignment light source 5. The alignment light source 5 is constituted to emit alignment light coaxially with respect to the optical axis of the light detected by the camera 6. Laser light, or lamp light transmitted through an interference filter, can be used as the alignment light source 5. For the lamp light source, it is preferable to use, for example, a halogen lamp, due to the reduced cost. The alignment light source 5 may be furnished as a separate element from the camera 6. The light emitted by the alignment light source 5 illuminates the mask 2 and the substrate 1 via an optical system including, for example, a reflecting mirror, a beam splitter, and the like.

The mask 2 is furnished with an alignment mark 2a of frame shape, for example. The substrate 1 is furnished with a substrate alignment mark 1a of rectangular shape smaller in size than the mask alignment mark 2a. During alignment, when the mask 2 and the substrate 1 are in a predetermined positional relationship, the substrate alignment mark 1a detected by the camera 6 is positioned at the center of the mask alignment mark 2 as shown in FIG. 1 (b).

The alignment light illuminating the mask 2 and the substrate 1 is reflected in respective fashion by each of the alignment marks 1a, 2a, so as to be detected by the camera 6. As shown in FIG. 1 (a), the camera 6 is connected to a control device 9 that controls the position of the mask 2, and depending on the result detected by the camera 6, in cases in which alignment of the substrate 1 and the mask 2 is necessary, the control device 9 moves the mask 2. For example, in cases in which the position of the substrate alignment mark 1a detected by the camera 6 diverges from the center of the frame-shaped mask alignment mark 2a, the control device 9 moves the mask 2 so as to position the substrate alignment mark 1a at the center of the mask alignment mark 2a. As shown by the double-dash broken line in FIG. 1 (a), the control device 9 is connected, for example, to a stage or the like supporting the substrate 1, and performs alignment of the substrate 1 and the mask 2 by moving the substrate 1. Alternatively, the control device 9 may perform alignment of the substrate 1 and the mask 2 by moving both the substrate 1 and the mask 2.

Figure 2:
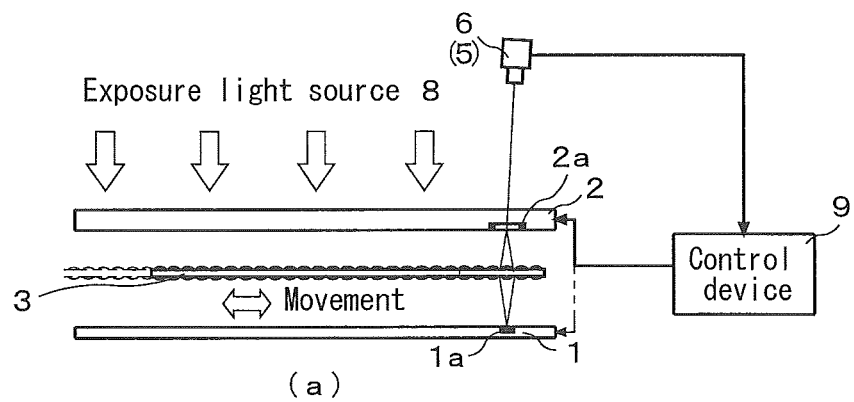
FIG. 2 (a) and (b) are views showing a case in which the optical path of the alignment light is inclined in the exposure device shown in FIG. 1.

During alignment, due to the presence of the microlens array 3 between the mask alignment mark 2a and the substrate alignment mark 1a, reflected light reflected from the substrate alignment mark 1a is transmitted through the microlens array 3, and an erect unmagnified image of the substrate alignment mark 1a is formed on the mask 2. Therefore, despite the fact that a gap G of 5 to 15 mm is actually present between the substrate 1 and the mask 2, the focus difference on the camera 6 side caused by this gap G is zero. Therefore, the alignment marks 1a, 2a of the substrate 1 and the mask 2, which are at different distances with respect to the sensor of the camera 6, can be simultaneously imaged on the camera 6, and alignment of the substrate 1 and the mask 2 can be performed with high accuracy by adjusting the positions of the substrate 1 and the mask 2, using the alignment marks as guides. Moreover, by bringing the focus difference on the camera side to zero, the relative positions of the alignment marks are unchanged, even in a case in which the optical axis of the alignment light is inclined as shown in FIG. 2 (a), and very high alignment accuracy can be obtained.

Next, operation of the alignment device according to the present embodiment constituted in the above manner will be described. During exposure, the microlens array 3 is positioned below a pattern area furnished to the mask 2. Firstly, the microlens array 3 is moved towards the rightward direction in FIG. 1, and moves between the substrate alignment mark 1a and the mask alignment mark 2a. Next, alignment light is emitted from the halogen lamp or other alignment light source 5 housed in the camera 6. This alignment light first illuminates the mask 2, via an optical system including, for example, a reflecting mirror, a beam splitter, and the like. The alignment light illuminating the mask 2 is reflected by the mask alignment mark 2a. Meanwhile, the alignment light transmitted through the mask 2 is transmitted through the microlens array 3 which is arranged below the mask 2, and illuminates the substrate 1.

Reflected light reflected from the substrate alignment mark 1a is transmitted through the microlens array 3 and again impinges on the mask 2, imaging an erect unmagnified image of the substrate alignment mark 1a onto the mask 2. The reflected light beams then impinge on the sensor of the camera 6, whereby the mask alignment mark 2a and the erect unmagnified image of the substrate alignment mark 1a formed on the mask 2 are detected. According to the present embodiment, because an erect unmagnified image of the substrate alignment mark 1a formed on the mask 2 is detected by the camera 6 in this manner, despite the fact that a gap G of 5 to 15 mm is actually present between the substrate 1 and the mask 2, the focus difference on the camera 6 side caused by this gap G is zero.

Alignment of the substrate 1 and the mask 2 is then performed on the basis of the substrate and mask alignment marks 1a, 2a detected by the camera 6. For example, in cases in which the position of the substrate alignment mark 1a detected by the camera 6 diverges from the center of the frame-shape mask alignment mark 2a, the control device 9 will move the mask 2 so that the substrate alignment mark 1a is positioned at the center of the mask alignment mark 2a, and perform alignment of the substrate 1 and the mask 2. According to the present embodiment, because the focus difference on the camera 6 side caused by the gap G between the substrate 1 and the mask 2 is zero, alignment of the substrate 1 and the mask 2 can be performed with high accuracy using the alignment marks 1a, 2a of the substrate 1 and the mask 2 as guides.

As shown in FIG. 2 (a), even in a case in which the optical axis of the alignment light has been inclined in order to image an erect unmagnified image of the substrate alignment mark 1a onto the mask 2, as shown in FIG. 2 (b), the relative positions of the substrate and mask alignment marks 1a, 2a detected by the camera 6 are unchanged from the case of FIG. 1 (b) of perpendicular illumination of the substrate 1 and the mask 2 by the alignment light, and there is no reduction in alignment accuracy due to the optical axis of the alignment light being inclined.

Figure 3:
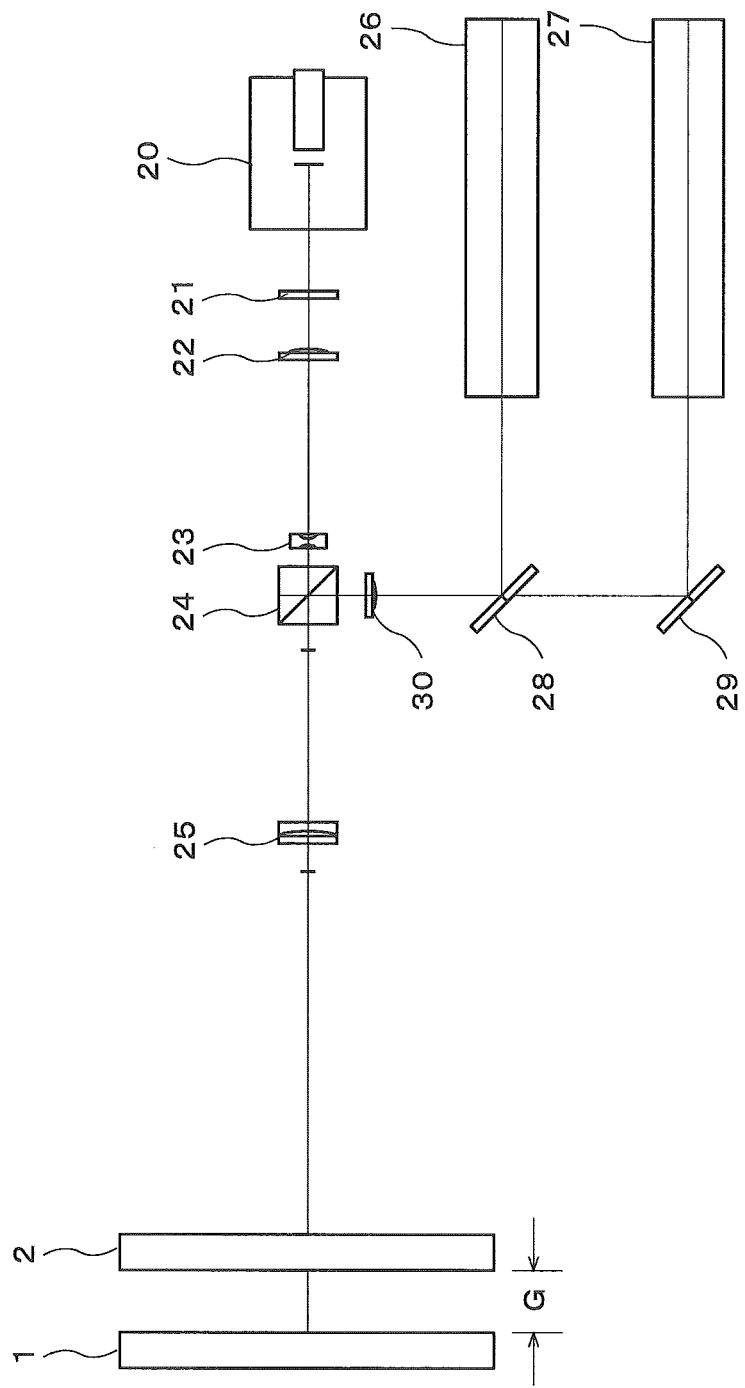
FIG. 3 is a view showing an alignment device for an exposure device according to a comparative example of the present invention.
Figure 4:
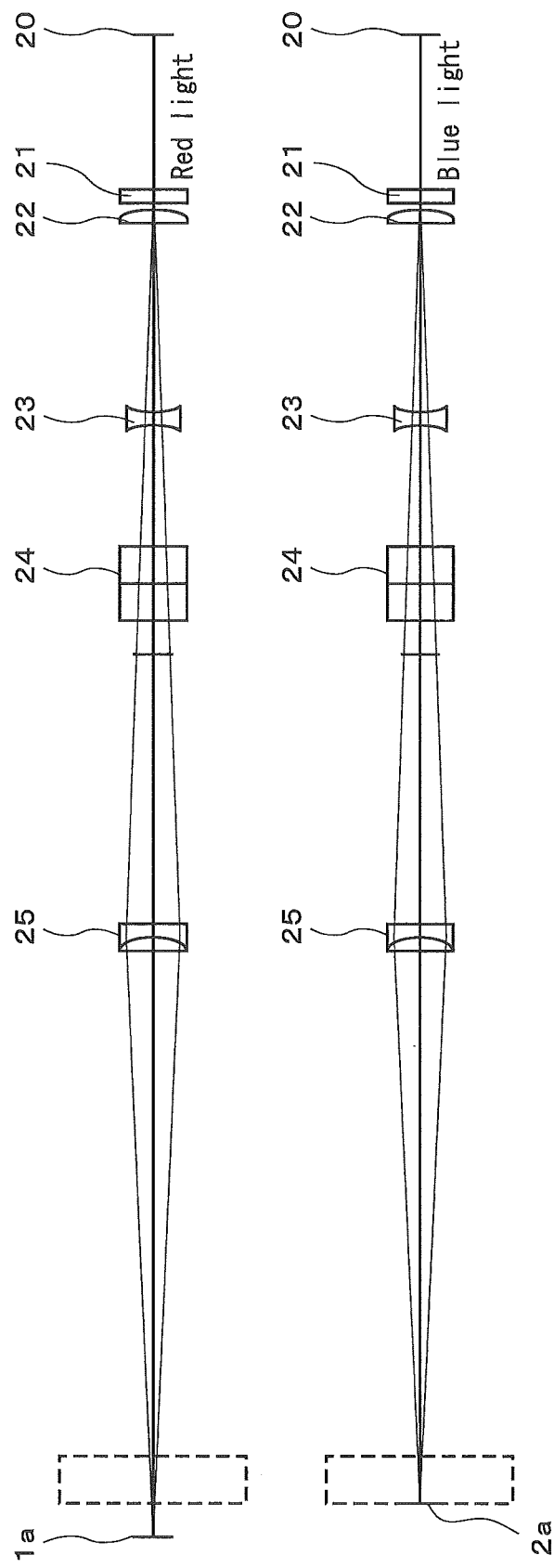
FIG. 4 is a view showing the optical path of the alignment light in an alignment device according to a comparative example of the present invention.

The aforedescribed effect observed in cases in which the optical axis of the alignment light has been inclined will be described in detail below through a comparison to a comparative example. FIG. 3 is a view showing an alignment device for an exposure device according to a comparative example of the present invention, and FIG. 4 is a view showing the optical path of the alignment light in an alignment device according to a comparative example of the present invention. As shown in FIGS. 3 and 4, this alignment device is an alignment device that uses coaxial episcopic illumination of bifocal type and is furnished, for example, with a first light source 27 for emitting long-wavelength light, and a second light source 26 for emitting short-wavelength light, the long-wavelength light emitted by the first light source 27 being reflected by a reflecting mirror 29 and then traveling towards a beam splitter 28; and the short-wavelength light from the second light source 26 being combined with the long-wavelength light from the first light source 27 at the beam splitter 28. The combined light, once converged by a lens 30, is reflected by a beam splitter 24, and after going through a lens 25 travels towards the mask 2 and the substrate 1. The combined light impinges perpendicularly onto the surfaces of the mask 2 and the substrate 1, and is reflected by the alignment mark 2a of the mask 2 and the alignment mark 1a of the substrate 1, returning to an optical path identical to the impinging optical path. This reflected light passes through beam splitter 24, then through lenses 23, 22 and a filter 21 to impinge on a camera 20. Therefore, the reflecting mirror 29 and the beam splitter 28 constitute a first optical system for combining onto the same optical path the long-wavelength light and the short-wavelength light emitted by the first and second light sources 27, 26; the lens 30, the beam splitter 24, and the lens 25 constitute a second optical system for perpendicular illumination of the surfaces of the mask 2 and the substrate 1 by the combined light from the first optical system; and the lens 25, the beam splitter 24, the lens 23, and the lens 22 constitute a third optical system for returning reflected light reflected from the alignment marks 2a, 1a of the mask 2 and the substrate 1 to the same optical path as that of the second optical system, and then guiding the light to the camera 20.

In this comparative example, for example, when red light of 670 nm wavelength is emitted by the first light source 27 and blue light of 405 nm wavelength is emitted by the second light source 26, the beams of light are combined by the beam splitter, and advance to the camera 20 over the same optical path. That is, as shown in FIG. 4, the combined light travels towards the mask 2 and the substrate 1 from the beam splitter 24, and impinges perpendicularly on the surfaces of the mask 2 and the substrate 1.

Thereafter, the reflected light resulting from reflection of the combined light by the alignment mark 2a of the mask 2 and the alignment mark 1a of the substrate 1 travels along the same optical path as the incident light, advancing directly through the beam splitter 24 and being transmitted through the filter 21 to impinge on the sensor of the camera 20. At this time, because the combined light passes through an optical system composed of the identical lenses 25, 23, 22, in the case of such identical lenses, the focal distance of the blue light (405 nm) will be shorter, and the focal distance of the red light (670 nm) will be longer. Therefore, where the optical constant and the like of the lenses 25, 23, 22 have been appropriately set, of the light impinging on the sensor of the camera 20, for the light that has been reflected by the alignment mark of the mask 2, the blue light component will be the focal point for the sensor of the camera 20, whereas for the light that has been reflected by the alignment mark of the substrate 1, which is more distant from the camera 20, the red light component will be the focal point for the sensor of the camera 20. In the alignment device of the comparative example constituted in this manner, the gap G between the substrate 1 and the mask 2 is on the order of 5 to 15 mm, and of the light impinging on the camera 20, the red light and the blue light arrive over different optical paths to their focal points on the sensor, thereby compensating for a gap G of, for example, 5 mm, so that the alignment marks 1a, 2a of both the substrate 1 and the mask 2 can be focused onto the sensor of the camera 20, and both the alignment pattern on the substrate 1 and the alignment pattern on the mask 2 can be focused onto the sensor, and observed simultaneously.

Figure 5:
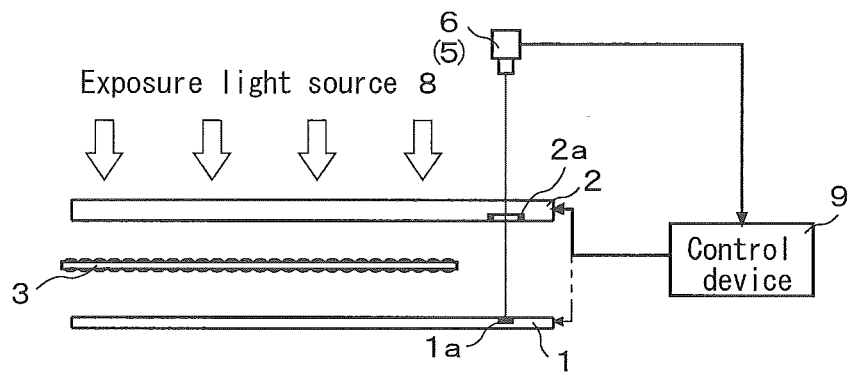
FIG. 5 (a) to (d) are views showing cases in which the alignment device according to first embodiment is not furnished with a second microlens array 7.
Figure 5:
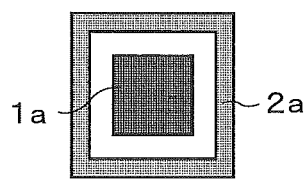
Figure 5:
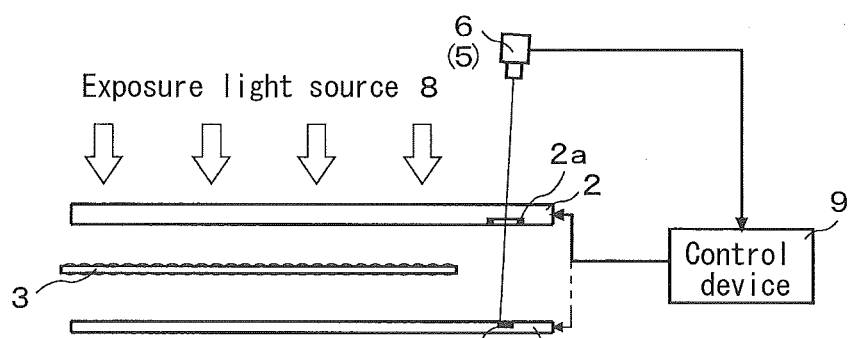
Figure 5:
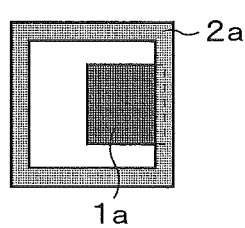

As shown in FIG. 5 (a), in the alignment device of the comparative example constituted in this manner, in cases of perpendicular illumination of the substrate 1 and the mask 2 by the alignment light, a predetermined alignment accuracy may be obtained as shown in FIG. 5 (b). However, as shown in FIG. 5 (c), in cases in which the optical axis of the alignment light has been inclined, the optical paths of the reflected light change, and due to the gap G present between the substrate 1 and the mask 2, the positions of the alignment marks 1a, 2a detected on the camera 6 side diverge as shown in FIG. 5 (d), even in cases in which the substrate 1 and the mask 2 have a predetermined positional relationship. If this occurs, despite the fact that the positions of alignment mark 2a and the alignment mark 1a mask are actually registered so that the mask 2 and the substrate 1 are in alignment, the camera 6 mistakenly observes them to be out of alignment. Stated another way, situations may arise which, despite the fact that mask 2 and the substrate 1 are out of alignment, the camera 6 observes the alignment mark 1a to be at the center of the alignment mark 2a, leading to the mistaken observation that the substrate 1 and the mask 2 are out of alignment.

In contrast to this, according to the present embodiment, even in a case in which the optical axis of the alignment light has been inclined as shown by FIG. 2 (a) in order to image an erect unmagnified image of the alignment mark 1a onto the mask 2 by the microlens array 3, the relative positions of the substrate and mask alignment marks 1a and 2a as detected by the camera 6 are unchanged as shown by FIG. 2 (a), and very high alignment accuracy can be obtained.

In the aforedescribed comparative example, it was necessary to furnish two alignment light sources of different wavelengths, making the structure and alignment method somewhat complicated. In the alignment device according to the present embodiment on the other hand, during alignment, the focus difference on the camera 6 side caused by the gap G between the substrate 1 and the mask 2 can be brought to zero simply by moving the microlens array 3 for exposure between the substrate alignment mark 1a and the mask alignment mark 2a, to obtain high alignment accuracy, using only a single alignment light source.

After alignment of the substrate 1 and the mask 2, the microlens array 3 is moved towards the leftward direction in FIG. 1, and moved to below the pattern area furnished to the mask 2. Thereafter, exposure light is emitted, and scan exposure by the microlens array 3 is initiated. According to the present embodiment, due to the high alignment accuracy obtained in the aforedescribed manner, a very high level of exposure accuracy can be maintained during scan exposure.

The shapes of the substrate and mask alignment marks 1a, 2a in the present embodiment are merely exemplary, and there is no limitation of the present invention to the shapes of the alignment marks 1a, 2a, provided that the alignment marks 1a, 2a can be detected by the camera 6, and alignment of the substrate 1 and mask 2 performed.

Whereas the present embodiment describes a case in which the alignment light source 5 is housed inside the camera 6, and is configured to emit alignment light coaxially with respect to the optical axis of light detected by the camera 6, in the present invention, the optical axis of light emitted by the alignment light source 5 need not be coaxial to the optical axis of the reflected light detected by the camera, in order to image an erect unmagnified image of either the substrate 1 or the mask 2 onto the other, and detect it with the camera 6.

Figure 6:
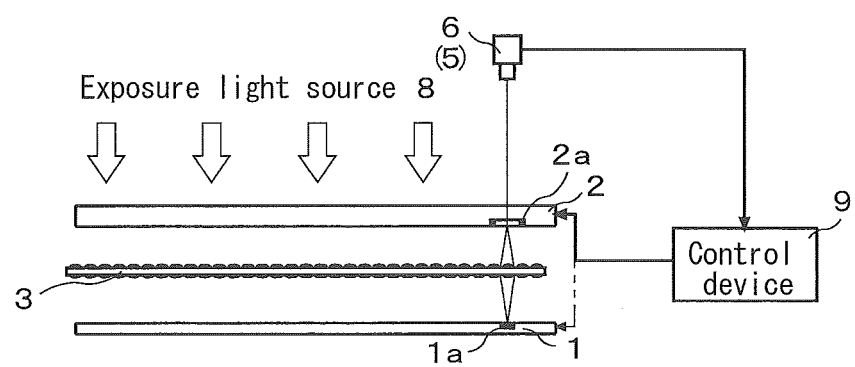
FIG. 6 (a) is a view showing an alignment device for an exposure device according to a second embodiment of the present invention, and (b) is a view showing relative positional relationships between detected alignment marks.
Figure 6:
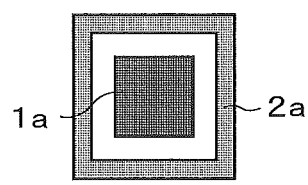

Next, an alignment device for an exposure device according to a second embodiment of the present invention will be described. FIG. 6 (a) is a view showing the alignment device for an exposure device according to the second embodiment of the present invention, and FIG. 6 (b) is a view showing relative positional relationships between detected alignment marks. Whereas the first embodiment describes a case in which the microlens array 3 for exposure use is moved in selective fashion during exposure and during alignment, with a single microlens array being employed in common for exposure and for alignment, in the present embodiment, as shown in FIG. 6, there is furnished a microlens array 3 of size sufficient to encompass the exposure position illuminated by exposure light and the alignment position illuminated by alignment light. The constitution is otherwise comparable to the first embodiment.

By constituting the single common microlens array 3 as a microlens array of size sufficient to encompass the exposure position illuminated by exposure light and the alignment position illuminated by alignment light as in the present embodiment, the need to move the microlens array 3 in selective fashion during exposure and during alignment is obviated. Other advantageous effects are comparable to those of the first embodiment.

Figure 7:
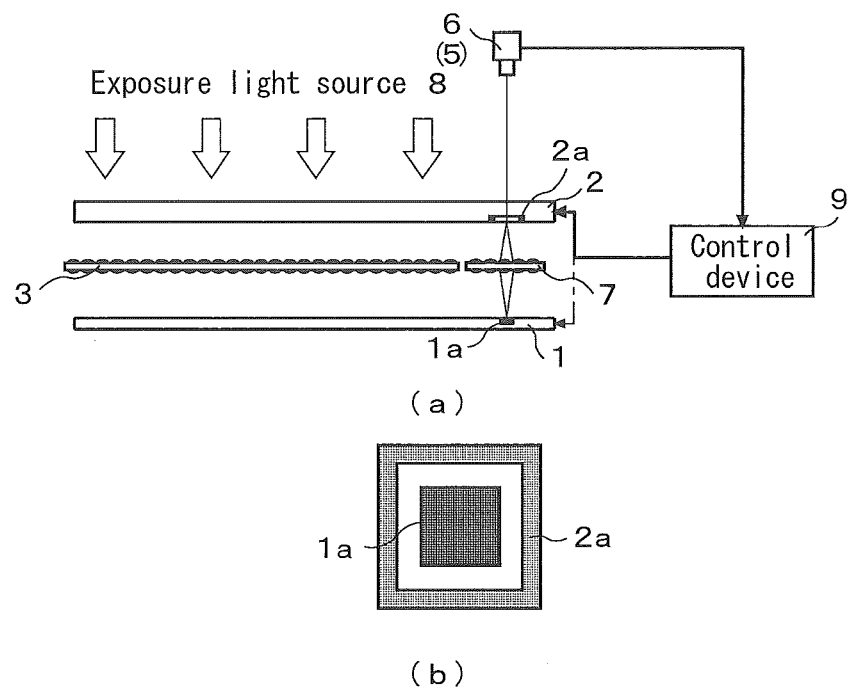
FIG. 7 (a) is a view showing an alignment device for an exposure device according to a third embodiment of the present invention, and (b) is a view showing relative positional relationships between detected alignment marks.

Next, an alignment device for an exposure device according to a third embodiment of the present invention will be described. FIG. 7 (a) is a view showing the alignment device for an exposure device according to the third embodiment of the present invention, FIG. 7 (b) is a view showing relative positional relationships between detected alignment marks, and FIG. 8 (a) and (b) are views showing a case in which the optical path of the alignment light is inclined in the exposure device shown in FIG. 7. As shown in FIG. 7, according to the present embodiment, two microlens arrays, a (first) microlens array 3 for exposure and a second microlens array 7 for alignment, are furnished. The second microlens array 7 has optical characteristics identical to those of the (first) microlens array 3. The constitution is otherwise comparable to the first embodiment.

Figure 8:
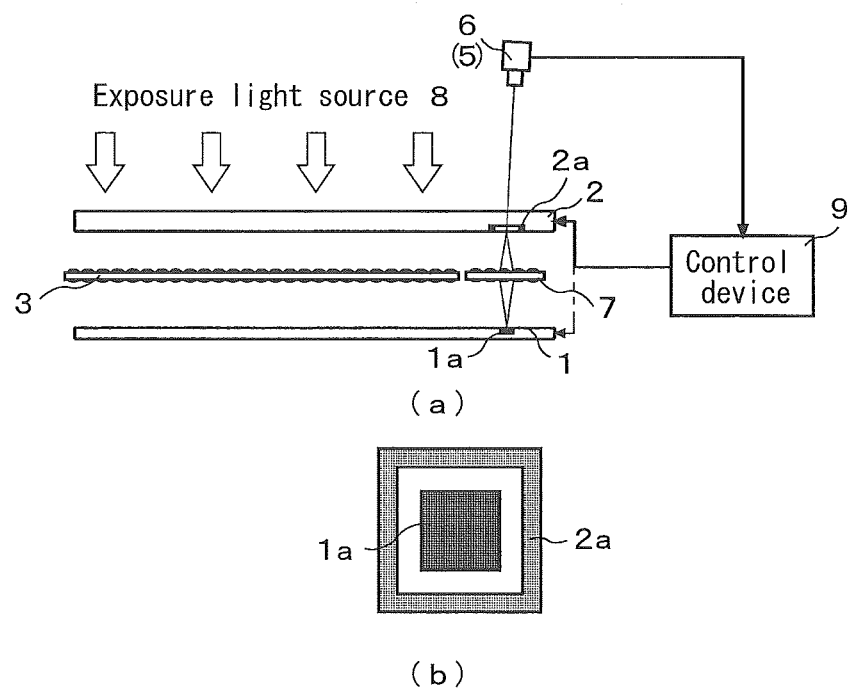
FIG. 8 (a) and (b) are views showing a case in which the optical path of the alignment light is inclined in the exposure device shown in FIG. 7.

In the present embodiment as well, an erect unmagnified image of the substrate alignment mark 1a can be formed on the mask 2, and the focus difference on the camera 6 side caused by the 5 to 15 mm gap G between the substrate 1 and the mask 2 can be brought to zero, whereby alignment of the substrate 1 and the mask can be performed with high accuracy in comparable manner to the first embodiment. Moreover, as shown in FIG. 8, even in a case in which the optical axis of the alignment light is inclined, the relative positions of the alignment marks are unchanged, and very high alignment accuracy can be obtained. Moreover, by constituting the microlens array from the separate elements of the microlens array 3 for exposure and the microlens array 7 for alignment, the need to move the microlens array 3 in selective fashion during exposure and during alignment is obviated in like fashion to the second embodiment.

Figure 9:
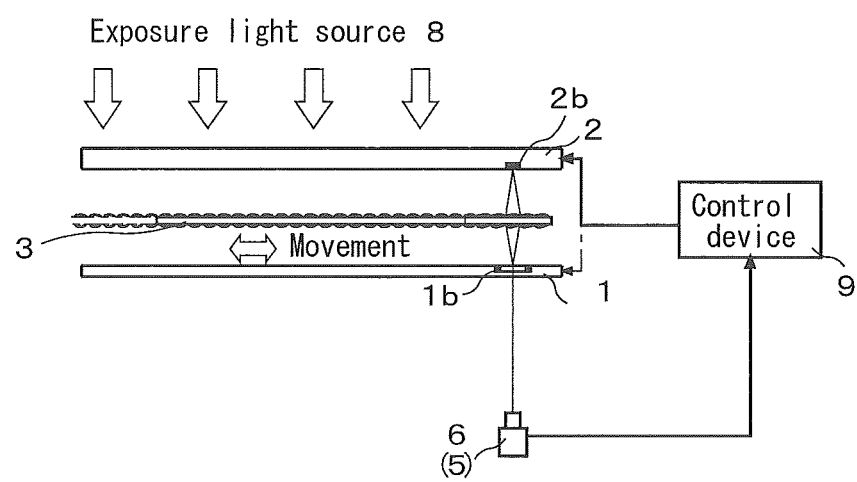
FIG. 9 (a) is a view showing an alignment device for an exposure device according to a fourth embodiment of the present invention, and (b) is a view showing relative positional relationships between detected alignment marks.
Figure 9:
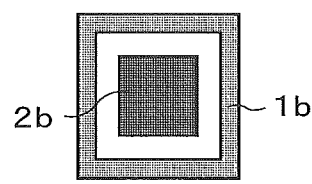

Next, an alignment device for an exposure device according to a fourth embodiment of the present invention will be described. FIG. 9 (a) is a view showing the alignment device for an exposure device according to the third embodiment of the present invention, and FIG. 9 (b) is a view showing relative positional relationships between detected alignment marks. As shown in FIG. 9, in the present embodiment, the alignment light source 5 and the camera 6 are arranged below the substrate 1, and illumination with alignment light takes place from below the substrate. A substrate alignment mark 1b is frame-shaped, and a mask alignment mark 2b is rectangular. In the present embodiment, the substrate 1 targeted for exposure is composed of light-transmissive material, for example, a polyimide (PI) and tin-doped indium oxide (ITO) or the like, and the alignment light is transmitted through the substrate 1 to illuminate the mask 2. That is, in the present embodiment, in cases in which the substrate 1 is composed of light-transmissive material, the direction of illumination by alignment light and the shapes of the alignment marks 1b, 2b of the substrate 1 and the mask 2 differ from those in the first embodiment; however, the constitution is otherwise comparable to the first embodiment.

In the present embodiment as well, during relative position alignment of the substrate 1 and the mask 2, the microlens array 3 for exposure use is moved between the mask alignment mark 2b and the substrate alignment mark 1b, using the single microlens array 3 through movement in selective fashion during exposure and during alignment. During alignment, reflected light reflected by the mask alignment mark 2b is transmitted through the microlens array 3, and an erect unmagnified image of the mask alignment mark 2b is imaged onto the substrate 1 by the microlens array 3. Therefore, despite the presence of the 5 to 15 mm gap G between the substrate 1 and the mask 2, the focus difference on the camera side 6 caused by the gap G is zero. Therefore, in the present embodiment, as in the aforedescribed first to third embodiments, alignment of the substrate 1 and the mask 2 can be performed with high accuracy using the alignment mark 1b of the substrate 1 and the alignment mark 2b of the mask 2 as guides. For example, in cases in which the position of the mask alignment mark 2b detected by the camera 6 has diverged from the center of the frame-shaped substrate alignment mark 1b, the mask 2 is moved by the control device 9 to position the mask alignment mark 2b at the center of the substrate alignment mark 1b and perform alignment of the substrate 1 and the mask 2. Moreover, even in a case in which the optical axis of the alignment light has been inclined in order to image an erect unmagnified image of the mask alignment mark 2b onto the substrate 1, the relative positions of the substrate and mask alignment marks 1 and 2b detected by the camera 6 are unchanged from those in the case of perpendicular illumination of the substrate 1 and the mask 2 by the alignment light, and very high alignment accuracy can be obtained.

In the present embodiment, as in the second embodiment, the microlens array 3 is furnished with size sufficient to encompass the exposure position illuminated by exposure light and the alignment position illuminated by alignment light, thereby obviating the need to move the microlens array 3 in selective fashion during exposure and during alignment.

Figure 10:
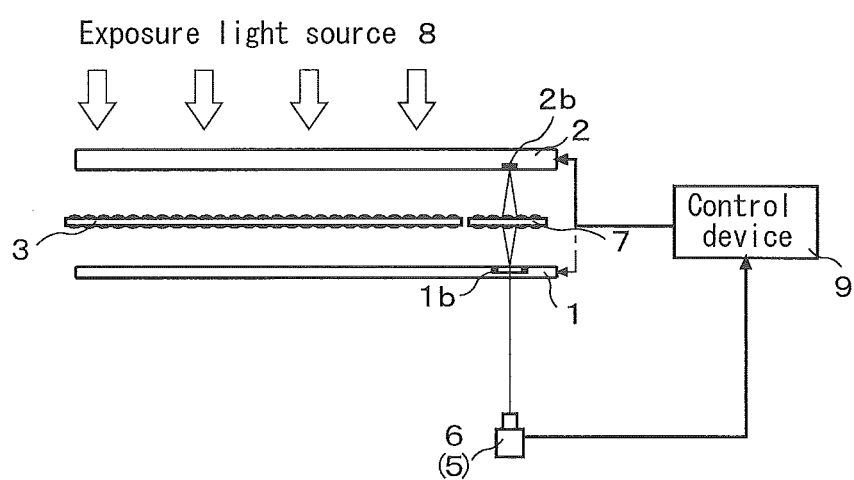
FIG. 10 (a) is a view showing the alignment device for an exposure device according to a fifth embodiment of the present invention, and (b) is a view showing relative positional relationships between detected alignment marks.
Figure 10:
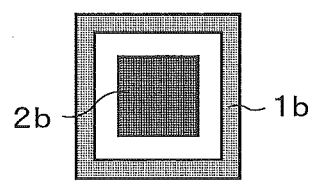

Next, an alignment device for an exposure device according to a fifth embodiment of the present invention will be described. FIG. 10 (a) is a view showing the alignment device for an exposure device according to the fifth embodiment of the present invention, and FIG. 10 (*b*) is a view showing relative positional relationships between detected alignment marks. As shown in FIG. 10, the present embodiment, like the third embodiment, is furnished with two microlens arrays, i.e., a (first) microlens array 3 for exposure use, and a second microlens array 7 for alignment use. The optical characteristics of the second microlens array 7 are identical to those of the (first) microlens array 3. In so doing, the need to move the microlens array 3 in selective fashion during exposure and during alignment is obviated in like fashion to the second embodiment.

Figure 11:
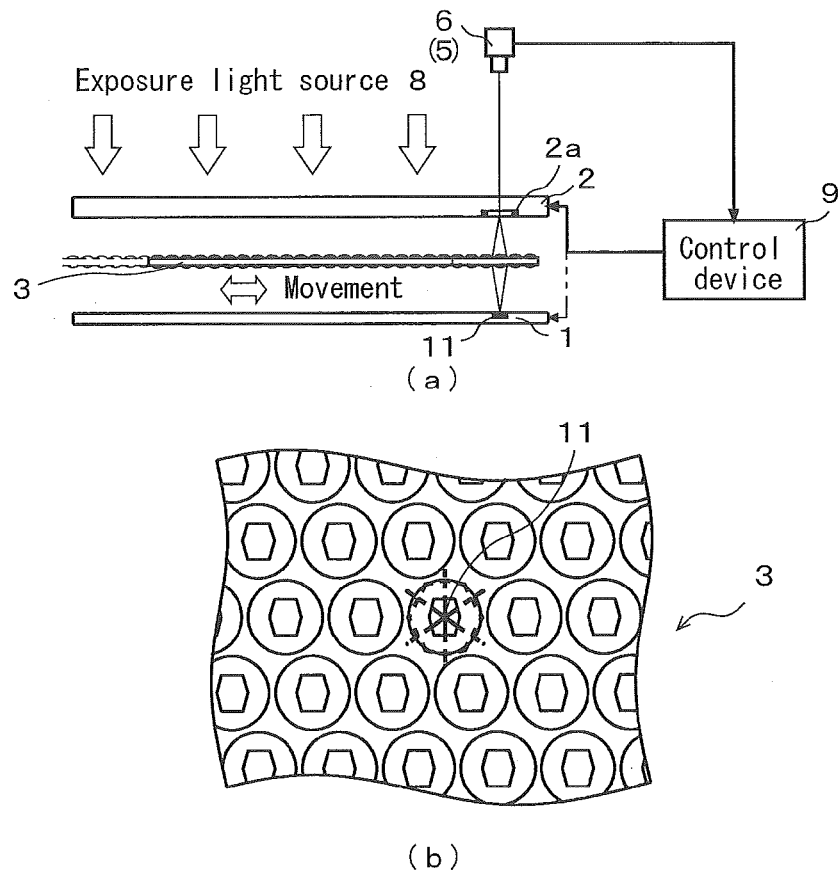
FIG. 11 (a) is a view showing an alignment method for a substrate and a mask according to a sixth embodiment of the present invention, and (b) is a view showing a substrate alignment mark formed on the mask, together with a microlens array.
Figure 12:
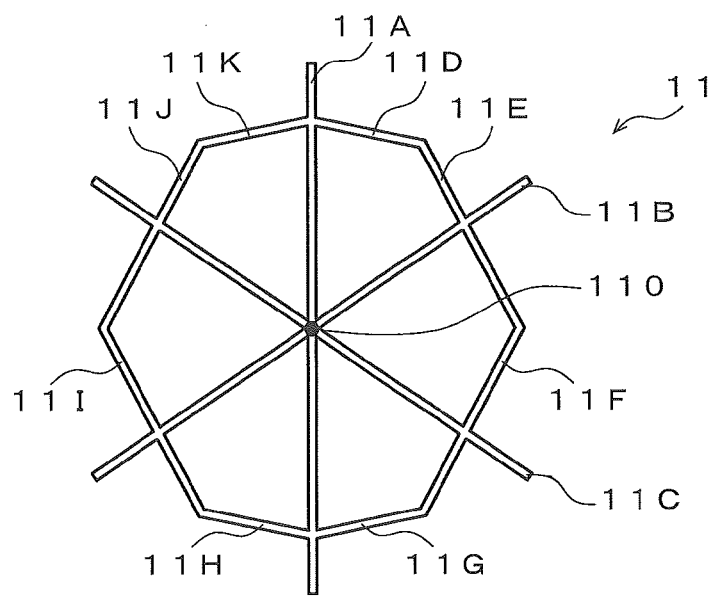
FIG. 12 is a view showing a substrate alignment mark according to the sixth embodiment of the present invention.

Next, a sixth embodiment of the present invention will be described. FIG. 11 (*a*) is a view showing an alignment method for a substrate and a mask according to the sixth embodiment of the present invention, FIG. 11 (*b*) is a view showing a substrate alignment mark formed on the mask, together with a microlens array, FIG. 12 is a view showing an substrate alignment mark according to the sixth embodiment of the present invention, FIG. 13 (*a*) is a view showing a substrate alignment mark, together with a microlens array, and FIG. 13 (*b*) is an enlarged view thereof. As shown in FIG. 11 (*a*), in the present embodiment, the exposure device, like an exposure device using a conventional microlens array, is furnished with a microlens array 3 situated between a substrate 1 and a mask 2, and exposure light emitted by an exposure light source 8 is transmitted through a pattern formed in the mask 2, and imaged onto the substrate as an erect unmagnified image of the pattern by the microlens array 3. In this exposure device, the mask 2 is furnished with a mask alignment mark 2*a*, for example, one of frame shape, while the substrate 1 targeted for exposure is furnished with a substrate alignment mark 11 of predetermined shape. During alignment, the microlens array 3 is moved, for example, between the substrate alignment mark 11 and the mask alignment mark 2*a*, using the single microlens array 3 by moving it in selective fashion during exposure and during alignment. During alignment, light reflected from the substrate alignment mark 11 is imaged as an erect unmagnified image onto the mask by the microlens array 3.

In the present embodiment, above the mask 2 there is furnished an alignment light source 5 for illuminating, from above the mask 2, the substrate alignment mark 11 furnished to the substrate 1 and the mask alignment mark 2*a* furnished to the mask 2, with light for alignment. During alignment, an erect unmagnified image reflected from the substrate alignment mark 11 is formed on the mask 2 by the microlens array 3. A camera 6 is furnished above the mask 2, and reflected light reflected from the mask alignment mark 2*a*, as well as the erect unmagnified image of the substrate alignment mark 11 formed on the mask 2, are detected by the camera 6. When the substrate 1 and the mask 2 are in a predetermined relationship during alignment, the alignment center of the mask alignment mark 2*a* detected by the camera 6 and the alignment center of the substrate alignment mark 11 are registered.

As shown in FIG. 11 (*a*), the camera 6 is connected to a control device 9 that controls the position of the mask 2, and depending on the result detected by the camera 6, in cases in which alignment of the substrate 1 and the mask 2 is necessary, the control device 9 moves the mask 2. For example, in cases in which the position of the alignment center of the substrate alignment mark 11 detected by the camera 6 diverges from the alignment center of the alignment mark 2*a*, the control device 9 moves the mask 2 so as to register the alignment center of the substrate alignment mark 11 with the alignment center of the mask alignment mark 2*a*. As shown by the double-dash broken line in FIG. 11 (*a*), the control device 9 is connected, for example, to a stage or the like supporting the substrate 1, and performs alignment of the substrate 1 and the mask 2 by moving the substrate 1. Alternatively, the control device 9 may perform alignment of the substrate 1 and the mask 2 by moving both the substrate 1 and the mask 2.

As shown in FIG. 11 (*a*), in the present embodiment, the camera 6 is, for example, a coaxial episcopic microscope of unifocal type housing an alignment light source 5. The alignment light source 5 is constituted to emit alignment light coaxially to the optical axis of the light detected by the camera 6. Laser light, or lamp light transmitted through an interference filter, can be used as the alignment light source 5. For the lamp light source, it is preferable to use, for example, a halogen lamp, due to the reduced cost. The alignment light source 5 may be furnished as a separate element from the camera 6. The light emitted by the alignment light source 5 illuminates the mask 2 and the substrate 1 via an optical system including, for example, a reflecting mirror, a beam splitter, and the like.

Figure 27:
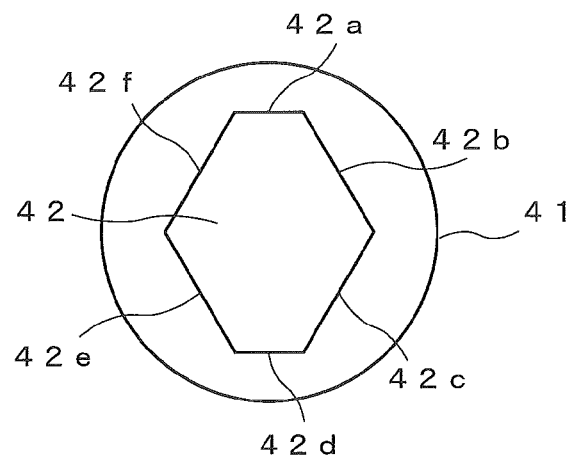
FIG. 27 is a view showing the stop shape of a microlens.

In the microlens array 3, each of the microlenses is furnished with a polygon field stop 42 and an aperture stop 41. As shown in FIG. 27, in the present embodiment, each polygon field stop is constituted as a hexagonal field stop 42 formed as an aperture of hexagonal shape inside the aperture stop 41 of the microlens. Therefore, as shown in FIG. 11 (*b*), of the reflected light from the substrate 1, only reflected light from a substrate area corresponding to an area bounded by the hexagonal shape is transmitted by the hexagonal field stop 42, and an erect unmagnified image of this area is formed on the mask 2.

Figure 25:
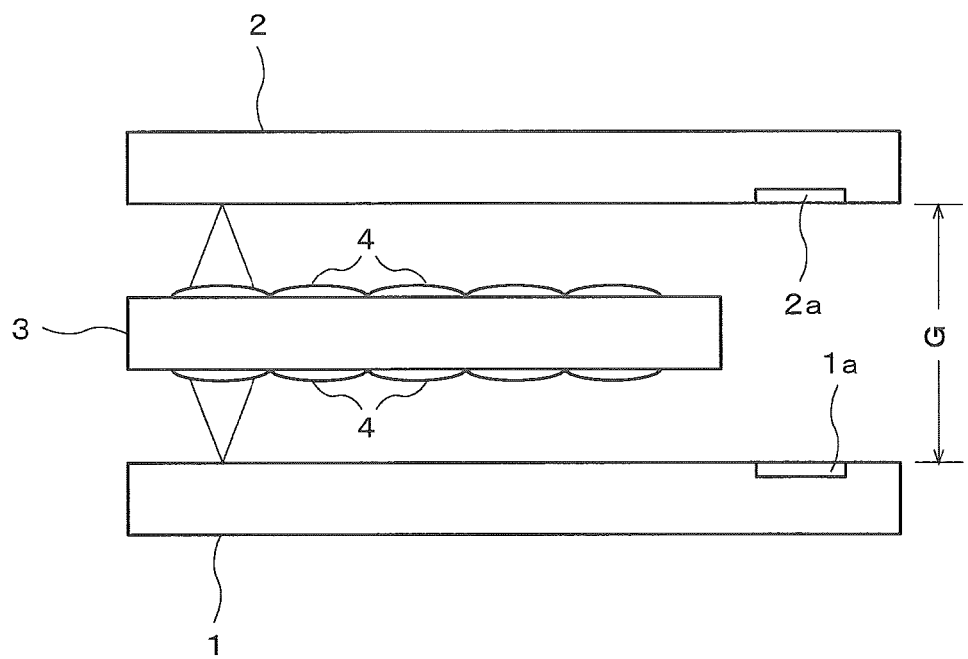
FIG. 25 is a view showing an exposure device in which a microlens array is used.

FIG. 25 is a schematic view showing an exposure device in which a microlens array is used. Above the substrate 1 targeted for exposure, the mask 2 in which has been formed a pattern for exposure onto the substrate 1 is arranged at an appropriate gap relative to the substrate 1. Next, the microlens array 3 of microlenses 4 arrayed two-dimensionally is arranged between the substrate 1 and the mask 2, and the mask 2 is irradiated with exposure light from above the mask 2, the exposure light transmitted through the mask 2 being projected onto the substrate 1 by the microlens array 3, whereupon the pattern formed in the mask 2 is transferred as an erect unmagnified image by the microlens array 3, onto a resist or the like on the substrate surface.

Figure 26:
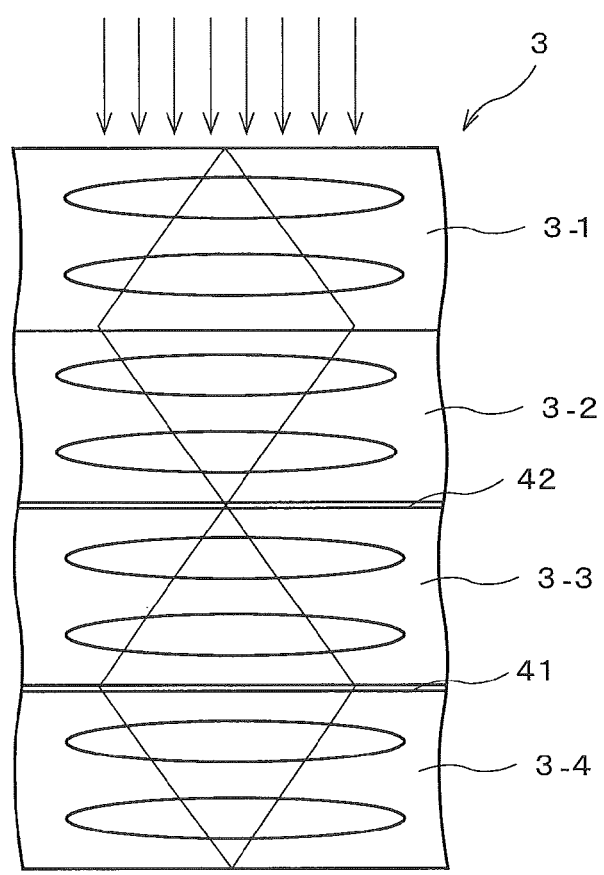
FIG. 26 is a cross-sectional view showing an arrangement of unit microlens arrays.

FIG. 26 is a view showing a microlens array 3 for use in an exposure device. As shown in FIG. 26, the microlens array 2 is constituted, for example, by four arrays of eight lenses each, and has a structure in which four unit microlens arrays 3-1, 3-2, 3-3, 3-4 are stacked. Each of the unit microlens arrays 3-1 to 3-4 is constituted by an optical system depicted by two convex lenses at front and back. In so doing, the exposure light is first converged between the unit microlens array 3-2 and the unit microlens array 3-3, and then imaged onto the substrate below the unit microlens array 3-4. Specifically, an inverted unmagnified image of the mask 2 is imaged between the unit microlens array 3-2 and the unit microlens array 3-3, while an erected image of the mask 2 is imaged onto the substrate. Polygon field stops (for example, the hexagonal field stops 42) are arranged between the unit microlens array 3-2 and the unit microlens array 3-3, while circular aperture stops 41 are arranged between the unit microlens array 3-3 and the unit microlens array 3-4. The aperture stops 41 limit the numerical aperture (NA) of each of the microlenses, while the hexagonal field stops 42 constrict the field of view to a hexagonal shape in proximity to the imaging position. The hexagonal field stops 42 and the aperture stops 41 are furnished for every one of the microlenses, and for each of the microlenses, the light transmission area of the microlens is made circular by the aperture stop 41, while the exposure area of the exposure light on the substrate is made hexagonal. As shown in FIG. 27 for example, the hexagonal field stop 42 may be formed as an aperture of hexagonal shape inside the aperture stop 41 of the microlens. Therefore, once scanning is halted, due to these hexagonal field stops 42, exposure light transmitted through the microlens array 3 only irradiates areas on the substrate 1 bounded by the hexagonal shapes shown in FIG. 13.

During scan exposure using a microlens array, normally, the mask 2 and the substrate 1 are stationary, while the microlens array 3, the exposure light source, and the optical system are moved in unison in a direction perpendicular to the plane of the page to scan the exposure light over the substrate 1. In this case, the top surface of the substrate 1 and the bottom surface of the mask 2 are respectively furnished with alignment marks 1a and 2a, and it is necessary to align the relative positions of the substrate 1 and the mask 2 using these alignment marks 1a and 2a as guides.

Figure 14:
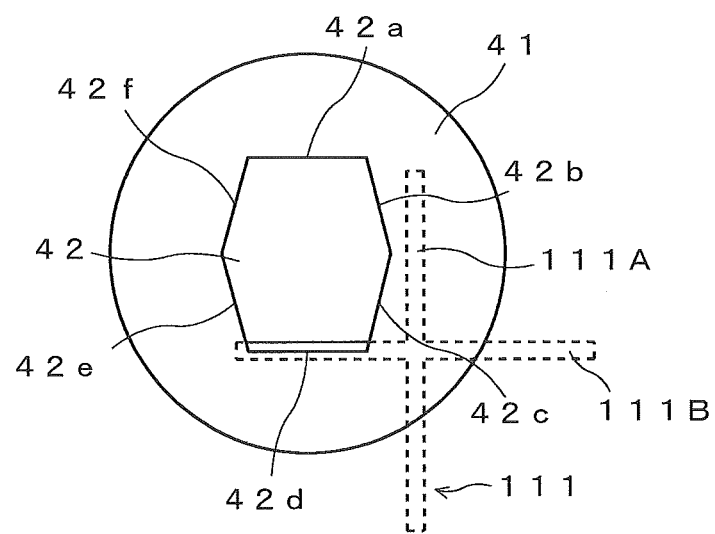
FIG. 14 is a view showing an alignment mark having linear components that are parallel to sides of a hexagonal field stop.

Because the microlens array 3 is furnished with polygon field stops in this manner, in a case in which the alignment mark furnished to the substrate 1 is a cross-shaped substrate alignment mark 111 constituted by two linear mark segments 111A, 111B as shown in FIG. 14 for example, cases may arise in which the alignment mark 111 is positioned between microlenses of the microlens array 3, so that the alignment mark cannot be detected. Even in cases in which part of the substrate alignment mark 111 can be detected through the aperture of the hexagonal field stop 42 as shown in FIG. 14, in cases in which the detected mark segment 111B is parallel to a side constituting the aperture of the hexagonal field stop 42, it may be difficult to discern whether the image detected by the camera 6 is an image of a side 42d constituting the aperture of the hexagonal field stop 42, or an image of the mark segment 111B of the substrate alignment mark 111.

As shown in FIG. 12, the substrate alignment mark 11 of the present embodiment is constituted by a plurality of linear mark segments 11A to 11K extending in directions inclined with respect to all sides 42a to 42f of the aperture of the hexagonal field stop 42. Therefore, during detection by the camera 6, the direction of extension of the detected mark will be inclined with respect to the sides of the hexagonal field stop 42. In so doing, mark segments detected by the camera 6 can be clearly discerned with respect to the aperture of the hexagonal field stop 42. Specifically, the substrate alignment mark 11 of the present embodiment is composed of first mark segments 11A to 11C extending radially from an alignment center 110, and a plurality of second mark segments 11D to 11K extending on sides of a polygon shape (for example, an octagon shape) centered on the alignment center 110. The first mark segments and the second mark segments intersect at a plurality of locations. Specifically, the first mark segment 11B intersects the two second mark segments 11E, 11I; the first mark segment 11C intersects the two second mark segments 11F, 11J; and the first mark segment 11A intersects the two second mark segments 11D and 11K at a single point, and the two second mark segments 11G and 11H at a single point. The positions of the polygon field stops 42 and the mark segments are selected such that a plurality of the mark segments will be present inside some of the polygon field stops.

Figure 13:
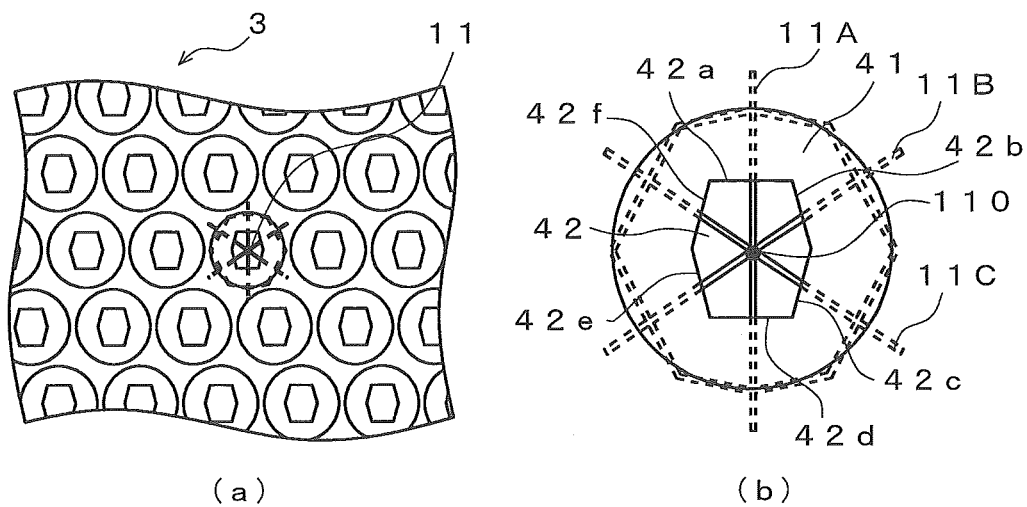
FIG. 13 (a) is a view showing a substrate alignment mark, together with a microlens array, and (b) is an enlarged view thereof.
Figure 15:
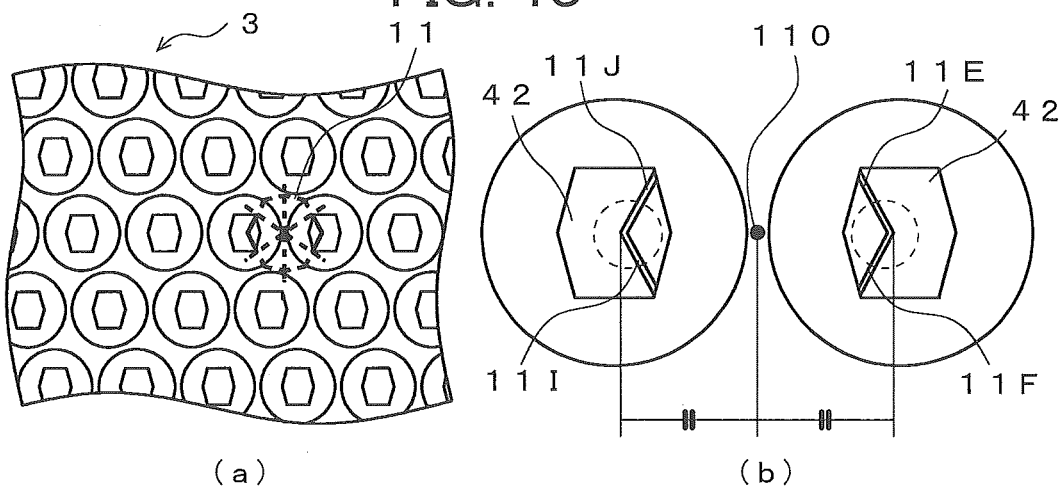
FIG. 15 (a) is a view showing a substrate alignment mark, together with a microlens array, and (b) is an enlarged view thereof.
Figure 16:
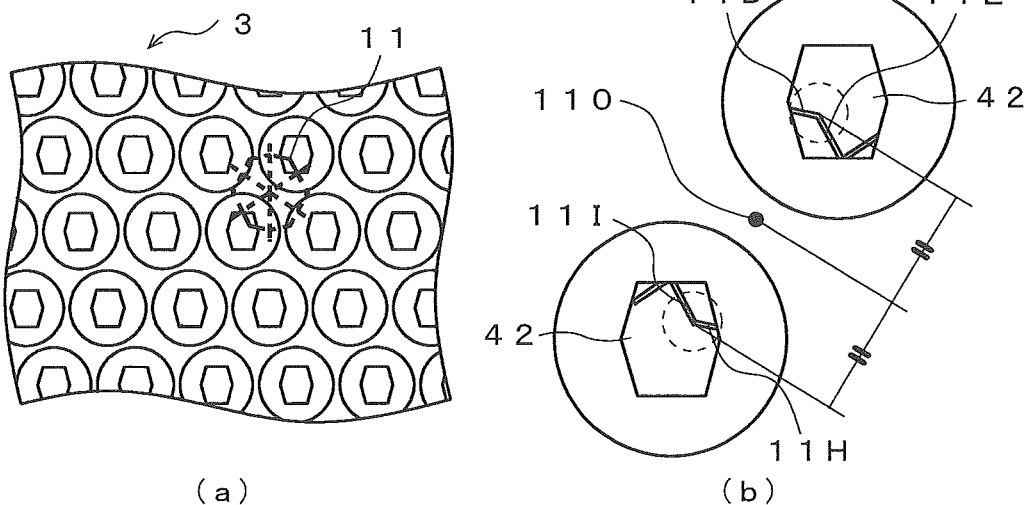
FIG. 16 (a) is a view showing a substrate alignment mark, together with a microlens array, and (b) is an enlarged view thereof.
Figure 17:
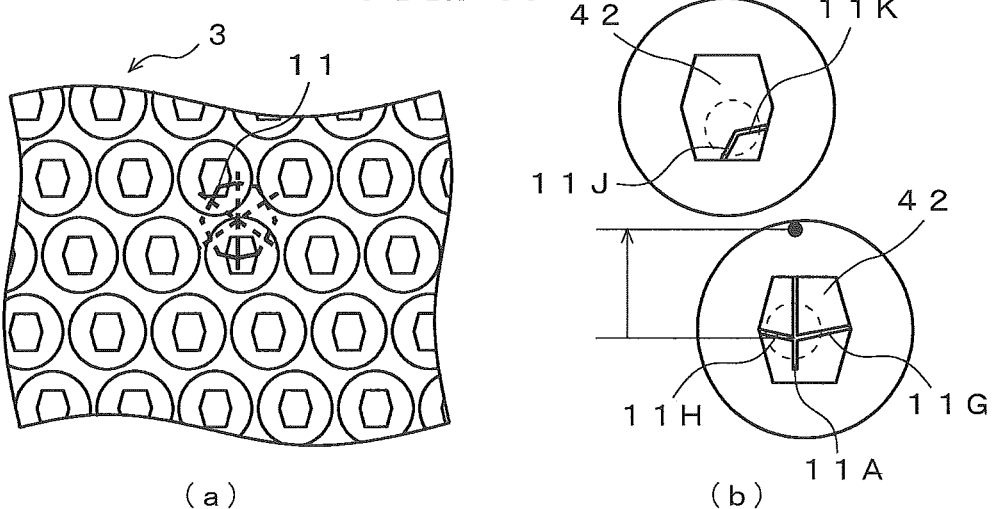
FIG. 17 (a) is a view showing a substrate alignment mark, together with a microlens array, and (b) is an enlarged view thereof.

As shown in FIG. 13, in a case in which the alignment center 110 where the first mark segments 11A to 11C intersect is successfully detected through the aperture of the hexagonal field stop 42, alignment of the substrate 1 and the mask can be performed using this alignment center 110 as a guide. However, as shown in FIGS. 15 to 17, in cases in which the relative position of the substrate alignment mark 11 with respect to the microlens array 13 has diverged from the condition shown in FIG. 13, the alignment center 110 of the substrate alignment mark 11 will be positioned between the two-dimensionally arranged microlenses in an area through which light is not transmitted, and therefore the alignment center 110 cannot be detected through the apertures of the hexagonal field stops 42.

In the present invention, the substrate alignment mark 11 is furnished with a shape such that, for example, mutually intersecting portions of mark segments are detected through the apertures of the hexagonal field stops 42, and the alignment center 110 of the substrate alignment mark 11 is detected from points of mutual intersection of these mark segments 11A to 11K. For example, as shown in FIG. 15, in a case in which the relative position of the substrate alignment mark 11 with respect to the microlens array 3 has diverged in a sideways direction from the condition shown in FIG. 13, mutually intersecting portions of the second mark segments 11E, 11F and mutually intersecting portions of the second mark segments 11I, 11J are detected through the apertures of the hexagonal field stops 42. In this case, as shown in FIG. 15 (b), the center point between the detected intersecting portions will be detected as the alignment center 110 of the substrate alignment mark. Moreover, as shown in FIG. 16, in cases in which the relative position of the substrate alignment mark 11 with respect to the microlens array 3 has diverged in a diagonal direction from the condition shown in FIG. 13, the mutually intersecting portions of the second mark segments 11D, 11E and the mutually intersecting portions of the second mark segments 11H, 11I are detected through the apertures of the hexagonal field stops 42. In this case, as shown in FIG. 16 (b), the center point between the detected intersecting portions will be detected as the alignment center 110 of the substrate alignment mark. Furthermore, as shown in FIG. 17, in cases in which the relative position of the substrate alignment mark 11 with respect to the microlens array 3 has diverged in a vertical direction from the condition shown in FIG. 13, mutually intersecting portions of the second mark segments 11J, 11K and intersecting portions of the first mark 11A and the second mark segments 11G, 11H are detected through the apertures of the hexagonal field stops 42. In this case, as shown in FIG. 17 (b), using the intersecting portions of the first mark segment 11A and the second mark segments 11G, 11H as a reference, a position a predetermined distance away therefrom will be detected as the alignment center 110 of the substrate alignment mark. In the example shown in FIG. 17, the mutually intersecting portions of the second mark segments 11J, 11K are detected as well, and if necessary, may be utilized for detection of the alignment center 110 of the substrate alignment mark.

Next, the operation of the alignment device according to the present embodiment constituted in the above manner will be described. During exposure, the microlens array 3 is positioned below a pattern area furnished to the mask 2. Firstly, the microlens array 3 is moved towards the rightward direction in FIG. 11, moving between the substrate alignment mark 11 and the mask alignment mark 2a. Next, alignment light is emitted from the halogen lamp or other alignment light source 5 housed in the camera 6. This alignment light first illuminates the mask 2, via an optical system including, for example, a reflecting mirror, a beam splitter, and the like. The alignment light illuminating the mask 2 is reflected by the mask alignment mark 2a. Meanwhile, the alignment light transmitted through the mask 2 is transmitted through the microlens array 3 which is arranged below the mask 2, and illuminates the substrate 1.

Reflected light reflected from the substrate alignment mark 11 is transmitted through the microlens array 3 and again impinges on the mask 2, imaging an erect unmagnified image of the substrate alignment mark 11 onto the mask 2. At this time, only reflected light from a substrate area corresponding to the apertures of the hexagonal field stops 42 is transmitted onto the mask 2, and an erect unmagnified image of this area is formed on the mask 2. The reflected light beams then impinge on the sensor of the camera 6, and the mask alignment mark 2a and the erect unmagnified image of the substrate alignment mark 11 formed on the mask 2 are detected thereby. Because an erect unmagnified image of the substrate alignment mark 11 formed on the mask 2 is detected by the camera 6 in this manner, despite the fact that a gap G of 5 to 15 mm is actually present between the substrate 1 and the mask 2, the focus difference on the camera 6 side caused by this gap G is zero.

In the present embodiment, the substrate alignment mark 11 is constituted by the plurality of plurality of linear mark segments 11A to 11K extending in directions inclined with respect to all sides 42a to 42f of the apertures of the hexagonal field stops 42. Therefore, during detection by the camera 6, the detected mark segments can be clearly discerned from the direction of extension thereof, with respect to the apertures of the hexagonal field stops 42.

As shown in FIG. 13, during detection of the substrate alignment mark 11 by the camera 6, in cases in which the alignment center 110 of the substrate alignment mark 11 in which the first mark segments 11A to 11C mutually intersect has been successfully detected through aperture of the hexagonal field stop 42, alignment of the substrate 1 and the mask 2 can be performed using the alignment center 110 of the substrate alignment mark as a guide. For example, in a case in which the position of the alignment center of the substrate alignment mark 11 detected by the camera 6 diverges from the center of the frame-shaped mask alignment mark 2a, the mask 2 is moved by the control device 9 so as to position the alignment center 110 of the substrate alignment mark at the center of the mask alignment mark 2a, to perform alignment of the substrate 1 and the mask 2. In the present embodiment, because the focus difference on the camera 6 side caused by the gap G between the substrate 1 and the mask 2 is zero, alignment of the substrate 1 and the mask 2 can be performed highly accurately using the alignment marks 11, 2a of the substrate 1 and the mask 2 as guides.

However, in cases in which, as shown in FIGS. 15 to 17, the relative position of the substrate alignment mark 11 with respect to the microlens array 3 has diverged from the condition shown in FIG. 13, the alignment center 110 of the substrate alignment mark will be positioned between the two-dimensionally arranged microlenses in an area through which light is not transmitted, and therefore the alignment center 110 cannot be detected through the apertures of the hexagonal field stops 42. In the present embodiment, however, the substrate alignment mark 11 is composed of the first mark segments 11A to 11C extending radially from the alignment center 110, and the plurality of second mark segments 11D to 11K extending on sides of a polygon shape (for example, an octagon shape) centered on the alignment center 110, the positions of the polygon field stops 42 and the mark segments being selected such that a plurality of mark segments will be present inside some of the polygon field stops. Specifically, the substrate alignment mark 11 is furnished with a shape such that mutually intersecting portions of mark segments may be detected through the apertures of the hexagonal field stops 42, and the alignment center 110 of the substrate alignment mark 11 is detected from points of mutual intersection of these mark segments 11A to 11K. For example, as shown in FIG. 15, mutually intersecting portions of the second mark segments 11E, 11F and mutually intersecting portions of the second mark segments 11I, 11J are detected by the camera 6 through the apertures of the hexagonal field stops 42, and as shown in FIG. 15 (b), the center point between the detected intersecting portions is detected as the alignment center 110 of the substrate alignment mark. Moreover, as shown in FIG. 16, mutually intersecting portions of the second mark segments 11D, 11E and mutually intersecting portions of the second mark segments 11H, 11I are detected through the apertures of the hexagonal field stops 42, and as shown in FIG. 16 (b), the center point between the detected intersecting portions is detected as the alignment center 110 of the substrate alignment mark. As shown in FIG. 17, in a case in which intersecting portions of the first mark 11A and the second mark segments 11G, 11H have been detected through the apertures of the hexagonal field stops 42, as shown in FIG. 17 (b), using the intersecting portions of the first mark segment 11A and the second mark segments 11G, 11H as a reference, a position a predetermined distance away therefrom is detected as the alignment center 110 of the substrate alignment mark. Therefore, alignment of the substrate 1 and the mask 2 will be performed to position the alignment center 110 of the substrate alignment mark at the center of the frame-shaped mask alignment mark 2a.

Thus, in the present embodiment, even in cases in which the alignment center 110 of the substrate alignment mark 11 is positioned between the two-dimensionally arranged microlenses in an area through which light is not transmitted, the alignment center 110 can be detected from intersection points of the linear mark segments 11A to 11K of the substrate alignment mark 11, and from the detected alignment mark, high accuracy of positioning can be maintained.

Figure 18:
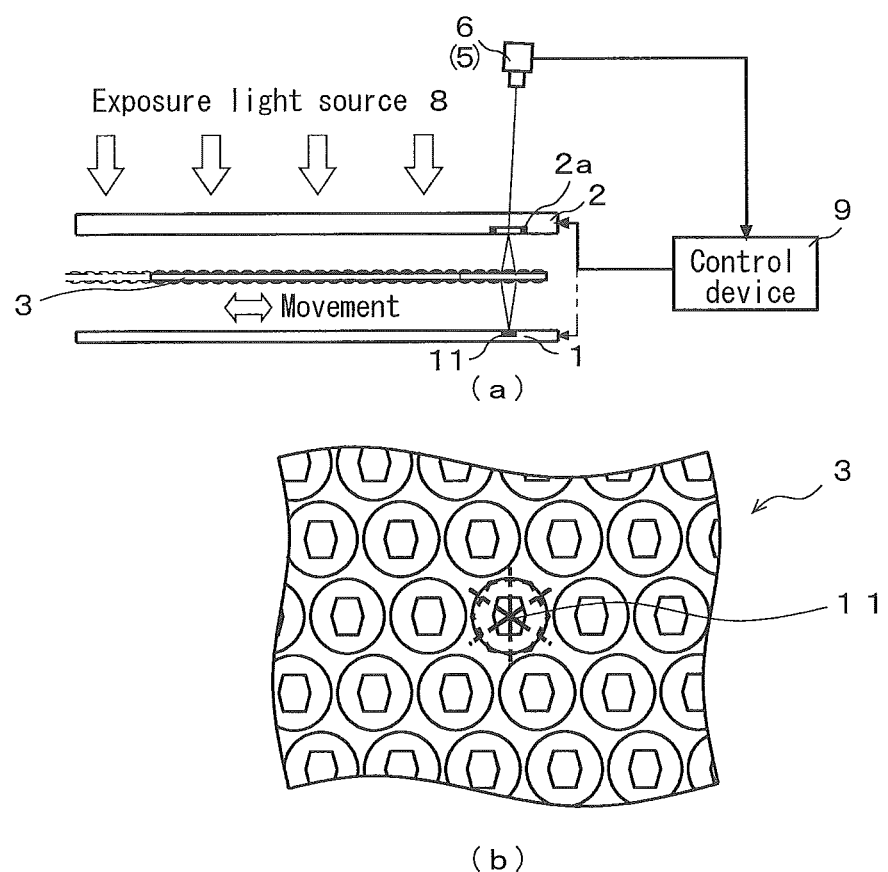
FIG. 18 (a) and (b) are views showing a case in which the optical path of the alignment light is inclined in the exposure device shown in FIG. 11.

Using the microlens array 3 like that of the present embodiment, an erect unmagnified image of the substrate alignment mark 11 is formed on the mask 2, and in so doing the focus difference on the camera side caused by the gap G between the substrate and the mask is brought to zero, whereby even in a case in which the optical axis of the alignment light has been inclined as shown in FIG. 18 (a), relative positioning between the alignment marks 11, 2a are unchanged from the case shown in FIG. 11, and very high alignment accuracy can be obtained.

Figure 19:
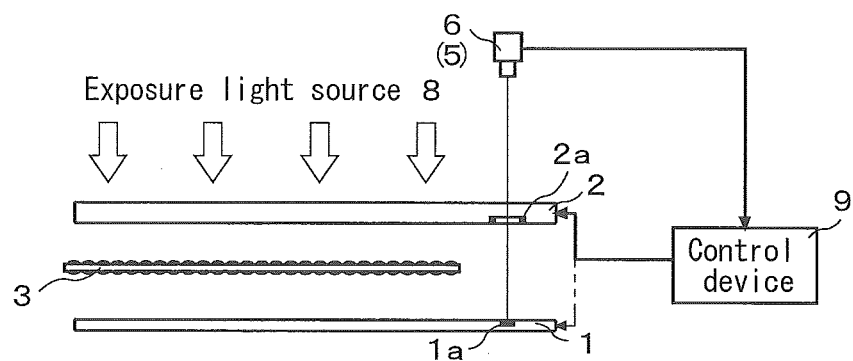
FIG. 19 (a) to (d) are views showing an alignment device for an exposure device according to a comparative example of the present invention.
Figure 19:
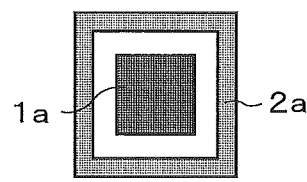
Figure 19:
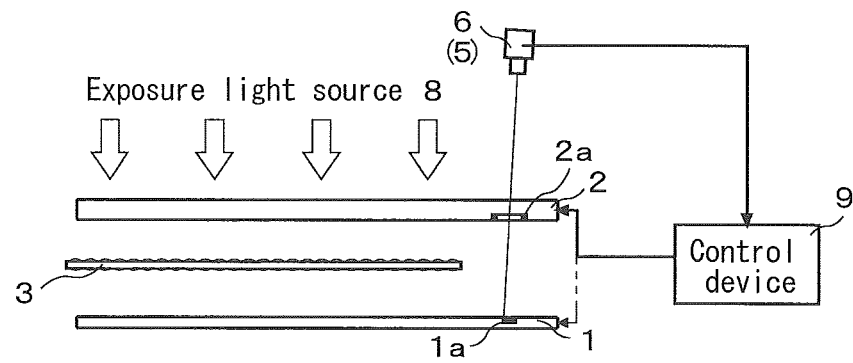
Figure 19:
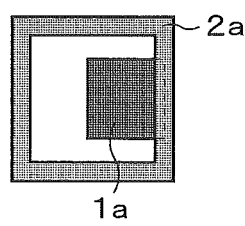

Specifically, in cases in which the microlens array 3 is not being used for relative position alignment of the substrate 1 and the mask 2, when the substrate 1 and the mask 2 are illuminated with alignment light on the perpendicular as shown in FIG. 19 (a), predetermined alignment accuracy may be obtained as shown in FIG. 19 (b). However, when the optical axis of the alignment light is inclined as shown in FIG. 19 (c), the optical path of the reflected light changes, and due to the gap G between the substrate 1 and the mask 2, even in cases in which the substrate 1 and the mask 2 are in a predetermined positional relationship, the positions of the alignment marks 1a, 2a detected on the camera 6 side diverge as shown in FIG. 19 (d). Thus, despite the fact that the positions of the alignment mark 2a and the alignment mark 1a are actually registered, and the substrate 1 and the mask 2 are in alignment, in the camera 6 they are mistakenly observed to be out of alignment. Stated another way, despite the fact that mask 2 and the substrate 1 are out of alignment, in the camera 6, the alignment mark 1a is observed to be at the center of the alignment mark 2a, leading to the mistaken observation that the substrate 1 and the mask 2 are in alignment.

In contrast to this, according to the present embodiment, even in a case in which the optical axis of the alignment light has been inclined as shown by FIG. 18 in order to image an erect unmagnified image of the alignment mark 11 onto the mask 2 by the microlens array 3, the relative positions of the substrate and mask alignment marks 11 and 2a as detected by the camera 6 are unchanged as shown by FIG. 2 (a), and very high alignment accuracy can be obtained.

After alignment of the substrate 1 and the mask 2, the microlens array 3 is moved towards the leftward direction in FIG. 11, and moved to below the pattern area furnished to the mask 2. Thereafter, exposure light is emitted, and scan exposure by the microlens array 3 is initiated. According to the present embodiment, due to the high alignment accuracy obtained in the aforedescribed manner, a very high level of exposure accuracy can be maintained during scan exposure.

Whereas the present embodiment describes a case in which the alignment light source 5 is housed inside the camera 6, and is constituted to emit alignment light coaxially with respect to the optical axis of light detected by the camera 6, in the present invention, the optical axis of light emitted by the alignment light source 5 need not be coaxial to the optical axis of the reflected light detected by the camera, provided that the configuration is one in which an erect unmagnified image of either the substrate 1 or the mask 2 can be imaged onto the other, and detected by the camera 6.

Figure 20:
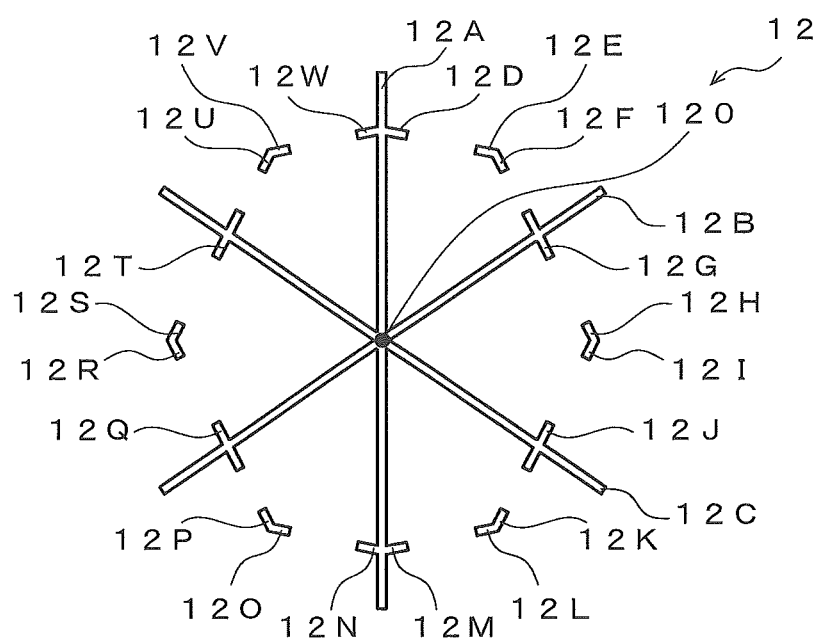
FIG. 20 is a view showing a modification of the substrate alignment mark according to the sixth embodiment.

Next, a substrate alignment mark according to a modification of the present embodiment will be described. FIG. 20 is a view showing a modification of the substrate alignment mark according to the sixth embodiment. As shown in FIG. 20, in this substrate alignment mark 12, the second mark segments 11D to 11K of the sixth embodiment have been split in two, forming gaps at their centers. Specifically, the substrate alignment mark 12 according to the present embodiment is composed of three first mark segments 12A to 12C extending radially from an alignment center 120, and a plurality of second mark segments 12D to 12W extending on sides of a polygon shape centered on the alignment center 120. The first mark segments and the second mark segments intersect at a plurality of locations. Specifically, the first mark segment 12B intersects the two second mark segments 12G, 12Q; the first mark segment 12C intersects the two second mark segments 12J, 12T, and the first mark segment 12A intersects the two second mark segments 12D and 12W at a single point; and the two second mark segments 12M and 12N at a single point. However, in the present embodiment, the number of mutual intersection points of the mark segments constituting the substrate alignment mark is the same as in the sixth embodiment. Therefore, comparable effects may be obtained using an alignment method comparable to that of the sixth embodiment.

Figure 21:
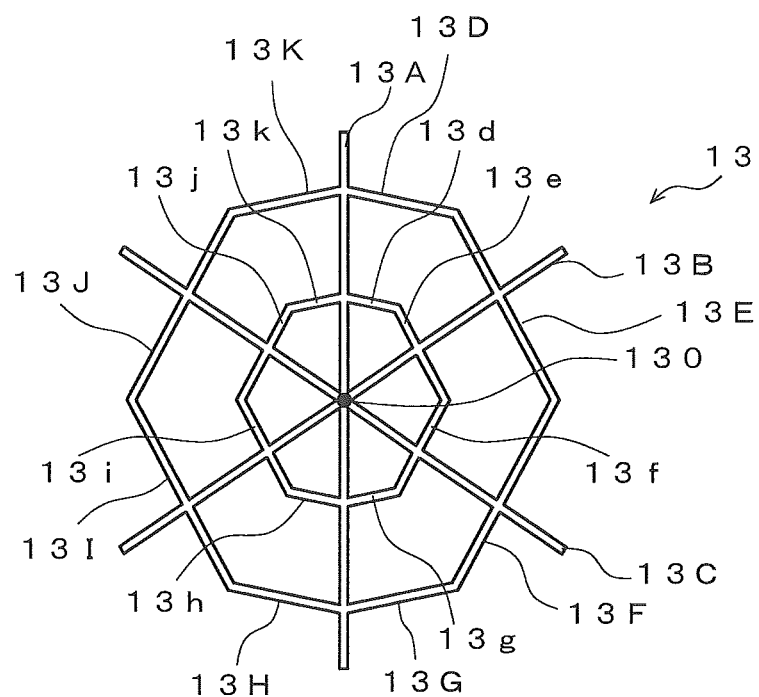
FIG. 21 (a) is a view showing a substrate alignment mark according to a seventh embodiment of the present invention, and (b) is a view showing the substrate alignment mark, together with a microlens array.
Figure 21:
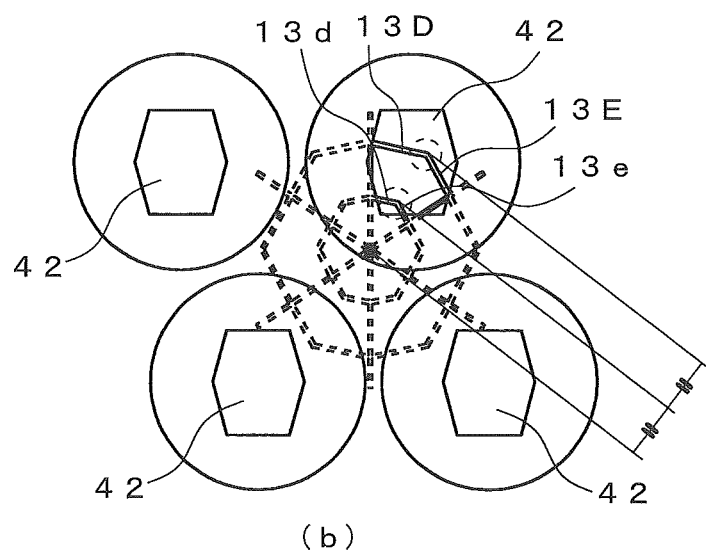

Next, a substrate alignment mark according to a seventh embodiment of the present invention will be described. FIG. 21 (a) is a view showing the substrate alignment mark according to the seventh embodiment of the present invention, and FIG. 21 (b) is a view showing the substrate alignment mark, together with a microlens array. As shown in FIG. 21 (a), the substrate alignment mark 13 of the present embodiment, while similar to the substrate alignment mark 11 of the sixth embodiment, has linear mark segments 13d to 13k arranged contiguously on sides of a hexagonal shape for which an alignment center 130 is the common center, and lying towards this alignment center side. The other mark segments 13A to 13C are comparable to the mark segments 11A to 11C of the sixth embodiment, and the mark segments 13D to 13K are likewise comparable to the mark segments 11D to 11K of the sixth embodiment.

In this manner, by furnishing the mark segments 13d to 13k centered on the alignment center 130 as the common center, in addition to the cases described previously in the sixth embodiment, there arises an additional case in which, as shown in FIG. 21 (b), both the intersection point of the mark segments 13d, 13e towards the alignment center 130 side and the intersection point of the outside mark segments 13D, 13E are formed on the mask 2 through the aperture of one of the hexagonal field stops 42. In this case, a position a predetermined distance away on a line extended between the intersection points will be detected as the alignment center 130 of the substrate alignment mark 13. Alignment of the substrate 1 and the mask 2 can then be performed using the position of this detected alignment center 130 as a guide.

Figure 22:
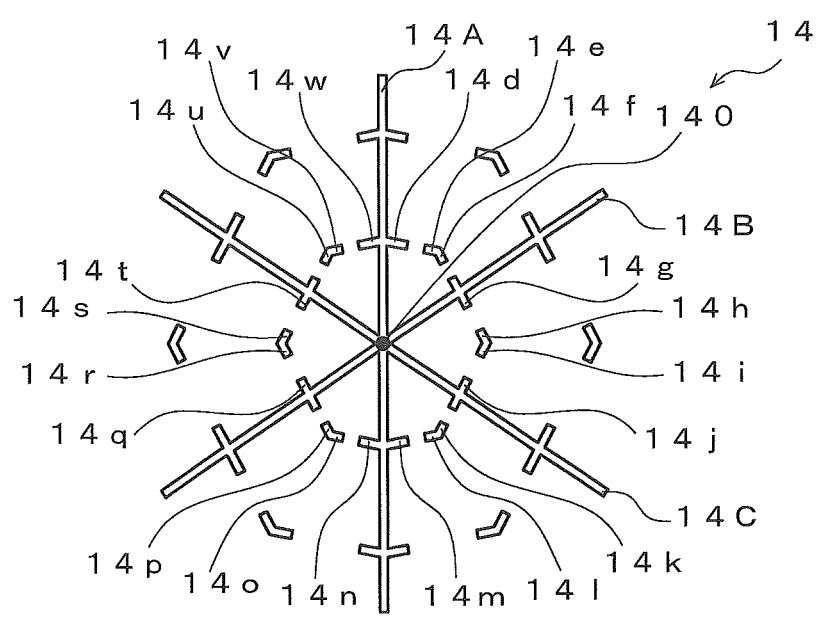
FIG. 22 is a view showing a modification of the substrate alignment mark according to the seventh embodiment.

In the present embodiment, effects comparable to those of the sixth embodiment are obtained. Moreover, in the present embodiment, modifications to the substrate alignment mark, comparable to that of the sixth embodiment are possible. For example, in the substrate alignment mark 13 of the seventh embodiment, the mark segments 13D to 13K and 13d to 13k formed encircling the alignment center 130 may be split in two, forming gaps at their centers, and a substrate alignment mark 14 like that shown in FIG. 22 can be used.

As shown in FIG. 21 (b), this alignment mark 13 is composed of a design of line-symmetric polygonal shape, having polygonal portions arranged to not extend parallel to any marginal edge constituting the aperture of a polygon field stop, and radial line portions composed of at least six radial lines crossing through the polygonal portions from the center of the polygonal portions, the polygonal portions and the radial line portions overall being larger in size than any of the lenses, but smaller than the overall size of four adjacent lenses. Consequently, as mentioned previously, the line segments of the alignment mark 13 can be distinguished from the marginal edges of the polygon field stop 42, and furthermore, some of the line segments will be present inside the polygon field stop 42, whereby the center of the alignment mark 13 can be detected with good accuracy.

Figure 23:
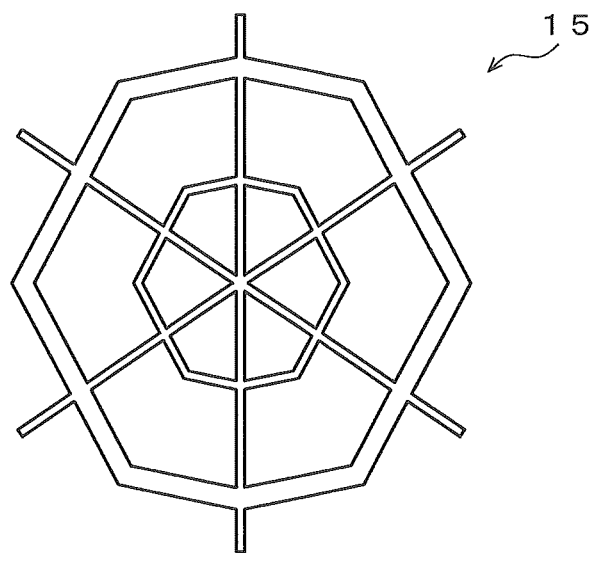
FIG. 23 (a) and (b) are views showing a substrate alignment mark according to an eighth embodiment of the present invention.
Figure 23:
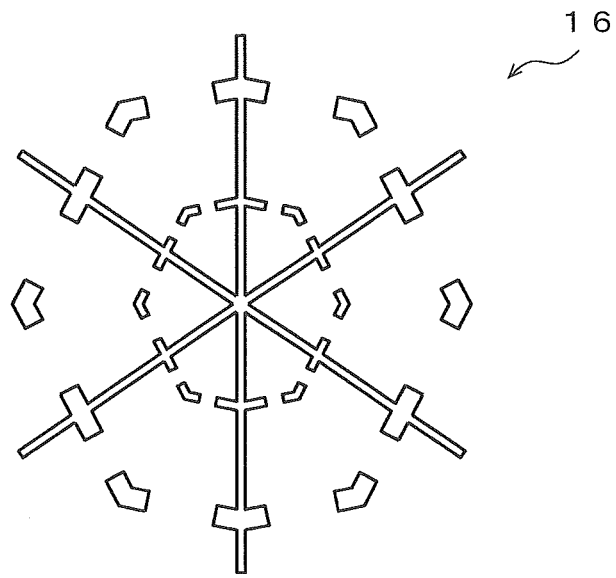

Next, a substrate alignment mark according to an eighth embodiment of the present invention will be described. FIG. 23 (a), (b) are views showing the substrate alignment mark according to the eighth embodiment of the present invention. As shown in FIG. 23 (a), the substrate alignment mark 15 according to the present embodiment is similar to the substrate alignment mark 13 of the seventh embodiment, except that the mark segments lying towards an alignment center 130 side and the mark segments lying towards the outside differ in line thickness. Therefore, in the present embodiment, the linear mark segments lying towards the alignment center 130 side and the mark segments lying towards the outside are readily discerned. The configuration and effects of the present embodiment are otherwise the same as those of the sixth and seventh embodiments.

Moreover, in the present embodiment, modifications to the substrate alignment mark 15, comparable to those of the sixth and seventh embodiments, are possible. For example, in the substrate alignment mark 15 of the eighth embodiment, the linear marks formed encircling the alignment center may be split in two, forming gaps at their centers, and a substrate alignment mark 16 like that shown in FIG. 23 (b) can be used.

Whereas the sixth to eighth embodiments describe cases of imaging an erect unmagnified image of the substrate alignment mark onto the mask, in cases in which an erect unmagnified image of the mask alignment mark is being imaged onto the substrate as well, where the mask alignment mark is constituted by a first group of mark segments extending radially from the alignment center, and a second group of mark segments extending on sides of a polygon shape centered on the alignment center, selecting the positions of the polygon field stops and the mark segments such that a plurality of the mark segments will be present inside some of the polygon field stops, effects comparable to those of the sixth to eighth embodiments are obtained.

Figure 24:
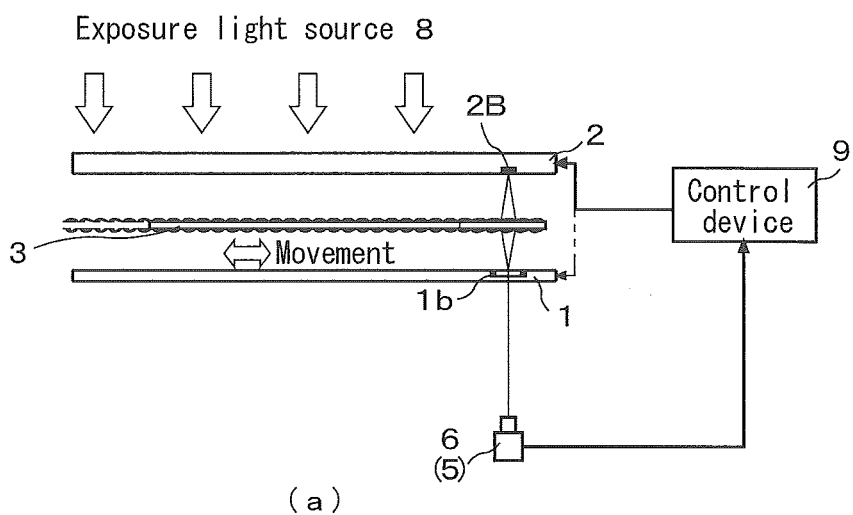
FIG. 24 (a) is a view showing an alignment method for a substrate and a mask according to a ninth embodiment of the present invention, and (b) is a view showing a mask alignment mark.
Figure 24:
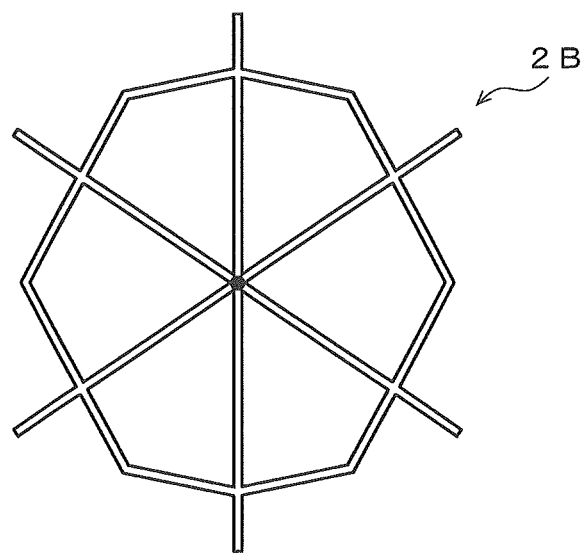

Next, an exposure device according to a ninth embodiment of the present invention will be described. FIG. 24 (*a*) is a view showing an alignment method for a substrate and a mask according to the ninth embodiment of the present invention, and (*b*) is a view showing a mask alignment mark. As shown in FIG. 24 (*a*), in the present embodiment, the alignment light source 5 and the camera 6 are arranged below the substrate 1, and illumination with light for alignment use takes place from below the substrate. Moreover, the substrate alignment mark 1*b* has a frame shape, and as shown in FIG. 24 (*b*), a mask alignment mark 2B is furnished with a shape comparable to the substrate alignment mark 11 in the sixth embodiment. In the present embodiment, the substrate 1 targeted for exposure is composed of light-transmissive material, for example, a polyimide (PI) and tin-doped indium oxide (ITO) or the like, and the alignment light is transmitted through the substrate 1 to illuminate the mask 2. That is, in the present embodiment, in cases in which the substrate 1 is composed of light-transmissive material, the direction of illumination by alignment light and the shapes of the alignment marks 1*b*, 2B of the substrate 1 and the mask 2 differ from those in the sixth embodiment; however, the constitution is otherwise comparable to the sixth embodiment. Even in the case of illumination with alignment light from below the substrate as in the present embodiment, highly accurate alignment can be achieved through an alignment method comparable to that of the sixth embodiment.

Figure 28:
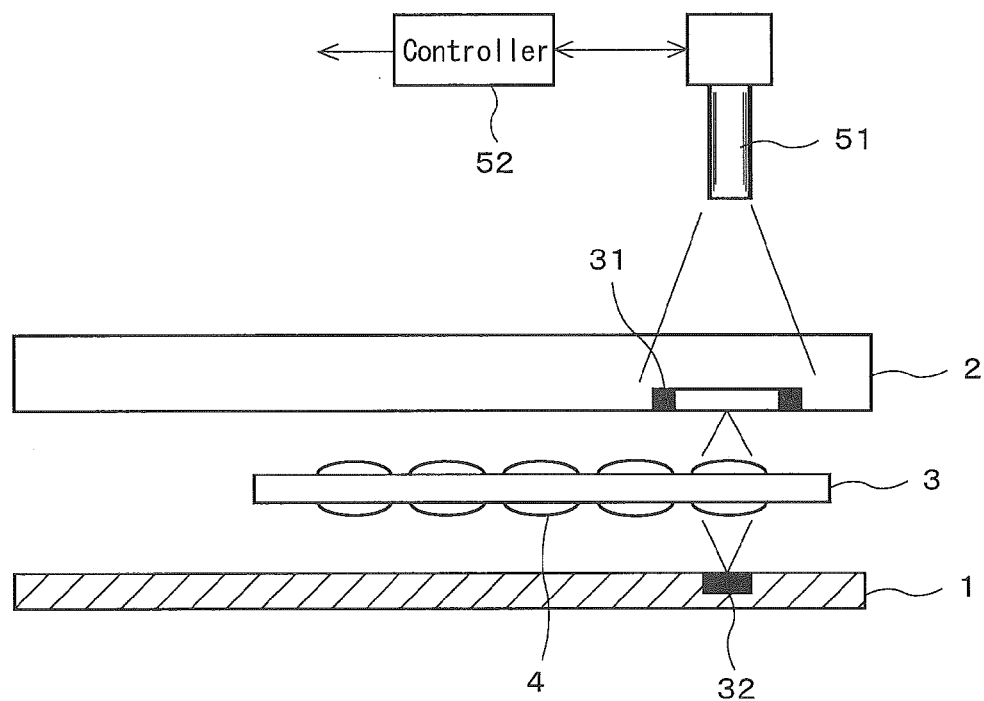
FIG. 28 is a cross-sectional view showing a substrate, a mask, and a microlens array in an exposure device according to a tenth embodiment of the present invention.
Figure 29:
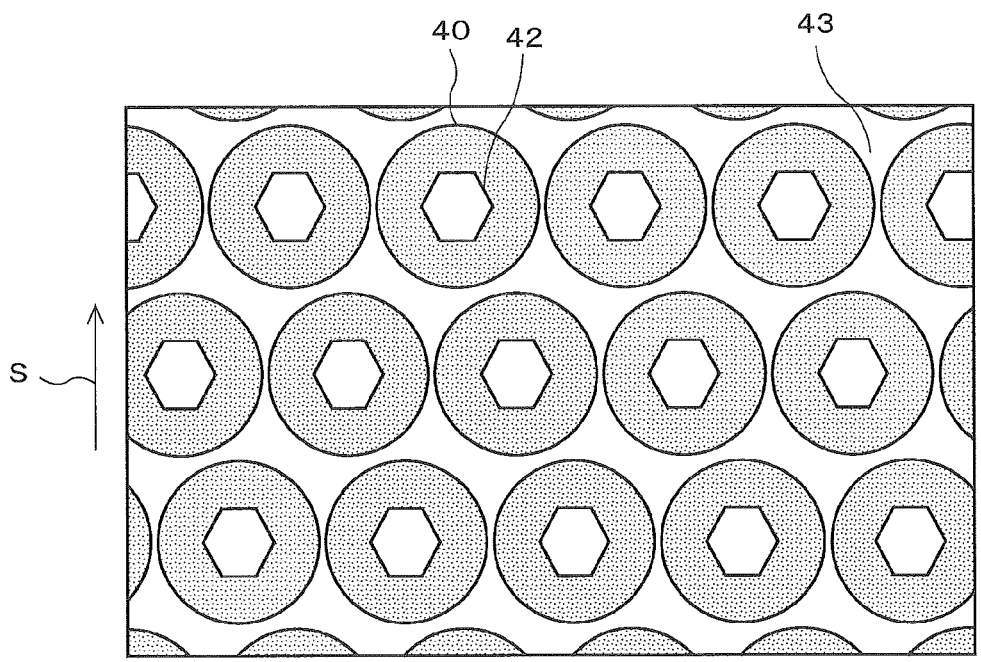
FIG. 29 is a view showing the arrangement of the microlenses of the microlens array.
Figure 30:
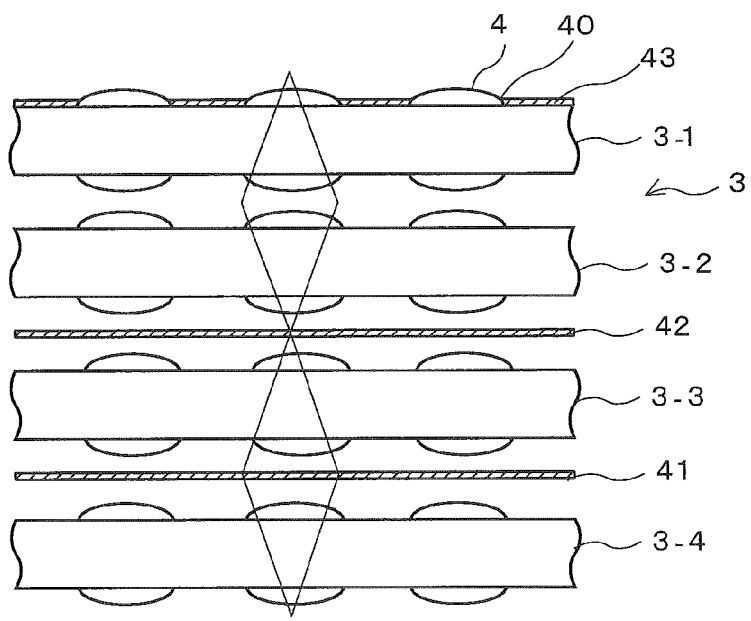
FIG. 30 is a schematic cross-sectional view showing the structure of the microlens array.
Figure 31:
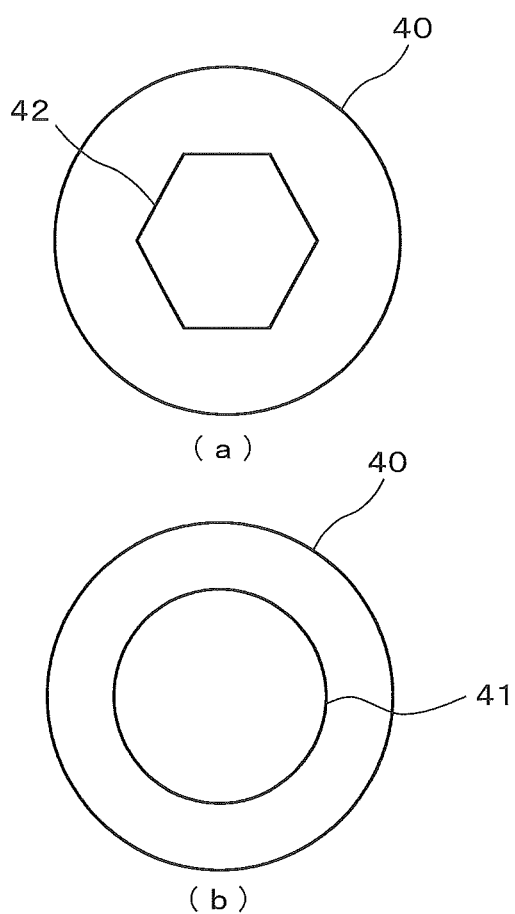
FIG. 31 (a) shows a hexagonal field stop 12, and (b) is a schematic plan view showing a circular stop.
Figure 32:
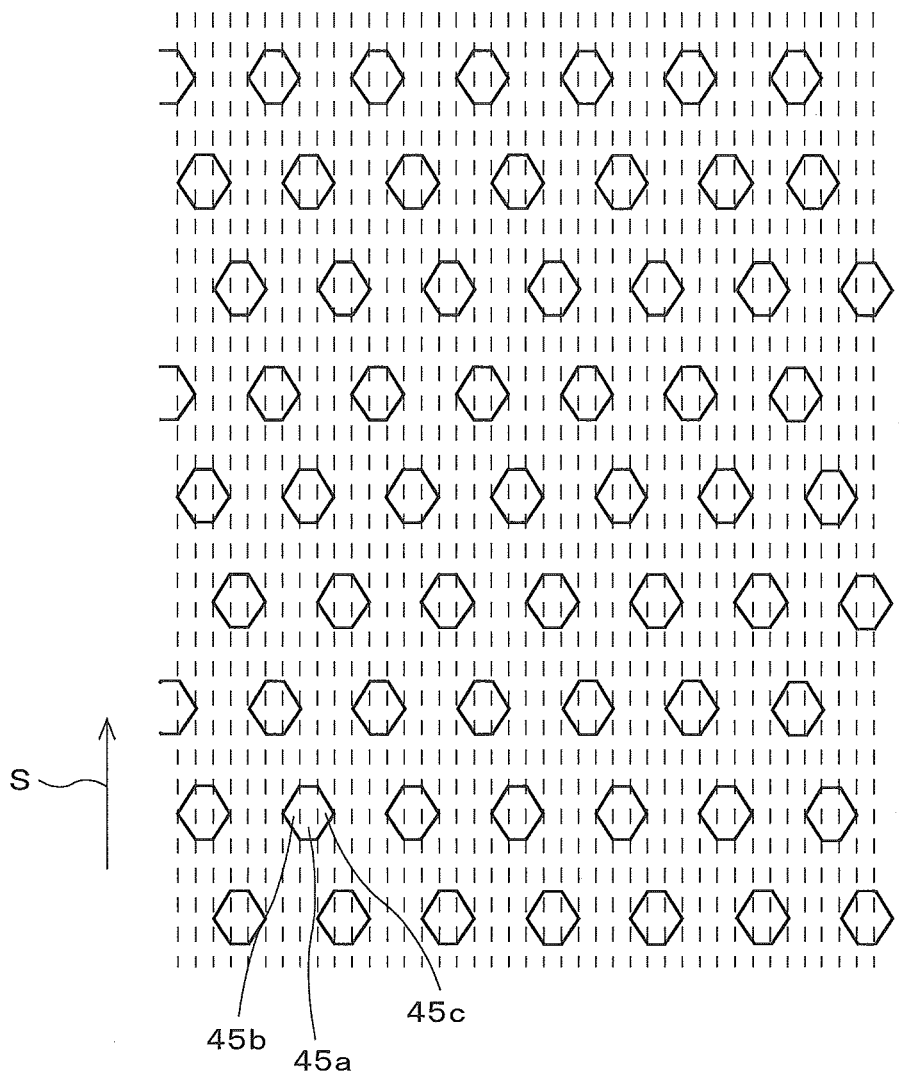
FIG. 32 is a view describing the function of hexagonal field stops.

Next, a tenth embodiment of the present invention will be described. FIG. 28 is a view showing an exposure device according to an embodiment of the present invention; FIG. 29 is a view showing the arrangement of microlenses in a microlens array; FIG. 30 is a view showing the structure of the microlens array, FIG. 31 is a view showing aperture shapes; and FIG. 32 is a view showing the basic principle of exposure using a microlens array. The microlens array 3 is arranged between the substrate 1 and a mask 2 in which there is formed an exposure pattern for transfer to the substrate 1. Due to the microlens array 3 being situated therebetween, the gap between the substrate 1 and the mask 2 is 5 to 15 mm, as mentioned previously. As will be discussed below, the microlens array 3 images onto the substrate 1 an erect unmagnified image of the pattern furnished to the mask 2.

A substrate alignment mark 32 is arranged on the top surface of the substrate 1 which is the surface facing towards the mask 2, and a mask alignment mark 31 is arranged on the bottom surface of the mask 2 which is the surface facing towards the substrate 1.

As shown in FIGS. 29 and 30, the microlens array 3 is constituted by a multitude of microlenses 4 arranged two-dimensionally, with hexagonal field stops 42 of hexagonal shape arranged in the microlenses 4, so that the substrate 1 is illuminated only with light transmitted through the hexagonal field stops 42. As shown in FIG. 30, the microlens array 3 is constituted, for example, by four unit microlens arrays 3-1, 3-2, 3-3, 3-4, each of the unit microlens arrays 3-1, 3-2, 3-3, 3-4 having a structure in which microlenses 4 are formed by convex lenses on the top and bottom surfaces of a glass plate. On the top surface of the uppermost unit microlens array 3-1, a light-blocking film 43, such as a Cr film or the like, is formed in an area outside the microlenses 4, and microlenses 2*a* are arranged as convex lenses inside circular apertures furnished to the light-blocking film 43. In order to prevent stray light, this light-blocking film 43 reflects exposure light that illuminates areas outside the microlenses 4, preventing the exposure light from impinging on areas outside the microlenses 4.

The hexagonal field stops 42 are additionally arranged between the unit microlens array 3-2 and the unit microlens array 3-3, and circular aperture stops 41 for determining the numerical aperture are arranged between the unit microlens array 3-3 and the unit microlens array 3-4. As shown in FIG. 31 (*a*), the hexagonal field stops 42 are furnished as apertures of hexagonal shape inside the lens-shaped apertures 40 of the light-blocking film 43. As shown in FIG. 31 (*b*), the circular aperture stops 41 are furnished as apertures of circular shape inside the apertures 40. As shown in FIG. 30, by the four unit microlens arrays, exposure light transmitted through the mask 2 is first initially imaged as an inverted unmagnified image between the unit microlens array 3-2 and the unit microlens array 3-3, and after reaching maximum outspread between the unit microlens array 3-3 and the unit microlens array 3-4, is emitted from the unit microlens array 3-4, and imaged as an erect unmagnified image onto the substrate 1. At this time, because the hexagonal field stops 42 are arranged at positions where the inverted unmagnified image is imaged, the mask pattern is transferred to the substrate 1 while being shaped hexagonally. The circular stops 41 shape the shape of maximum outspread portion of the exposure light to circular shape, and determine the numerical aperture (NA) of the microlenses.

In the exposure device of the present embodiment, scan exposure of the pattern of the mask 2 onto, for example, a resist film on the surface of the substrate 1 is accomplished by keeping the substrate 1 and the mask 2 stationary, while moving the microlens array 3 and the light source (not illustrated) in unison in synchronous fashion in the scanning direction S; or scan exposure of the pattern of the mask 2 onto the resist film on the surface of the substrate 1 is accomplished by keeping the microlens array 3 and the light source stationary, while moving the substrate 1 and the mask 2 in unison in synchronous fashion in the scanning direction S.

At this time, on the surface of the substrate 1, the exposure light momentarily illuminates hexagonal portions of the hexagonal field stops 42 as shown in FIG. 32. As shown in FIGS. 32 and 29, the microlenses are arranged lining up in a direction perpendicular to the scanning direction S, and with regard to microlens rows lined up in a direction perpendicular to the scanning direction S, microlens rows that are situated adjacently in the scanning direction are arranged to diverge somewhat in a direction perpendicular to the scanning direction S. Specifically, the hexagonal field stops 42 of the microlenses are hexagonal, and with respect to a direction perpendicular to the scanning direction S, are constituted by a triangular section 45*b* at the left side, an intermediate rectangular section 45*a*, and a triangular section 45*c* at the right side. A plurality of microlens rows are arranged in the scanning direction S in such a way that there is overlap, in the scanning direction S, of the triangular sections 45*b* at the left side in one microlens row and the triangular sections 45*c* at the right side in microlens rows situated adjacently in the scanning direction S. Therefore, the microlenses 4 line up in single straight lines in relation to the direction perpendicular to the scanning direction S, but are arranged to diverge somewhat in relation to the scanning direction S. These microlens rows are arranged in relation to the scanning direction S in such a way that three rows constitute a group, with the fourth microlens row being arranged at the same position as the first microlens row. That is, the positions of every first microlens row and fourth microlens row in a direction perpendicular to the scanning direction S of the microlenses 4 are identical.

When the microlens array 3 and the light source then move in relative fashion to the substrate 1 and the mask 2 in the scanning direction S, in relation to the direction perpendicular to the scanning direction S on the substrate 1, an area having been first passed through by the right-side triangular portions 45c of the hexagonal field stops of the first microlens row is subsequently passed through by the left-side triangular portions 45b of the hexagonal field stops of the second microlens row, but is not passed through by apertures of the third microlens row. On the other hand, an area having been passed through by the rectangular sections 45a of the hexagonal field stops of the first microlens row is not subsequently passed through by apertures of the second and third microlens rows. Furthermore, an area having been passed through by the left-side triangular portions 45b of the hexagonal field stops of the first microlens row is not subsequently passed through by apertures of the second microlens row, but is passed through by the right-side triangular portions 45c of the hexagonal field stops of the third microlens row. In this way, during a scan, each time that an area on the substrate 1 is passed through by three microlens rows, it is either passed through by the two triangular portions 45b, 45c of the hexagonal field stops 42, or passed through by the one rectangular portion 45a. The aperture planar dimensions of the triangular portions 45b, 45c are one-half the aperture planar dimensions of the rectangular portion 45a, and therefore each time that three microlens rows transit an area, it is exposed by a uniform quantity of light in relation to the scanning direction S. Because the microlenses in the fourth microlens row are arranged at positions identical to those in the first microlens row in relation to a direction perpendicular to the scanning direction S, identical exposure is subsequently repeated, in groups of three rows each. Consequently, the microlens array 3 will be furnished with 3n (where n is a natural number) microlens rows in relation to the scanning direction S, and through scanning of these 3n microlens rows, the substrate 1 will receive equivalent exposure to a uniform quantity of light throughout the entirety of the scanned area thereof. In so doing, through relative motion in the scanning direction by the microlens array 3 and the light source, and the substrate 1 and the mask 2, the pattern formed in the mask 2 is exposure onto the substrate 1. In this way, an erect unmagnified image of the mask pattern of the mask 2 is transferred to the substrate 1 by the microlens array 3.

In the present embodiment, as shown in FIG. 25, in the exposure step, the microlens array 3 is used for imaging of an erect unmagnified image of the mask pattern of the mask 2; and as shown in FIG. 28, in the alignment step, the microlens array 3 is additionally used for position alignment of the substrate 1 and the mask 2. Specifically, in the alignment step, the microlens array 3 is moved between the substrate alignment mark 32 and the mask alignment mark 31, while the mask alignment mark 31 and the substrate alignment mark 32 are detected from above the mask 2 by a camera 51.

This camera 51 is, for example, a coaxial episcopic microscope of unifocal type housing a light source for alignment use, and a sensor for image capture. Specifically, upon illumination with alignment light from the camera 51, the reflected alignment light is induced to impinge coaxially with respect to the optical axis of the alignment light, and this reflected light is detected. The processes of illumination with alignment light and detection of reflected light by the camera 51 are controlled by a controller 52. On the basis of the results of detection of the mask alignment mark 31 and the substrate alignment mark 32, the controller 52 controls a drive source (not illustrated) for relative position alignment of the mask 2 and the substrate 1. The alignment light source is constituted so as to emit alignment light coaxially with respect to the optical axis of the light detected by the camera 51; laser light, or lamp light transmitted through an interference filter, can be used as the alignment light source 5. For the lamp light source, it is preferable to use, for example, a halogen lamp, due to the reduced cost. The alignment light source may be furnished as a separate element from the camera 51. The light emitted by the alignment light source illuminates the mask 2 and the substrate 1 via an optical system including, for example, a reflecting mirror, a beam splitter, and the like.

Figure 33:
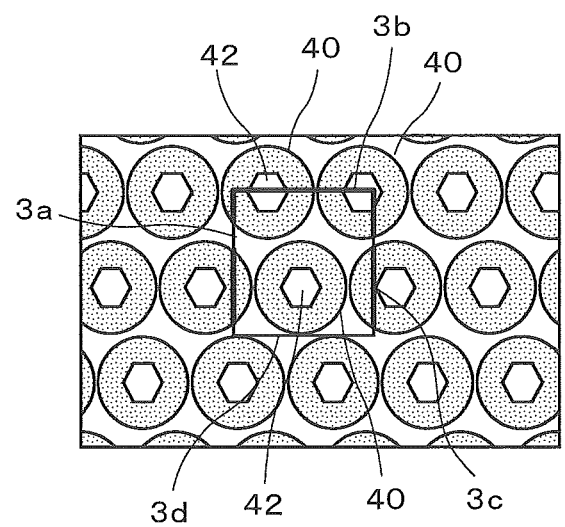
FIG. 33 is a view showing a mask alignment mark of a comparative example of the present invention, wherein (a) is a view showing the relationship of the mask alignment mark with respect to a microlens array, (b) showing the shape of a single mask alignment mark, and (c) showing a view showing an image detected by a sensor of a camera.
Figure 33:
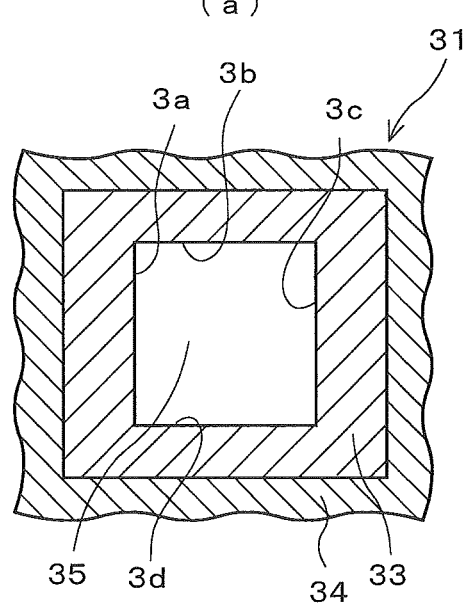
Figure 33:
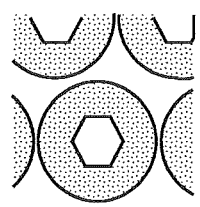

FIG. 33 (b) shows the shape of a mask alignment mark 31 of a comparative example. Specifically, this alignment mark 31 is formed by a metal film 33 that reflects light, such as a Cr film, to a pattern of square shape on a glass substrate 34. The center portion of the alignment mark 31 is a so-called cutout portion 35 in which the metal film 33 is not present, and transmits exposure light. Therefore, in this alignment mark 31, the mark shape is defined by sides 3a, 3b, 3c, 3d which are the borders of the metal film 33 and the cutout portion 35.

In a case in which the sensor of the camera 51 has detected this mask alignment mark 31, detection with regard to the microlens array 3 takes place in the manner shown in FIG. 29. Specifically, when alignment light from the camera 51 illuminates the microlens array 3, the reflected light from the light-blocking film 43 of the uppermost layer of the microlens array 3 will have a whitish appearance, due to the large quantity of light thereof. The microlenses 4 are furnished to the apertures 40 where the light-blocking film 43 is absent, and light impinging on these microlenses 4 is shaped to hexagonal shape by the hexagonal field stops 42, and illuminates the substrate 1. The light reflected from the substrate alignment mark 32 of the substrate 1 then returns to the camera 51 through the microlenses 4, whereupon the substrate alignment mark 32 is detected by the sensor of the camera 51. At this time, the light transmitted through the hexagonal field stops 42 and reflected by the substrate 1 has a whitish appearance due to the large quantity of light thereof. On the other hand, light that has been transmitted through the apertures 40 of the light-blocking film 43 but not transmitted by the hexagonal field stops 42 is reflected by the hexagonal field stops 42, returning to the camera 51 where it is detected by the sensor of the camera 51. As shown in FIG. 29, to the sensor of the camera 51, the reflected light from the hexagonal field stops 42 will have a grayish appearance.

FIG. 33 (a) is a view representing this mask alignment mark 31 superimposed over the microlens array 2. There are cases in which, depending on the relative positional relationship of the mask 2 and the microlens array 3, of the sides 3a, 3b, 3c, 3d of the mask alignment mark 31, the side 3d is positioned between two microlens rows. In such a case, the quantity of light of the reflected light arising when alignment light from the camera 51 is reflected by the mask alignment mark 31 is large, thereby giving it a whitish appearance to the sensor of the camera 51, which therefore results in assimilation with the reflected light reflected from the light-blocking film 43 of the microlens array 3, making the light indistinguishable. Therefore, as shown by the image in FIG. 33 (c) detected by the sensor of the camera 51, the side 3d of the mask alignment mark 31 becomes assimilated with the reflected light from the light-blocking film 43, and the position thereof cannot be detected.

Figure 34:
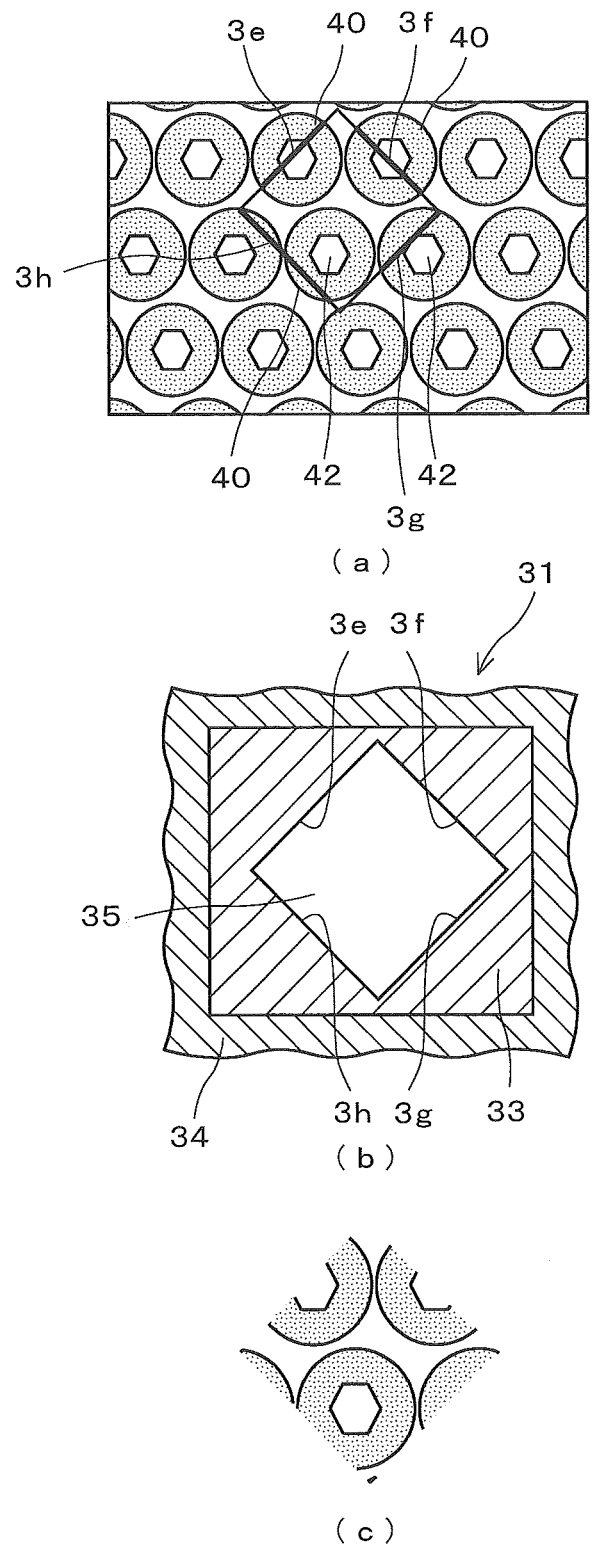
FIG. 34 is a view showing a mask alignment mark of an embodiment of the present invention, wherein (a) is a view showing the relationship of the mask alignment mark with respect to a microlens array, (b) showing the shape of a single mask alignment mark, and (c) showing an image detected by a sensor of a camera.

FIG. 34 (b), on the other hand, shows the configuration of the mask alignment mark 31 of an embodiment of the present invention. The mask alignment mark 31 of the embodiment of the present invention, like that in FIG. 33, has a square cutout portion 35 formed by a metal film 33 constituted by a light-blocking reflective film, such as a Cr film or the like, on a glass substrate 34. In this alignment mark 31, sides 3e, 3f, 3g, 3h are formed at the borders of the metal film 33 and the cutout portion 35, and the shape of the mask alignment mark 31 is defined by these sides 3e, 3f, 3g, 3h. None of the sides 3e, 3f, 3g, 3h extends in a direction registered with the direction in which the microlenses 4 are arrayed in the microlens array 3. Specifically, the sides 3e, 3f, 3g, 3h are all inclined with respect to a first direction in which the microlenses 4 are arrayed on straight lines. In the present embodiment, because the microlenses are arrayed in a direction perpendicular to the scanning direction S, this direction perpendicular to the scanning direction S is the first direction, and all of the sides 3e, 3f, 3g, 3h are inclined with respect to the scanning direction S. In the present embodiment, the sides 3e, 3f, 3g, 3h intersect the scanning direction at a 45° angle.

In the present embodiment, because the sides 3e, 3f, 3g, 3h of the mask alignment mark 31 do not register with the direction in which the microlenses are arrayed, there is no side that is positioned between microlens rows, as shown in FIG. 34 (a). Therefore, as shown in FIG. 34 (c), in the sensor of the camera 4, all of the sides 3e, 3f, 3g, 3h are detected as borders between light reflected the hexagonal field stops 42 (gray light) and light reflected by the metal film 33 (white light).

Next, the operation of the embodiment of the present invention constituted in the above fashion will be described. The microlens array 3 is arranged between the substrate alignment mark 32 of the substrate 1 and the mask alignment mark 31 of the mask 2, and the mask alignment mark 31 and the substrate alignment mark 32 are illuminated in a perpendicular downward direction with alignment light from the camera 51 (episcopic microscope) from above the mask 2. Thereupon, as shown in 34 (a), reflected light from the metal film 33 of the mask alignment mark 31 and reflected light from the light-blocking film 43 of the microlens array 3 are both detected as white light by the sensor of the camera 51, while reflected light reflected from the hexagonal field stops 42 is detected as gray light, and alignment light transmitted by the hexagonal field stops 42 is detected as reflected light reflected from the substrate alignment mark 32 of the substrate 1. The alignment light transmitted by the hexagonal field stops 42 is imaged onto the substrate 1 by the microlens array 2, and after being reflected by the substrate alignment mark 32, is formed on the mask 2 by the microlens array 3.

As shown in FIG. 34 (c), for the mask alignment mark 31 on the other hand, the sides 33e, 3f, 3g, 3h of the mask alignment mark 31 are superimposed over the microlens array 3 where they are detected by the sensor of the camera 51. At this time, because the sides 3e, 3f, 3g, 3h of the mask alignment mark 31 are not registered with the direction in which the microlenses are arrayed, they do not become positioned between microlens rows, and as shown in FIG. 34 (c), all of the sides 3e, 3f, 3g, 3h are detected on reflected light (gray light) reflected by the hexagonal field stops 42.

Therefore, on the bottom surface of the mask 2, the sensor of the camera 51 is able to detect the contours of the mask alignment mark 31 (all of the sides 3e, 3f, 3g, 3h) on the reflected light reflected by the hexagonal field stops 42. Moreover, the substrate alignment mark 32 can be detected as reflected light from the substrate alignment mark 32 imaged on the bottom surface of the mask 2. Because each mark can be detected on the bottom surface of the mask 2, both marks can be detected simultaneously by the camera 51, within its range of focal depth.

For this reason, even in the case of a large gap between the substrate 1 and the mask 2 in an exposure device that uses a microlens array, the mask alignment mark 31 and the substrate alignment mark 32 can be detected simultaneously on the same surface (the mask bottom surface), and alignment of the substrate 1 and the mask 2 can be brought about with high accuracy.

Moreover, because the camera 51 detects the substrate alignment mark 32 and the mask alignment mark 31 on the same surface, even in a case in which the optical axis of the camera 51 is inclined with respect to the mask 3, in cases in which the substrate 1 and the mask 2 are in alignment, the mask alignment mark 31 and the substrate alignment mark 32 will always be detected at matching positions, thereby avoiding mistaken detection of alignment of the mask 2 and the substrate 1.

Further, as may be understood by comparing FIG. 33 and FIG. 34, in the case of the present invention (FIG. 34), none of the sides showing the contours of the mask alignment mark 31 extend in the direction in which the microlenses are arrayed, and therefore all of the sides can be detected from within the reflected light, and the mask alignment mark 31 can be detected with high accuracy. Therefore, the alignment accuracy of the mask 2 and the substrate 1 can be further improved.

As shall be apparent, the present invention is not limited to the aforedescribed embodiments. For example, whereas in the aforedescribed embodiments, the mask and the substrate are illuminated with alignment light from above the mask, and the alignment light is detected above the mask, illumination and detection of the alignment light may be performed from below the substrate 1 instead. It would be acceptable to instead arrange the camera 51 below the substrate 1 and orient upward the direction of illumination of alignment light therefrom, to detect the substrate alignment mark 32 on the top surface of the substrate 1, as well as to image the mask alignment mark 31 onto the top surface of the substrate 1 by the microlens array 3, for detection on the top surface of the substrate 1. In this case, the substrate alignment mark 32 may be formed as shown in FIG. 34. Specifically, it is necessary to form the sides of the contours of the substrate alignment mark 32 such that these do not register with the direction in which the microlenses are arrayed.

In the aforedescribed embodiments, the polygon field stops are the hexagonal field stops 42, and the microlens rows are constituted as microlens row groups of three rows each; however, the present invention is not limited to this; various other modes are possible. For example, the polygon field stops that determine the field of view of the microlenses on the substrate are not limited to hexagonal field stops; ones having apertures, for example, of rhomboid shape, parallelogram shape, trapezoidal shape, or the like are acceptable as well. For example, even a field stop of trapezoidal shape (quadrangular shape) can be broken down into a central portion of rectangular shape, and triangular portions at both sides thereof. Moreover, the number of microlens rows constituting a single microlens row group is not limited to three rows: for example, in the case of apertures of trapezoidal shape or parallelogram (horizontally elongated) shape as mentioned above, one group may be constituted by every three rows, whereas in the case of apertures of rhomboid shape or parallelogram (vertically elongated) shape, one group may be constituted by every two rows. Furthermore, in the array of microlenses shown in FIG. 32, each single group is constituted by three rows in relation to the scanning direction S, with the fourth microlens row being arranged at identical position, in relation to a direction perpendicular to the scanning direction S, as the first microlens row; however, because lens size and field width (hexagonal field stop width) differ depending on the designed lens performance, cases may arise in which the ratio of the lens pitch spacing and the field width is modified. In such cases, adjustment of the lens pitch to an integer multiple of the field width may result in a configuration that is not a three-row one.

Moreover, in the aforedescribed embodiments, an image of the substrate alignment mark 32 is projected onto the mask while moving the microlens array 3 for exposure between the mask alignment mark 31 and the substrate alignment mark 32, but it would be acceptable to instead furnish a dedicated microlens array for alignment use, or to arrange a large-scale microlens array possessing both exposure and alignment functions.

Figure 35:
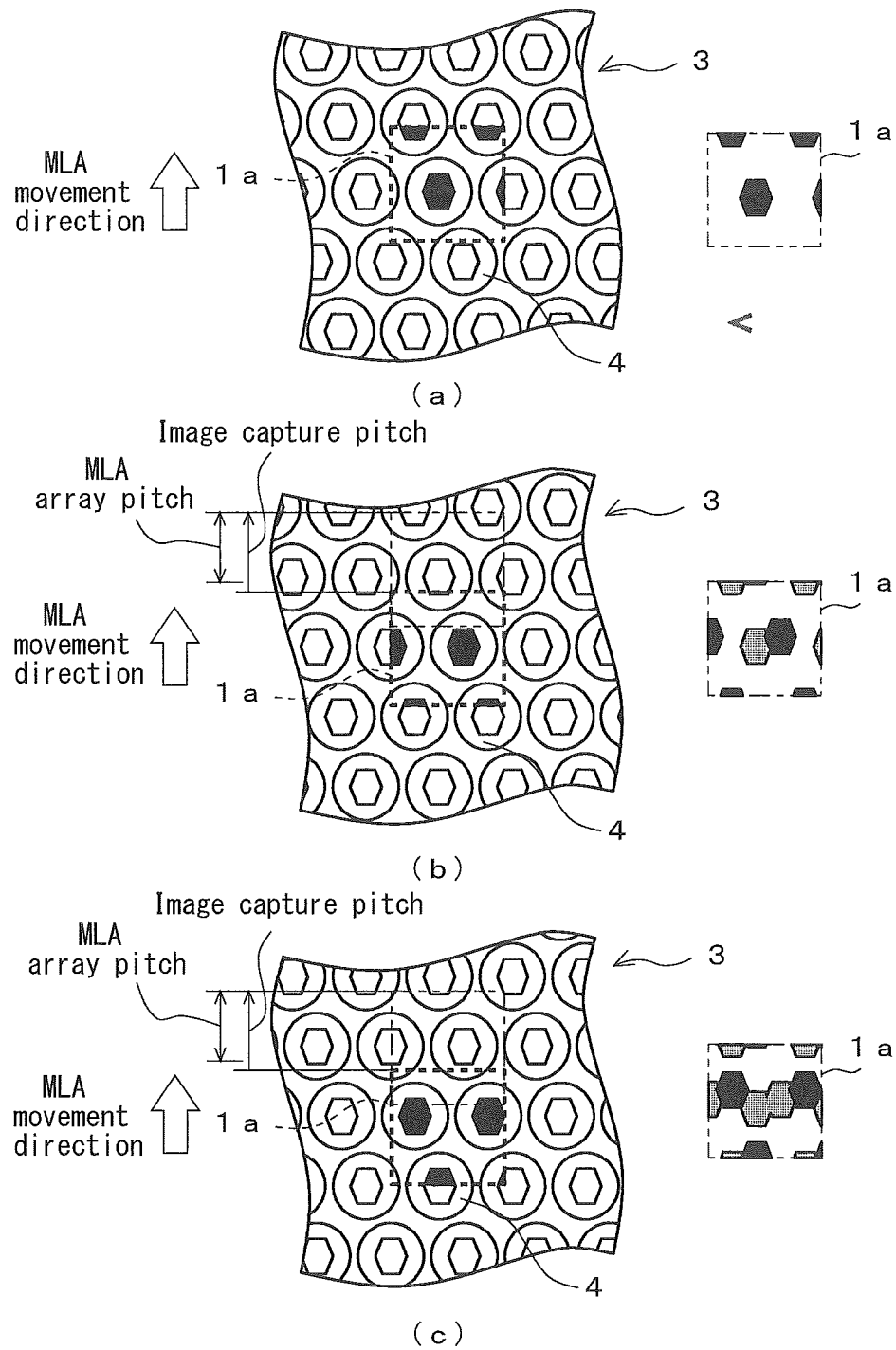
FIG. 35 (a) to (c) are views showing, together with a microlens array, an image of a substrate alignment mark detected via polygon field stops in an alignment device according to an eleventh embodiment of the present invention, and views showing superimposed images of a substrate alignment mark captured by the camera.
Figure 36:
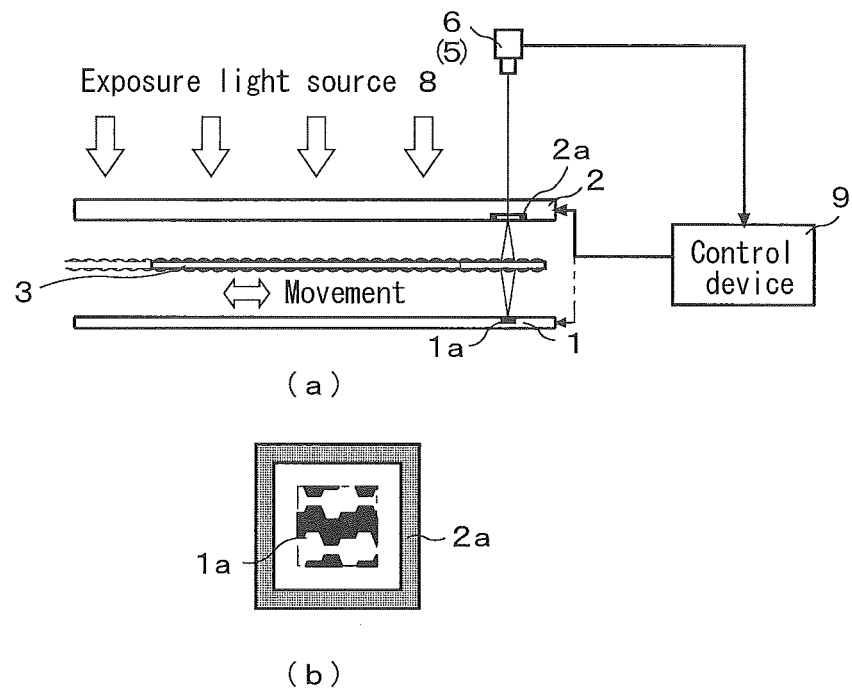
FIG. 36 (a) is a view showing the alignment device for an exposure device according to the eleventh embodiment of the present invention, and (b) is a view showing the relative positional relationships of detected alignment marks.

Next, an eleventh embodiment of the present invention will be described. FIG. 35 (a) to FIG. 35 (c) are views showing, together with a microlens array, an image of a substrate alignment mark detected via polygon field stops in an alignment device according to the eleventh embodiment of the present invention, and views showing superimposed images of a substrate alignment mark captured by the camera; FIG. 36 (a) is a view showing the alignment device for an exposure device according to the eleventh embodiment of the present invention; and FIG. 36 (b) is a view showing the relative positional relationships of detected alignment marks. As shown in FIG. 36, in the exposure device furnished with the alignment device of the present embodiment, like a scan exposure device that uses a conventional microlens array, the microlens array 3 is furnished between the substrate 1 and the mask 2, exposure light emitted by the exposure light source 8 is transmitted through a pattern formed in the mask 2, and an erect unmagnified image of the pattern is imaged onto the substrate by the microlens array 3. Then, through relative movement of the microlens array 3, the exposure light source, and an optical system in unison, in a direction perpendicular to the plane of the page in FIG. 36 (hereinafter termed the "scan exposure direction") with respect to the mask 2 and the substrate 1, the exposure light is scanned over the substrate 1, transferring the pattern of the mask 2 onto the substrate 1. In this exposure device, the alignment device is used for relative position alignment of the substrate 1 and the mask 2.

The alignment device according to the present embodiment is furnished with an alignment light source 5 above the mask 2, for illuminating a substrate alignment mark 1a furnished to the substrate 1 and a mask alignment mark 2a furnished to the mask 2, with light for alignment use from above the mask 2. As shown in FIG. 36 (a), in the present embodiment, the alignment light source 5, together with a camera 6 for detecting the substrate alignment mark 1a and the mask alignment mark 2a, is housed within a coaxial episcopic microscope of unifocal type. The alignment light source 5 is constituted to emit alignment light coaxially with respect to the optical axis of the light detected by the camera 6. Laser light, or lamp light transmitted through an interference filter, can be used as the alignment light source 5. For the lamp light source, it is preferable to use, for example, a halogen lamp, due to the reduced cost. The alignment light source 5 may be furnished as a separate element from the camera 6. The light emitted by the alignment light source 5 illuminates the mask 2 and the substrate 1 via an optical system including, for example, a reflecting mirror, a beam splitter, and the like.

Like the microlens array shown in FIG. 26, the microlens array 3 is constituted, for example, by four arrays of eight lenses each, and has a structure in which four unit microlens arrays 3-1, 3-2, 3-3, 3-4 are stacked. Each of the unit microlens arrays 3-1 to 3-4 is constituted of a plurality of microlenses 4 arranged two-dimensionally. For example, in the unit microlens arrays 3-1 to 3-4, a plurality of microlens rows in which a plurality of microlenses are arrayed are arranged in a direction perpendicular to the direction of array thereof. Microlenses in adjacent microlens rows are mutually biased in the row direction, with three microlens rows constituting a single microlens row group, for example. The microlens array 3 is arranged in the exposure device and the alignment device, in such a way that the direction in which the microlenses are arrayed in the microlens rows is a direction perpendicular to the relative scan exposure direction with respect to the substrate 1 and the mask 2. In the present embodiment, during relative position alignment of the substrate 1 and the mask 2, the microlens array 3 is moved between the substrate alignment mark 1a and the mask alignment mark 2a, moving the single microlens array 3 both during exposure and during alignment, to use the microlens array 3 for exposure use concomitantly for alignment use as well.

The exposure device is furnished, for example, with a drive device (not illustrated) for moving the microlens array 3, and is controlled by a control device. During exposure, the control device performs control to move the microlens array 3 and the light source 8 in unison in the scan exposure direction. During alignment, the control device performs control to move the microlens array 3 in the scan exposure direction, while illuminating it with alignment light. In so doing, the light reflected from the substrate 1 is detected from the camera 6 side, in correspondence with the hexagonal apertures of the hexagonal field stops 42 of the microlens array 3. In the present embodiment, the directions of movement of the microlens array 3 during exposure and during alignment are identical directions.

The mask 2 is furnished with the mask alignment mark 2a of frame shape for example, while the substrate 1 is furnished with the substrate alignment mark 1a, which is, for example, rectangular and smaller in size than the mask alignment mark 2a. During alignment, when the substrate 1 and the mask 2 are in a predetermined positional relationship, the substrate alignment mark 1a detected by the camera 6 is positioned at the center of the mask alignment mark 2a as shown in FIG. 36 (b).

In the present embodiment, during alignment of the substrate 1 and the mask 2, an erect unmagnified image reflected from the substrate alignment mark 1a is formed on the mask 2 by the microlens array 3, whereupon the camera 6 furnished above the mask 2 simultaneously detects the reflected light reflected from the mask alignment mark 2a, and the erect unmagnified image of the substrate alignment mark 1a which has been formed on the mask 2.

As shown in FIG. 36 (a), the camera 6 is connected to a second control device 9 that controls the position of the mask 2, and depending on the result detected by the camera 6, in cases in which alignment of the substrate 1 and the mask 2 is necessary, the second control device 9 moves the mask 2. For example, in cases in which the position of the substrate alignment mark 1a detected by the camera 6 diverges from the center of the frame-shaped mask alignment mark 2a, the second control device 9 moves the mask 2 so as to position the substrate alignment mark 1a at the center of the mask alignment mark 2a. As shown by the double-dash broken line in FIG. 36 (a), the second control device 9 is connected, for example, to a stage or the like supporting the substrate 1, and performs alignment of the substrate 1 and the mask 2 by moving the substrate 1. Alternatively, the second control device 9 may perform alignment of the substrate 1 and the mask 2 by moving both the substrate 1 and the mask 2.

Figure 37:
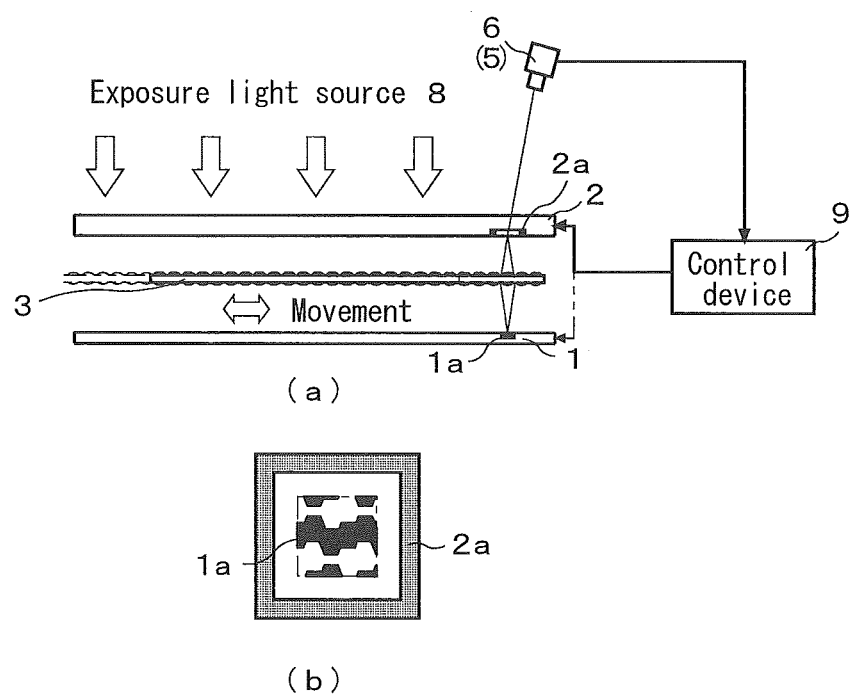
FIG. 37 (a) and (b) are views showing a case in which the optical path of the alignment light is inclined in the exposure device shown in FIG. 36.

During alignment, due to the presence of the microlens array 3 between the mask alignment mark 2a and the substrate alignment mark 1a, reflected light reflected from the substrate alignment mark 1a is transmitted through the microlens array 3, and an erect unmagnified image of the substrate alignment mark 1*a* is formed on the mask 2. Therefore, despite the fact that a gap G of 5 to 15 mm is actually present between the substrate 1 and the mask 2, the focus difference on the camera 6 side caused by this gap G is zero. Therefore, the alignment marks 1*a*, 2*a* of the substrate 1 and the mask 2, which are at different distances with respect to the sensor of the camera 6, can be simultaneously imaged on the camera 6, and alignment of the substrate 1 and the mask 2 can be performed with high accuracy by adjusting the positions of the substrate 1 and the mask 2, using the alignment marks as guides. Moreover, by bringing the focus difference on the camera side to zero, the relative positions of the alignment marks are unchanged (FIG. 37 (*b*)) even in a case in which the optical axis of the alignment light is inclined as shown in FIG. 37 (*a*), and very high alignment accuracy can be obtained.

Hexagonal field stops 42, for example, like those shown in FIG. 27, are arranged at a reverse imaging position between unit microlens arrays of the microlens array 3. Therefore, the image of the substrate alignment mark 1*a* formed on the mask 2 is an image that corresponds to the aperture of the hexagonal field stops 42. Consequently, a case may arise in which an end edge of the substrate alignment mark 1*a* is momentarily not at any position corresponding to an aperture of the hexagonal field stops 42, leading to cases in which the end edges of the substrate alignment mark 1*a* cannot be detected from the camera 6 side, the center position of the substrate alignment mark 1*a* cannot be identified, and the detected image cannot be used for alignment of the substrate 1 and the mask 2.

In the present embodiment, however, the microlens array 3 is constituted by microlens rows in which a plurality of microlenses are arrayed in a direction perpendicular to the scan exposure direction, a plurality of these microlens rows being arranged in the scan exposure direction, with any two microlens rows situated adjacently in the scan exposure direction being arranged having mutual bias in a direction perpendicular of the scan exposure direction; and during alignment, are controlled by the control device so as to move in the scan exposure direction. The control device uses the camera to capture images multiple times of both alignment marks, doing so at spacing that is not an integer multiple of the array pitch of the microlens rows of the microlens array 3, and superimposes the multiple captured images, using the image of the superimposed substrate alignment mark 1*a* and the mask alignment mark 2*a* for alignment. Therefore, even in cases in which polygon field stops are furnished, end edges of the substrate alignment mark 1*a* can be reliably identified. Specifically, as shown in FIG. 35 (*a*) to FIG. 35 (*c*), there are cases in which end edges in an image of the substrate alignment mark 1*a* detected by the camera 6 momentarily cannot be detected. For example, as shown in FIG. 35 (*a*), the end edge at the left side of the alignment mark 1*a* cannot be detected by the camera 6. However, the control device, while moving the microlens array 3 in the scan exposure direction, captures images multiple times of the substrate alignment mark 1*a* with the camera 6, doing so at spacing that is not an integer multiple of the array pitch of the microlens rows of the microlens array 3, and superimposes a plurality of captured images as shown in views at the right side in FIG. 35 (*a*) to FIG. 35 (*c*), whereby the end edge of the substrate alignment mark 1*a* can be reliably detected, and alignment of the substrate 1 and the mask 2 can be performed. At this time, if image capture of the alignment marks 1*a*, 2*a* by the camera 6 were performed at spacing equal to an integer multiple of the array pitch of the microlens row, images of the substrate alignment mark 1*a*, in the course of being captured a plurality of times, would be detected as lining up in a direction perpendicular to the scan exposure direction. Therefore, in cases in which an end edge of the substrate alignment mark 1*a* in the scanning direction is not detectable in a first captured image, the end edge of the substrate alignment mark 1*a* in the scan exposure direction will not be detectable in the second and subsequent captured images either. Thus, in preferred practice, iterations of image capture by the camera 6 will be equal to or greater than the number of microlens rows constituting the microlens row groups.

Next, the operation of the alignment device according to the present embodiment constituted in the above manner will be described. During exposure, the microlens array 3 is positioned below a pattern area furnished to the mask 2. Firstly, the microlens array 3 is moved towards the rightward direction in FIG. 36, moving between the substrate alignment mark 1*a* and the mask alignment mark 2*a*. Next, alignment light is emitted from the halogen lamp or other alignment light source 5 housed in the camera 6, while the microlens array 3 is controlled by the control device so as to move in the scan exposure direction. This alignment light first illuminates the mask 2, via an optical system including, for example, a reflecting mirror, a beam splitter, and the like. The alignment light illuminating the mask 2 is reflected by the mask alignment mark 2*a*. Meanwhile, the alignment light transmitted through the mask 2 is transmitted through the microlens array 3 which is arranged below the mask 2, and illuminates the substrate 1.

Reflected light reflected from the substrate alignment mark 1*a* is transmitted through the microlens array 3 and again impinges on the mask 2, imaging an erect unmagnified image of the substrate alignment mark 1*a* onto the mask 2. The reflected light beams then impinge on the sensor of the camera 6, and the mask alignment mark 2*a* and the erect unmagnified image of the substrate alignment mark 1*a* formed on the mask 2 are detected thereby. In the present embodiment, because an erect unmagnified image of the substrate alignment mark 1*a* formed on the mask 2 is detected by the camera 6 in this manner, despite the fact that a gap G of 5 to 15 mm is actually present between the substrate 1 and the mask 2, the focus difference on the camera 6 side caused by this gap G is zero.

Using the camera 6, the control device captures images multiple times of the substrate alignment mark 1*a* formed on the mask 2, and of the mask alignment mark 2*a* (FIG. 35). Specifically, because the microlens array 3 has been furnished with the hexagonal field stops 42 at a reverse imaging position between unit microlens arrays, the image of substrate alignment mark 1*a* formed on the mask 2 is an image that corresponds to the aperture of the hexagonal field stops 42, and a case may arise in which an end edge of the substrate alignment mark 1*a* is momentarily undetectable from the camera 6 side. For example, as shown in FIG. 35 (*a*), a case may arise in which the end edge at the left side of the substrate alignment mark 1*a* cannot be detected, the center position of the substrate alignment mark 1*a* cannot be identified, and the captured image of the alignment mark 1*a* cannot be used for alignment of the substrate 1 and the mask 2. However, in the present embodiment, the control device, while moving the microlens array 3 in the scan exposure direction, captures images multiple times of the substrate alignment mark 1*a* with the camera 6, doing so at spacing that is not an integer multiple of the array pitch of the microlens rows of the microlens array 3. The control device then superimposes the plurality of captured images, and uses the superimposed images of the alignment marks 1*a*, 2*a* for alignment. In so doing, end edges of the substrate alignment mark 1*a* can be reliably detected. Therefore, the center position of the substrate alignment mark 1a can be identified, and used for highly accurate alignment.

Alignment of the substrate 1 and the mask 2 is performed using the substrate and mask alignment marks 1a, 2a detected by the camera 6. For example, in a case in which the position of the substrate alignment mark 1a detected by the camera 6 diverges from the center of the frame-shaped mask alignment mark 2a, the mask 2 is moved by the second control device 9 so as to position the substrate alignment mark 1a at the center of the mask alignment mark 2a, to perform alignment of the substrate 1 and the mask 2. In the present embodiment, because the focus difference on the camera 6 side caused by the gap G between the substrate 1 and the mask 2 is zero, alignment of the substrate 1 and the mask 2 can be performed highly accurately using the alignment marks 1a, 2a of the substrate 1 and the mask 2 as guides.

Even in a case in which the optical axis of the alignment light has been inclined as shown in FIG. 37 (a) in order to image an erect unmagnified image of the substrate alignment mark 1a onto the mask 2 as shown in FIG. 37 (b), the relative positions of the substrate and mask alignment marks 1a, 2a detected by the camera 6 are unchanged from the case in FIG. 36 (b) of perpendicular illumination of the substrate 1 and the mask 2 by the alignment light, and there is no reduction in alignment accuracy due to the optical axis of the alignment light being inclined.

In contrast to this, in a case in which the substrate alignment mark 1a cannot be formed on the mask 2 by the microlens array 3, the alignment marks positions may be detected mistakenly, as was described with reference to FIG. 5. In the alignment device according to the present embodiment, alignment accuracy is high, and moreover, simply by moving the exposure microlens array 3 between the substrate alignment mark 1a and the mask alignment mark 2a during alignment, the focus difference on the camera 6 side caused by the gap G between the substrate 1 and the mask 2 may be brought to zero, to obtain high alignment accuracy. Moreover, a single alignment light source suffices in doing so.

After alignment of the substrate 1 and the mask 2, the microlens array 3 is moved towards the leftward direction in FIG. 36, moving to below the pattern area furnished to the mask 2. Thereafter, exposure light is emitted, and scan exposure by the microlens array 3 is initiated. According to the present embodiment, due to high alignment accuracy obtained in the aforedescribed manner, a very high level of exposure accuracy can be maintained during scan exposure.

The shapes of the substrate and mask alignment marks 1a, 2a in the present embodiment are merely exemplary, and there is no limitation of the present invention as to the shapes of the alignment marks 1a, 2a, provided that the alignment marks 1a, 2a can be detected by the camera 6, and alignment of the substrate 1 and mask 2 performed.

Whereas the present embodiment has described a case in which the alignment light source 5 is housed inside a microscope together with the camera 6, and constituted to emit alignment light coaxially with respect to the optical axis of light detected by the camera 6, in the present invention, the optical axis of light emitted by the alignment light source 5 need not be coaxial to the optical axis of the reflected light detected by the camera, in order to image an erect unmagnified image of either the substrate 1 or the mask 2 onto the other, and detect it with the camera 6.

Figure 38:
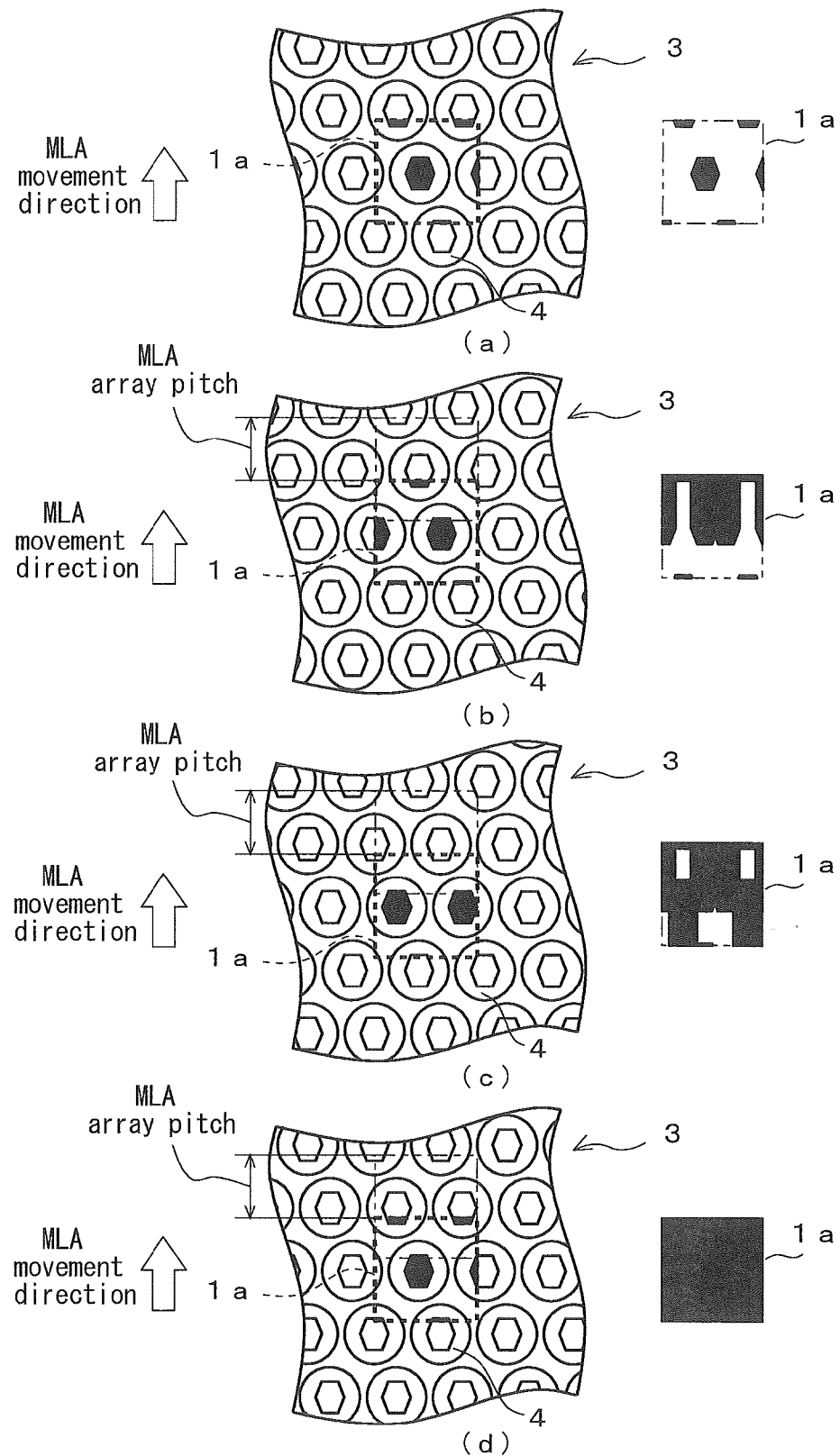
FIG. 38 (a) to (d) are views showing images of a substrate alignment mark detected through polygon field stops, and images of a substrate alignment mark captured continuously as moving images by a camera, in an alignment device for an exposure device according to a twelfth embodiment of the present invention.

Next, an alignment device for an exposure device according to a twelfth embodiment of the present invention will be described. FIG. 38 (a) to FIG. 38 (b) are views showing images of a substrate alignment mark detected through polygon field stops, and images of a substrate alignment mark captured continuously as moving images by a camera, in an alignment device for an exposure device according to a twelfth embodiment of the present invention. The present embodiment differs from the eleventh embodiment in that, during alignment, the camera 6 continuously captures erect unmagnified images of the substrate alignment mark 1a formed on the mask 2. By way of example, FIG. 38 shows a condition in which the microlens rows of the microlens array 3 lined up in the scan exposure direction are moved in increments equal to the array pitch in the scan exposure direction.

In the present embodiment, while moving the microlens array 3 during alignment, the control device uses the camera 6 to continuously capture, for a predetermined time interval, erect unmagnified images of the substrate alignment mark 1a formed on the mask 2, whereby as shown in FIG. 38 (b) to FIG. 38 (d), images of the substrate alignment mark 1a formed on the mask 2 in corresponding fashion to the hexagonal field stops 42 are scanned, whereby the images are detected so as to be extended into a band shape. In a case in which, for example, the microlens array 3 is one in which three microlens rows arranged in the scan exposure direction constitute one microlens group as shown in FIG. 32, by setting the image capture interval of the camera 9 to one equal to or greater than the time interval needed for the microlens array 3 to move the equivalent of three increments of the array pitch of the microlens rows of the microlens array 3, the entire substrate alignment mark 1a can be detected from the camera 6 side, as shown in FIG. 38 (d). Therefore, according to the present embodiment, the center position of the substrate alignment mark 1a can be detected with higher accuracy than in the eleventh embodiment.

Figure 39:
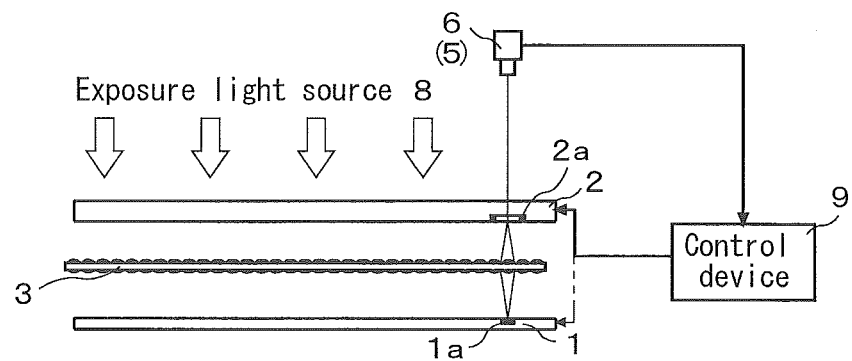
FIG. 39 (a) is a view showing an alignment device for an exposure device according to a thirteenth embodiment of the present invention, and (b) is a view showing the relative positional relationships of detected alignment marks.
Figure 39:
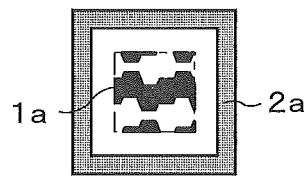

Next, an alignment device for an exposure device according to a thirteenth embodiment of the present invention will be described. FIG. 39 (a) is a view showing the alignment device for an exposure device according to the thirteenth embodiment of the present invention, and FIG. 39 (b) is a view showing the relative positional relationships of detected alignment marks. The eleventh embodiment and the twelfth embodiment described cases in which a single microlens array is shared for both alignment use and exposure use, by moving the single microlens array 3 for exposure use in selective fashion during exposure and during alignment. In the present invention embodiment, as shown in FIG. 39, the microlens array 3 is of sufficient size to encompass the exposure position illuminated by exposure light and the alignment position illuminated by alignment light. The constitution is otherwise comparable to that of the eleventh embodiment.

By constituting the single shared microlens array 3 as a microlens array of size sufficient to encompass the exposure position and the alignment position, as in the present embodiment, the need to move the microlens array 3 in selective fashion during exposure and during alignment is obviated. Moreover, the constitution by which the individual microlens arrays 3 are moved during exposure and during alignment, for example, the drive device, can be shared as well. The constitution is otherwise comparable to the eleventh embodiment.

By continuously capturing images of the substrate alignment mark 1a formed on the mask 2, as well as images of the mask 2, with the camera 6 while moving the microlens array during alignment in the same manner as in the twelfth embodiment, effects comparable to those of the twelfth embodiment are obtained.

Figure 40:
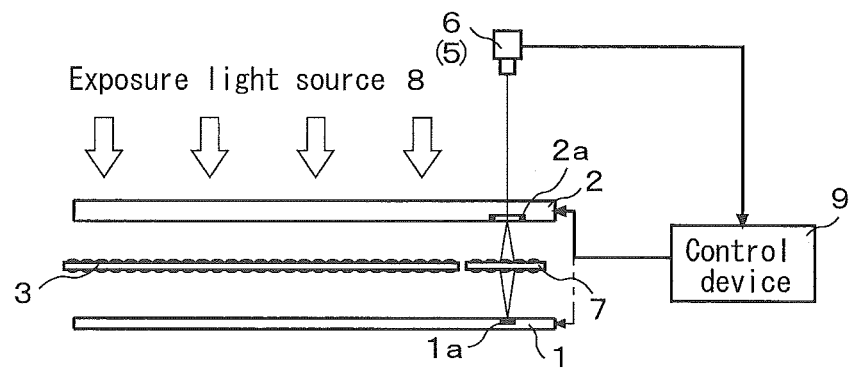
FIG. 40 (a) is a view showing an alignment device for an exposure device according to a fourteenth embodiment of the present invention, and (b) is a view showing the relative positional relationships of detected alignment marks.
Figure 40:
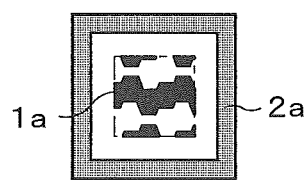

Next, an alignment device for an exposure device according to a fourteenth embodiment of the present invention will be described. FIG. 40 (a) is a view showing the alignment device for an exposure device according to the fourteenth embodiment of the present invention, FIG. 40 (*b*) is a view showing the relative positional relationships of detected alignment marks, and FIG. 41 (*a*) and (*b*) are views showing a case in which the optical path of the alignment light is inclined in the exposure device shown in FIG. 40. As shown in FIG. 40, in the present embodiment, two microlens arrays, a (first) microlens array 3 for exposure use, and a (second) microlens array 7 for alignment use, are furnished. The optical characteristics of the second microlens array 7 are identical to those of the (first) microlens array 3. The constitution is otherwise comparable to that of the eleventh embodiment.

Figure 41:
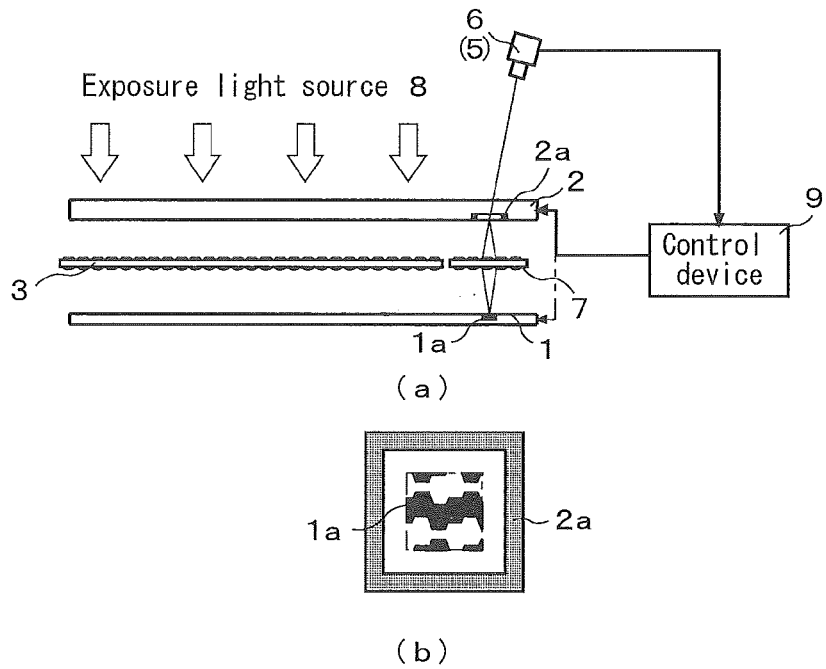
FIG. 41 (a) and (b) are views showing a case in which the optical path of the alignment light is inclined in the exposure device shown in FIG. 40.

In the present embodiment as well, an erect unmagnified image of the substrate alignment mark 1*a* can be formed on the mask 2, the focus difference on the camera 6 side caused by the 5 to 15 mm gap G between the substrate 1 and the mask 2 can be brought to zero, and alignment of the substrate 1 and the mask 2 can be performed with high accuracy, in a manner comparable to the eleventh embodiment. As shown in FIG. 41, even in cases in which the optical axis of the alignment light is inclined, the relative positions of the alignment marks are unchanged, and very high alignment accuracy can be obtained. Moreover, because the microlens array 3 for exposure use and the microlens array 7 for alignment use are constituted as separate elements in the microlens array, as in the thirteenth embodiment, there is no need to move the microlens array 3 selectively during exposure versus during alignment.

In the present embodiment as well, during alignment, the control device, while moving the microlens array 7, uses the camera 6 to capture multiple times images of the substrate alignment mark 1*a* formed on the mask 2, as well as of the mask alignment mark 2*a*, doing so at spacing that is not an integer multiple of the array pitch of the microlens rows of the microlens array 3, and then superimposes the captured images of the alignment marks and uses these for alignment, whereby effects comparable to those of the eleventh embodiment are obtained. Moreover, through continuous capture of images of the substrate alignment mark 1*a* formed on the mask 2, and images of the mask alignment mark 2*a*, by the camera 6 while moving the microlens array 7, effects comparable to those of the twelfth embodiment are obtained.

In the present embodiment, by furnishing both the microlens array 3 for exposure use and the microlens array 7 for alignment use, the scan exposure direction of the microlens array 3 during exposure and the direction of movement of the microlens array 7 during alignment can be different directions. Specifically, the effects of the present invention are obtained, as long as the direction of movement of the microlens array 7 by the second drive device is a direction perpendicular to the array direction of the microlenses constituting the microlens rows.

Figure 42:
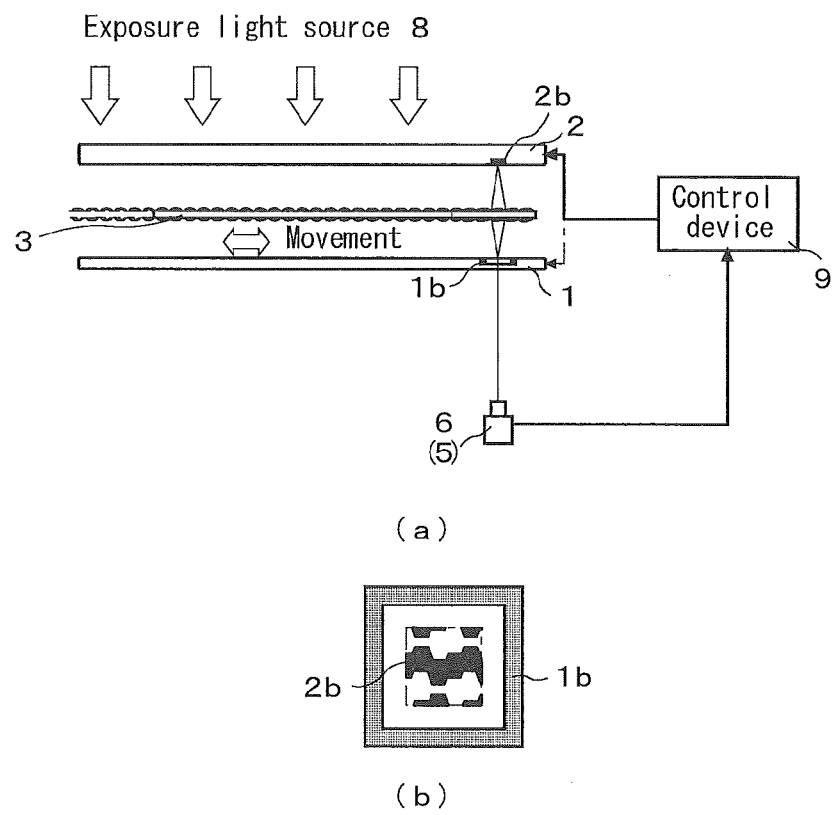
FIG. 42 (a) is a view showing an alignment device for an exposure device according to a fifteenth embodiment of the present invention, and (b) is a view showing the relative positional relationships of detected alignment marks.

Next, an alignment device for an exposure device according to a fifteenth embodiment of the present invention will be described. FIG. 42 (*a*) is a view showing the alignment device for an exposure device according to the fifteenth embodiment of the present invention, and FIG. 42 (*b*) is a view showing the relative positional relationships of detected alignment marks. As shown in FIG. 42, in the present embodiment, the alignment light source 5 and the camera 6 are arranged below the substrate 1 to provide illumination with alignment light from below the substrate. The substrate alignment mark 1*b* is frame-shaped, and the mask alignment mark 2*b* is rectangular. In the present embodiment, the substrate 1 targeted for exposure is composed of light-transmissive material, for example, a polyimide (PI) and tin-doped indium oxide (ITO) or the like, and the alignment light is transmitted through the substrate 1 to illuminate the mask 2. That is, in the present embodiment, in cases in which the substrate 1 is composed of light-transmissive material, the direction of illumination by alignment light and the shapes of the alignment marks 1*b*, 2*b* of the substrate 1 and the mask 2 differ from those in the eleventh embodiment; however, the constitution is otherwise comparable to the eleventh embodiment.

In the present embodiment as well, during relative position alignment of the substrate 1 and the mask 2, the microlens array 3 for exposure use is moved between the mask alignment mark 2*b* and the substrate alignment mark 1*b*, using the single microlens array 3 through movement in selective fashion during exposure and during alignment. During alignment, reflected light reflected by the mask alignment mark 2*b* is transmitted through the microlens array 3, and an erect unmagnified image of the mask alignment mark 2*b* is imaged onto the substrate 1 by the microlens array 3. At this time, due to the hexagonal field stops 42 furnished at a reverse imaging position between unit microlens arrays of the microlens array 3, the image of the mask alignment mark 2*b* imaged onto the substrate 1 is an image corresponding to the aperture of the hexagonal field stops 42. Therefore, a case may arise in which an end edge of the mask alignment mark 2*b* is momentarily undetectable from the camera 6 side, the center position of the mask alignment mark 2*b* cannot be identified, and the captured image of the alignment mark 2*b* cannot be used for alignment of the substrate 1 and the mask 2. However, the microlens array 3 is constituted by microlens rows in which a plurality of microlenses are arrayed in a direction perpendicular to the scan exposure direction, a plurality of these microlens rows being arranged in the scan exposure direction, with any two microlens rows situated adjacently in the scan exposure direction being arranged to have mutual bias in a direction perpendicular to the scan exposure direction; and during alignment is controlled by the control device so as to move in the scan exposure direction. Therefore, in the present embodiment as well, by having the control device use the camera 6 to capture multiple times images of the mask alignment mark 2*b* imaged onto the substrate 1, as well as of the substrate alignment mark 1*b*, doing so at spacing that is not an integer multiple of the array pitch of the microlens rows of the microlens array 3, then superimpose a plurality of captured images, and use these superimposed substrate alignment mark 1*b* and mask alignment mark 2*b* images to perform alignment, even in cases in which polygon field stops have been furnished, edge ends of the mask alignment mark 1*b* can be identified reliably, and can be used for alignment of the substrate 1 and the mask 2.

Additionally, whereas a gap G of 5 to 15 mm is present between the substrate 1 and the mask 2, the focus difference on the camera 6 side caused by this gap G is zero. Therefore, in the present embodiment, as in the aforedescribed eleventh to fourteenth embodiments, alignment of the substrate 1 and the mask 2 can be performed with high accuracy, using the substrate 1 and the mask 2 alignment marks 1*b*, 2*b* as a guide. For example, in a case in which the position of the mask alignment mark 2*b* detected by the camera 6 diverges from the center of the frame-shaped substrate alignment mark 1*b*, the second control device 9 moves the mask 2 so as to position the mask alignment mark 2*b* at the center of the substrate alignment mark 1*b*, aligning the substrate 1 and the mask 2. Moreover, even in a case in which the optical axis of the alignment light has been inclined in order to image an erect unmagnified image of the mask alignment mark 2*b* onto the substrate 1, the relative positions of the substrate alignment mark 1*b* and the mask alignment mark 2*b* detected by the camera 6 are unchanged from those in the case of perpendicular illumination of the substrate 1 and the mask 2 by alignment light, and very high alignment accuracy can be obtained.

In the present embodiment as well, through a constitution in which, during alignment, the control device, using the camera 6, continuously captures images of the mask alignment mark 2b images onto the substrate 1, as well as of images of the substrate alignment mark 1b, while moving the microlens array 3, effects comparable to the twelfth embodiment are obtained.

Additionally, by making the microlens array 3 of sufficient size to encompass the exposure position illuminated by exposure light and the alignment position illuminated by alignment light, the need to move the microlens array 3 in selective fashion during exposure and during alignment is obviated, in the same manner as in the thirteenth embodiment.

Figure 43:
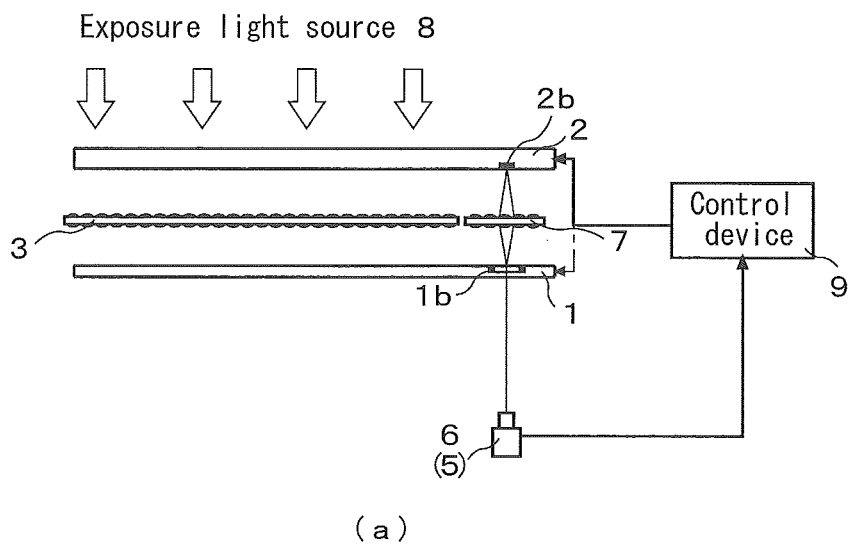
FIG. 43 (a) is a view showing an alignment device for an exposure device according to a sixteenth embodiment of the present invention, and (b) is a view showing the relative positional relationships of detected alignment marks.
Figure 43:
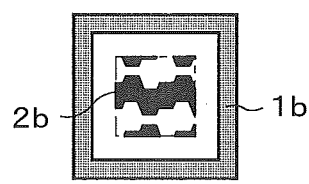
Figure 44:
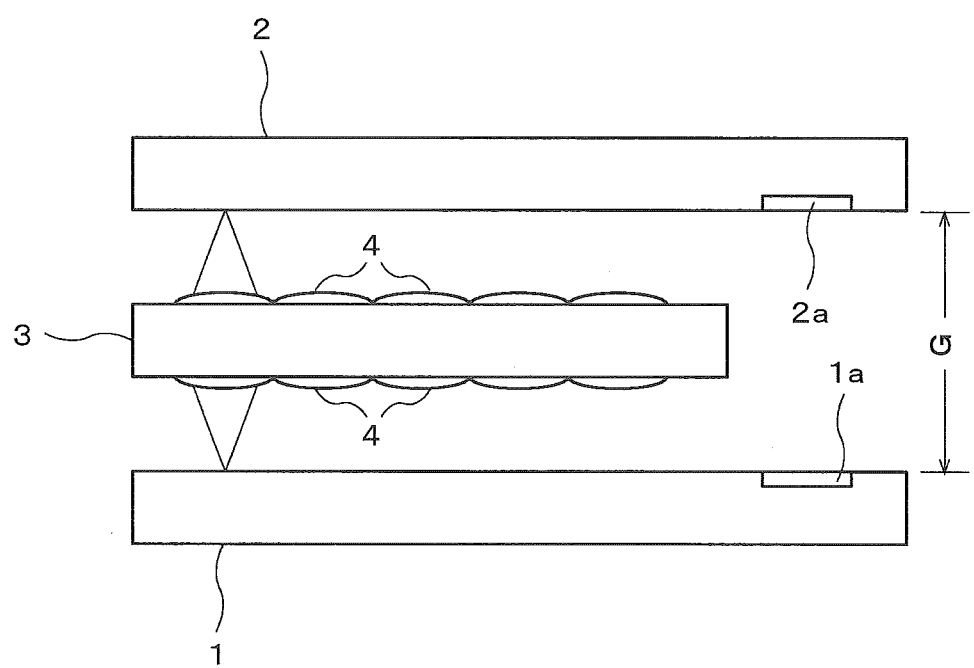
FIG. 44 is a view showing an exposure device in which a microlens array is used.
Figure 45:
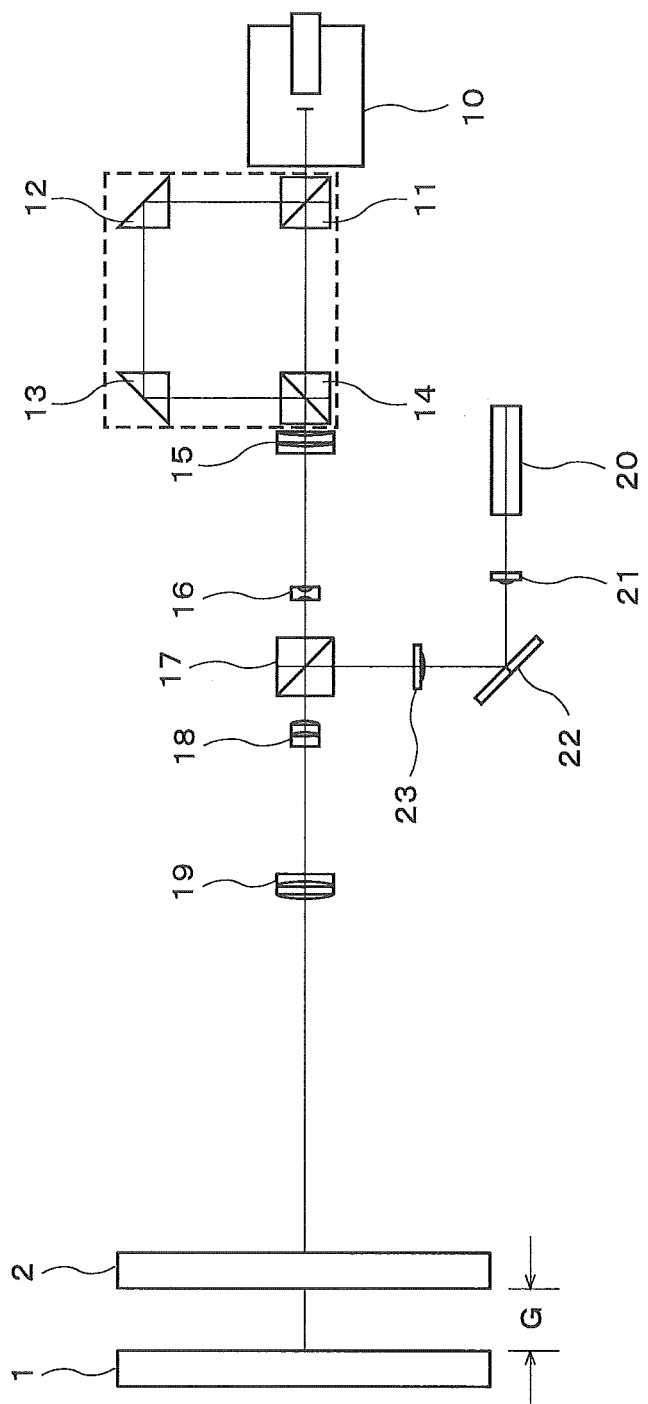
FIG. 45 is a view showing an alignment device furnished with an optical path difference to compensate for a gap between a substrate and a mask.

Next, an alignment device for an exposure device according to a sixteenth embodiment of the present invention will be described. FIG. 43 (a) is a view showing the alignment device for an exposure device according to the sixteenth embodiment of the present invention, and FIG. 43 (b) is a view showing the relative positional relationships of detected alignment marks. As shown in FIG. 43, in the present embodiment, as in the fourteenth embodiment, two microlens arrays are furnished, a microlens array 3 for exposure use, and a microlens array 7 for alignment use. The microlens array 7 for alignment use has optical characteristics identical to those of the microlens array 3 for exposure use. In so doing, effects comparable to those of the fourteenth embodiment are obtained in the present embodiment as well.

In the present embodiment, as in the fourteenth embodiment, the scan exposure direction of the microlens array 3 during exposure and the direction of movement of the microlens array 7 (first direction) during alignment can be different directions. Specifically, the effects of the present invention are obtained, as long as the direction of movement of the microlens array 7 by the drive device is a direction perpendicular to the array direction of the microlenses constituting the microlens rows.

INDUSTRIAL APPLICABILITY

According to the present invention, it is possible to prevent situations in which, in the camera, a substrate and a mask are mistakenly observed to be out of alignment despite being in alignment, or in which in the camera, the substrate and the mask are mistakenly observed to be in alignment despite being out of alignment. Consequently, alignment of the substrate and the mask can be performed with high accuracy, using the substrate alignment mark and the mask alignment mark detected by the camera.

KEY

1: substrate
2: mask
3: (first) microlens array
4: microlens
5: alignment light source
7: second microlens array
1a, 1b: substrate alignment mark
2a, 2b: mask alignment mark
6, 20: camera
21: filter
23, 23, 25, 30: lens
24, 28: beam splitter
29: reflecting mirror
9: control device
40: aperture
41: aperture stop
42: hexagonal field stop
43: light-blocking film

What is claimed is:

1. An alignment mark for use in relative position alignment of a mask and a substrate, using a microlens array having a plurality of unit microlens arrays stacked in alternating fashion and constituted by a plurality of microlenses arranged two-dimensionally; polygon field stops arranged at a reverse imaging position between the unit microlens arrays and having polygonal apertures; and aperture stops arranged in at least some of a maximum outspread portion of exposure light between said unit microlens arrays and having apertures of circular shape for determining the numerical aperture of each of the microlenses, the microlens array being arranged between said substrate to be exposed, and said mask being furnished with a pattern for exposure onto the substrate,
said alignment mark, which is formed in either said substrate or said mask, comprising
a plurality of linear mark segments that extend in directions respectively inclined with respect to all sides of the apertures of said polygon field stops,
said linear mark segments consisting of a plurality of first group mark segments extending radially from an alignment center; and a plurality of second group mark segments extending over sides of a polygon shape centered on said alignment center, the positions of said polygon field stops and said mark segments being selected such that some of said mark segments are present inside some of the polygon field stops.

2. The alignment mark according to claim 1, wherein said second group mark segments are arranged contiguously on sides of a plurality of polygons of different size having said alignment center as a common center.

3. The alignment mark according to claim 2, wherein second group mark segments positioned on different polygons differ in thickness.

4. The alignment mark according to claim 1, wherein said second group mark segments are arranged discontinuously on sides of a plurality of polygons of different size having said alignment center as a common center, and include corner portions of said polygons.

5. The alignment mark according to claim 4, wherein second group mark segments positioned on different polygons differ in thickness.

6. An alignment mark formed on a substrate or mask for use in an exposure device for position adjustment of said substrate or said mask, and comprising a pattern of line-symmetric polygonal shapes, said alignment mark comprising:
polygonal portions arranged so as to not extend parallel to any marginal edge constituting an aperture of any individual polygon field stop of a plurality of lenses arranged in matrix form between said substrate and said mask; and
radial line portions comprising at least six radial lines crossing through said polygonal portions from the center of said polygonal portions,
said polygonal portions and said radial line portions overall being larger in size than any of said lenses of the exposure device, but smaller than the overall size of four adjacent lenses of the exposure device.

7. An alignment device for an exposure device for transferring an exposure pattern formed in a mask onto a substrate, said alignment device comprising:

an alignment light source for emitting alignment light concomitantly with or independently of emission of exposure light;

a microlens array arranged between said substrate and said mask so that reflected alignment light reflected from a substrate alignment mark furnished to said substrate is formed on said mask as an erect unmagnified image;

a camera for detecting, from said mask side, reflected light reflected from a mask alignment mark, and an erect unmagnified image of said substrate alignment mark imaged onto said mask, while said substrate alignment mark and said mask alignment mark furnished to said mask are simultaneously illuminated with alignment light from said mask side; and a control device for adjusting the position of said mask and/or said substrate so as to bring about registration of said substrate alignment mark and said mask alignment mark detected by the camera;

the microlens array having:

a plurality of unit microlens arrays stacked in alternating fashion and constituted by a plurality of microlenses arranged two-dimensionally;

polygon field stops arranged at a reverse imaging position between the unit microlens arrays and having polygonal apertures; and aperture stops arranged in at least some of a maximum outspread portion of the exposure light between said unit microlens arrays, and having apertures of circular shape for determining the numerical aperture of each of the microlenses; and said substrate alignment mark having a plurality of linear mark segments extending in directions respectively inclined with respect to all sides of the apertures of said polygon field stops, said mark segments comprising a plurality of first group mark segments extending radially from an alignment center, and a plurality of second group mark segments extending on sides of a polygon shape centered on said alignment center, the positions of said polygon field stops and said mark segments being selected such that a plurality of said mark segments are present inside some of said polygon field stops.

8. The exposure device according to claim 7, wherein said second group mark segments are arranged contiguously on sides of a plurality of polygons of different size having said alignment center as the common center.

9. The exposure device according to claim 8, wherein said second group mark segments positioned on different polygons differ in thickness.

10. The exposure device according to claim 7, wherein said second group mark segments are arranged in discontinuous fashion on sides of a plurality of polygons of different size having said alignment center as the common center, in such a way as to include corner portions of said polygons.

11. The exposure device according to claim 10, wherein said second group mark segments positioned on different polygons differ in thickness.

12. An alignment device for an exposure device for transferring an exposure pattern formed in a mask onto a substrate, said alignment device comprising:

an alignment light source for emitting alignment light concomitantly with or independently of emission of exposure light;

a microlens array arranged between said substrate and said mask, so that reflected alignment light reflected from a mask alignment mark furnished to said mask is formed on said substrate as an erect unmagnified image;

a camera for detecting, from said substrate side, reflected light reflected from a substrate alignment mark, and an erect unmagnified image of said mask alignment mark formed on said substrate, when said mask alignment mark and said substrate alignment mark furnished to said substrate are simultaneously illuminated with alignment light from said substrate side; and a control device for adjusting the position of said mask and/or said substrate so as to bring about registration of said substrate alignment mark and said mask alignment mark detected by the camera;

the microlens array including:

a plurality of unit microlens arrays stacked in alternating fashion and comprising a plurality of microlenses arranged two-dimensionally;

polygon field stops arranged at a reverse imaging position between the unit microlens arrays and having polygonal apertures; and aperture stops arranged in at least some of a maximum outspread portion of the exposure light between said unit microlens arrays, and having apertures of circular shape for determining the numerical aperture of each of the microlenses; and said mask alignment mark having a plurality of linear mark segments extending in directions respectively inclined with respect to all sides of the apertures of said polygon field stops, said mark segments comprising a plurality of first group mark segments extending radially from an alignment center, and a plurality of second group mark segments extending over sides of a polygon shape centered on said alignment center, the positions of said polygon field stops and said mark segments being selected such that a plurality of said mark segments are present inside some of the polygon field stops.

13. The exposure device according to claim 12, wherein said second group mark segments are arranged contiguously on sides of a plurality of polygons of different size having said alignment center as the common center.

14. The exposure device according to claim 13, wherein said second group mark segments positioned on different polygons differ in thickness.

15. The exposure device according to claim 12, wherein said second group mark segments are arranged in discontinuous fashion on sides of a plurality of polygons of different size having said alignment center as the common center, in such a way as to include corner portions of said polygons.

16. The exposure device according to claim 15, wherein said second group mark segments positioned on different polygons differ in thickness.

* * * * *